United States Patent
Reed et al.

(10) Patent No.: US 6,608,386 B2
(45) Date of Patent: Aug. 19, 2003

(54) SUB-NANOSCALE ELECTRONIC DEVICES AND PROCESSES

(75) Inventors: Mark A. Reed, Southport, CT (US); James M. Tour, Columbia, SC (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 09/988,887

(22) Filed: Nov. 19, 2001

(65) Prior Publication Data

US 2002/0175326 A1 Nov. 28, 2002

Related U.S. Application Data

(60) Division of application No. 08/595,130, filed on Feb. 1, 1996, now Pat. No. 6,320,200, which is a continuation-in-part of application No. 08/261,867, filed on Jun. 16, 1994, now abandoned, which is a continuation-in-part of application No. 07/891,605, filed on Jun. 1, 1992, now abandoned.

(51) Int. Cl.[7] .................. H01L 29/76; H01L 29/94; H01L 29/40; H01L 23/52; H01L 31/119
(52) U.S. Cl. .................. 257/773; 257/371; 257/775; 257/776
(58) Field of Search ................... 257/371, 773, 257/775, 776

(56) References Cited

U.S. PATENT DOCUMENTS

| | | | | |
|---|---|---|---|---|
| 3,602,635 | A | * | 8/1971 | Romankiw .................. 174/253 |
| 4,118,595 | A | * | 10/1978 | Pfahnl et al. .................. 174/256 |
| 4,581,621 | A | | 4/1986 | Reed |
| 4,704,559 | A | * | 11/1987 | Suginoya et al. ............ 315/169.1 |
| 4,751,194 | A | | 6/1988 | Cibert et al. |
| 4,769,683 | A | | 9/1988 | Goronkin et al. |
| 4,783,427 | A | | 11/1988 | Reed et al. |
| 4,799,091 | A | | 1/1989 | Reed |
| 4,803,173 | A | | 2/1989 | Sill et al. |
| 4,812,888 | A | * | 3/1989 | Blackburn .................. 257/254 |
| 4,835,578 | A | | 5/1989 | Ohtoshi et al. |
| 4,860,064 | A | | 8/1989 | Luryi |
| 4,894,526 | A | | 1/1990 | Bethea et al. |
| 4,902,912 | A | | 2/1990 | Capasso et al. |
| 4,903,101 | A | | 2/1990 | Maserjian |
| 4,992,388 | A | | 2/1991 | Pfiester |
| 4,999,682 | A | | 3/1991 | Xu et al. |
| 5,006,911 | A | | 4/1991 | Sivan |
| 5,013,683 | A | | 5/1991 | Petroff et al. |
| 5,026,894 | A | | 6/1991 | Tour et al. |
| 5,032,877 | A | | 7/1991 | Bate |
| 5,036,371 | A | | 7/1991 | Schwartz |
| 5,047,355 | A | | 9/1991 | Huber et al. |
| 5,059,695 | A | | 10/1991 | Tour et al. |
| 5,073,893 | A | | 12/1991 | Kondou |
| 5,093,699 | A | | 3/1992 | Weichold et al. |
| 5,105,232 | A | | 4/1992 | de Alamo et al. |
| 5,107,316 | A | | 4/1992 | Jelley et al. |

(List continued on next page.)

OTHER PUBLICATIONS

IBM Technical Disclosure Bulletin, vol. 31, No. 9, Feb. 1989.*

Hush, et al. "Electron and Energy Transfer Through Bridged Systems. 6. Molecular Switches: The Critical Field . . . ", *J. Am. Chem. Soc.* 1990, 112, 4192–4197.

Farazdel, et al., "Electric Field Induced Intramolecular Electron Transfer in Spiro π–Electron Systems and Their Suitability . . . ", *J. Am. Chem. Soc.* 1990 112, 4206–4214.

Stille, "Palladium catalyzed coupling of organotin reagents with organic electrophiles," *Pure & Appl. Chem.* vol. 57, No. 12, pp. 1771–1780 (1985.

(List continued on next page.)

*Primary Examiner*—Amir Zarabian
*Assistant Examiner*—Ida M. Soward
(74) *Attorney, Agent, or Firm*—Ropes & Gray

(57) ABSTRACT

A new class of electronic systems, wherein microelectronic semiconductor integrated circuit devices are integrated on a common substrate with molecular electronic devices.

1 Claim, 7 Drawing Sheets

U.S. PATENT DOCUMENTS

| | | |
|---|---|---|
| 5,114,877 A | 5/1992 | Paoli et al. |
| 5,126,804 A | 6/1992 | Nagai et al. |
| 5,130,762 A | 7/1992 | Kulick |
| 5,138,408 A | 8/1992 | Ando |
| 5,138,625 A | 8/1992 | Paoli et al. |
| 5,142,641 A | 8/1992 | Fujioka |
| 5,144,580 A | 9/1992 | Niu et al. |
| 5,153,687 A | 10/1992 | Ishikawa et al. |
| 5,160,992 A | 11/1992 | Gerard et al. |
| 5,170,226 A | 12/1992 | Fukuzawa et al. |
| 5,175,740 A | 12/1992 | Elman et al. |
| 5,191,784 A | 3/1993 | Jelley et al. |
| 5,200,969 A | 4/1993 | Paoli |
| 5,202,290 A | 4/1993 | Moskovits |
| 5,214,664 A | 5/1993 | Paoli |

OTHER PUBLICATIONS

Hush, et al. Electron and Energy Transfer Through Bridged Systems. 6. Molecular Switches: The Critical Stille, "The Palladium–Catalyzed Cross–Coupling Reactions of Organotin Reagents with Organic Electrophiles," *Angew Chem. Int. Ed. Engl.* 25 (1986) 508–524.

Sonogashira, et al., "A Convenient Synthesis of Acetylenes: Catalytic Substitutions of Acetylenic Hydrogen with Bromalkenes, Iodoarenes, and Bromophyridines," *Tetrahedron Letters* No. 50. pp. 4467–4470 (1975).

Stephens, "The Substitution of Aryl Iodides with Cuprous Acetylides. A Synthesis of Tolanes and Heterocyclics," *Sbs. of Aryl Iodides with Cuprous Acetylides*, 3313–3315 (Dec., 1963).

Suffert, et al, "Towards Molecular Electronics: A New Family of Aromatic Polymine Chelates Substituted with Alkyne Groups", *Tetrahedron Letters*, vol. 32, No. 6, pp. 757–760 (1991).

Callahan, et al., "The Tertiary Butyl Group as a Blocking Agent for Hydroxl, Sulfhydryl and Amido Functions in Peptide Synthesis," *tert–Butyl Group as Blocking Agent in Peptide Synthesis*, 201–207 (Jan. 10, 1963).

Nishimura, et al., "New Method for Removing the S–p–Methoxybenzyl and S–t–Butyl Groups of Cysteine Residues with Mercuric Trifluoroacetate," *Chem. Pharm. Bull.*, 26(5) 1576–1585 (1978).

Miller, "Molecular Electronics?**" *Adv. Mater.* 2 (1990) No. 8 378–379, 492–497, 601–603.

Tour, et al., "Synthesis and UV–Visible Properties of Soluble α–Thiophene Oligomers. Monomer to Octamer," *American Chemical Society*, 1901–1907 (Mar. 30, 1992).

Tour, et al., "Extended Orthogonally Fused Conducting Oligomers for Molecular Electronic Devices," *American Chemical Society*, 7064–7066 (Aug. 28, 1991).

Tour, et al., "Approaches to Orthogonally Fused Conducting Polymers for Molecular Electronics," *American Chemical Society*, 5662–5663 (Jul. 4, 1990).

Yoshimura, et al., "Quantum Wire and dot formation by chemical vapor deposition and molecular layer deposition of one–dimensional conjugated polymer," *American Institute of Physics* 268–270 (Jan. 20, 1992).

Zecevic, et al., "Spectroscopic and Electrochemical Studies of Transition Metal Tetrasulfonated Phthalocyanines", *J.Electroanal. Chem.* 196 (1985) 339–358.

Hush et al., "Electron and Energy Transfer through Bridged Systems. 6. Molecular Switches: The Critical Field in Electric Field Activated Bistable Molecules", J.Am.Chem.Soc., 1990, vol. 112, pp. 4192–4197.

Farazdel et al., "Electric Field Induced Intromolecular Electron Transfer in Spiro π–Elecgron Systems and Their Suitability as Molecular Electronic Devices. A Theoretical Study", J.Am.Chem.Soc., 1990, vol. 112, pp. 4206–4214.

Stille, "The Palladium–Catalyzed Cross–Coupling Reactions of Organotin Reagents with Organic Electrophiles", Angew. Chem. Int. Ed. Engl. 25, 1986, pp. 508–524.

Stille, "Palladium Catalyzed Coupling of Organotin Reagents with Organic Electrophiles", Pure & Appl. Chem. vol. 57, No. 12, pp. 1771–1780, 1985.

Sonogashira et al., "A Convenient Synthesis of Acetylenes: Catalytic Substitutions of Acetylenic Hydrogen with Bromoalkenes, Iodoarenes, and Bromophridines", Tetrahedron Letters, No. 50, pp. 4467–4470, 1975, Pergamon Press.

Stephens et al., "The Substitution of Aryl Iodides with Cuprous Acetylides. A Synthesis of Tolanes and Heterocyclics", Dec. 1963, pp. 3313–3315.

Suffert et al., "Towards Molecular Electronics: A New Family of Aromatic Polyimine Chelates Substituted with Alkyne Groups", Tetrahedron Letters, vol. 32, No. 6. pp. 757–760, 1991.

Callahan et al., "Tertiary Butyl Group as a Blocking Agent for Hydroxyl, Sulfyhdryl and Amido Functions in Peptide Synthesis", Jan. 20, 1963, pp. 201–207.

Nishimura et al., "New Method for Removing the S–p–Methoxybenzyl and S–t–Butyl Groups of Cysteine Residues with Mercuric Trifluoroacetate", Chem. Pharm. Bull., vol. 26, Oct. 21, 1977, pp. 1576–1585.

Miller, "Molecular Electronics?", Advanced Materials 2, (1990) No. 8. pp. 378–379, 495–497, 601–603.

Tour et al., "Synthesis and UV–Visible properties of Soluble β–Thiophene Oligomers. Monomer to Octamer", American Chemical Society, 1992, pp. 1901–1907.

Tour et al., "Extended Orthogonally Fused Conducting Oligomers for Molecular Electronic Devices", American Chemical Society, 1991, pp. 7064–7066.

Tour et al., "Approaches to Orthogonally Fused Conducting Polymers for Molecular Electronics", American Chemical Society, 1990, pp. 5662–5663.

Yoshimura et al., "Quantum wire and Dot Formation by Chemical Vapor Deposition and Molecular Layer Deposition of One–Dimensional Conjugated Polymer", Appl. Phys. Lett 60 (30), Jan. 20, 1992, pp. 268–270.

Zecevic et al., "Spectroscopic and Electrochemical Studies of Transition Metal Tetrasulfonated Phthalocyanines—Part V. Voltammetric Studies of Adsorbed Tetrasulfonated Phthalocyannines (MTsPc) in Aqueous Solutions", J. Electroanal. Chem., 196 (1985), pp. 339–358.

Kenny et al., "Synthesis of Molecular Lines, Rigid Linear Molecules with Nanometer Scale Dimensions", J. Chem., Soc., Chem. Commun., 1988, pp. 84–85.

Callahan et al. The Tertiary Butyl Group as a Blocking Agent for Hydroxl, Sulfhydryl and Amido functions in Peptide Synthesis, pp. 201–207 (Jan. 10, 1963).

Farazdel et al., Electric Field induced Intramolecular Electron Transfer in Spiro π–Electron Systems and Their Suitability. J. Am. Chem. Soc. 112, 4206–4214 (1990).

Hush et al. Electron and Energy Transfer Through Bridged Systems. 6. Molecular Switches: The Critical Field. J. Am. Chem. soc. 112, 4192–4197 1990).

IBM Technical Disclosure Bulletin, vol. 31, No. 9, (Feb, 1989).

Kenny et al., Synthesis of Molecular Lines, Ridgid Linear Molecules with Nanometer Scale Dimensions. J. Chem. Soc., Commun. 84–85 (1988).

Miller. Molecular Electronics? Adv. Mater. 2, 378–379, 492–497, 601–603 (1990).

Nishimura et al. New Method for Removing the s–p–Methoxbenzyl and S–t–Butyl Groups of Cysteine Residues with Mercuric Trifluoroactate. Chem. Pharm. Bull. 26, 1576–1585 (1978).

Sonogashira et al. A convenient synthesis of Acetylenes: Catalytic Substitutions of Acetyienic Hydrogen with Bromalkenes, Iodoarenes, and Bromophyridines., Tetrahedron Letters 4467–4470 (1975).

Stephens. "A Synthesis of Tolanes and Hetercyclics" in The Substitution of Acryl Iodides with Cuprous Acetylides, pp. 3313–3315 (Dec. 1963).

Stille. Palladuim catalyzed coupling of organotin reagents with organic electrophiles. Pure & Appl. Chem. 57, 1771–1780 (1985).

Stille. The Palladuim–Catalyzed Cross–Coupling Reactions of Organotin Reagents with Organic Electrophiles. Angew. Chem. Int. Ed. Engl. 25, 508–524 (1986).

Suffert et al. Towards Molecular Electronics: A New Family of Aromatic Polymine Chelates Substituted with Alkyne Goups. Tetrahedron Letters 32, 757–760 (1991).

Tour et al., Approaches to Orthogonally Fused Conducting Polymers for Molecular Electronics. Am. Chem. Soc. 5662–5663 (Jul. 4, 1990).

Tour et al. Extended Orthogonally Fused Conducting Oligomers for Molecular Electronic Devices. Am. Chem. Soc. 7064–7066 (Aug. 28, 1991).

Tour et al. Synthesis and UV–Visible Properties of Soluble alpha–Thiophene Oligomers. Monomer to Octamer. Am.l Chem. Soc. 1901–1907 (Mar. 30, 1992).

Yoshimura et al. Quantum Wire and Dot formation by chemical vapor deposition and molecular layer deposition of one–dimensional conjugated polymer. Am. Inst. Physics 268–270 (Jan. 20, 1992).

Zecevic et al. Spectroscopic and Electrochemical Studies of Transition Metal Tertrasulfaonated Phthalocyanines. J. Electroanal. Chem. 196, 339–358 (1985).

\* cited by examiner

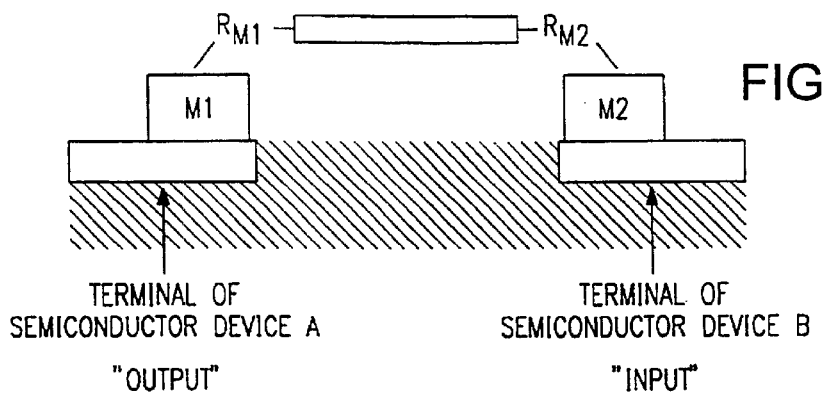
FIG. 10
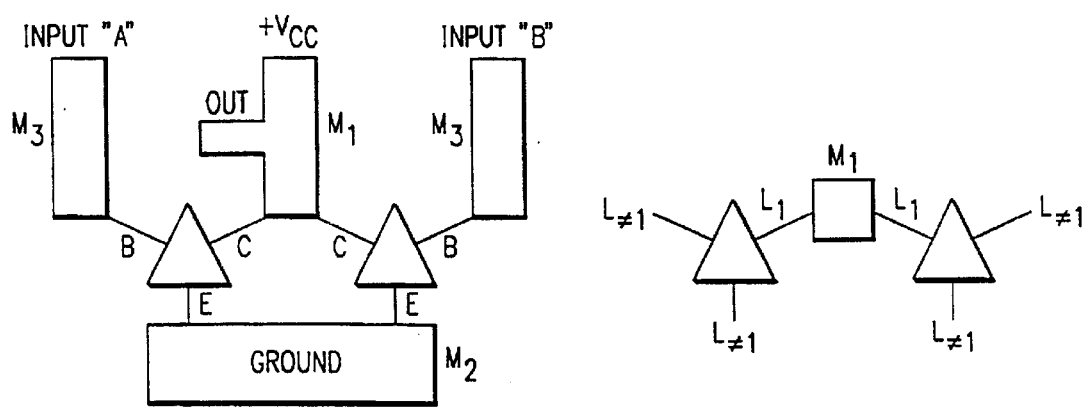
FIG. 11
FIG. 12
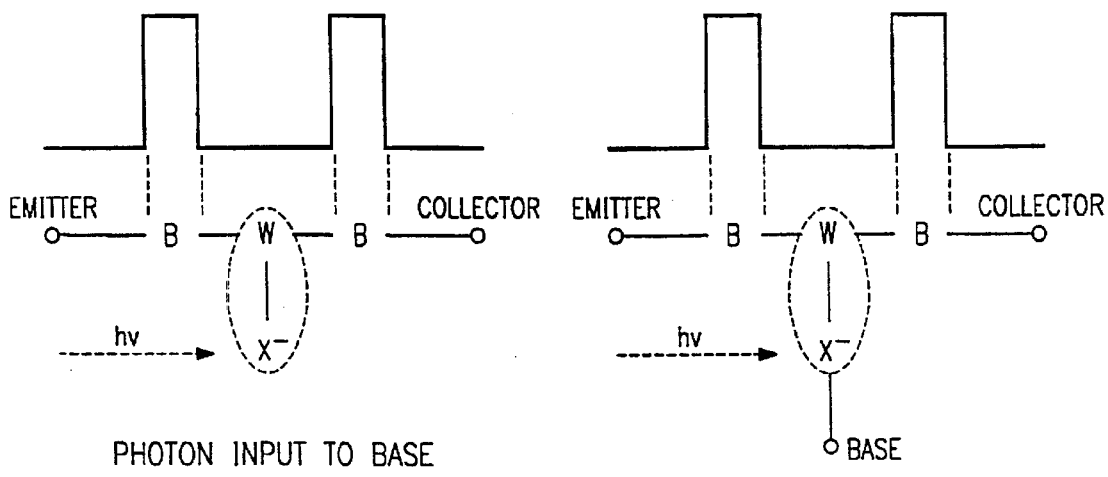
PHOTON INPUT TO BASE
FIG. 13A
ELECTRONIC INPUT TO BASE
FIG. 13B

IONIC INPUT TO BASE

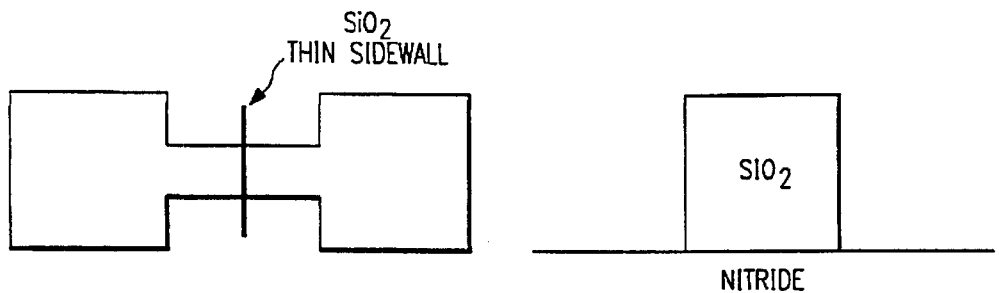
FIG. 14D1  FIG. 14D2
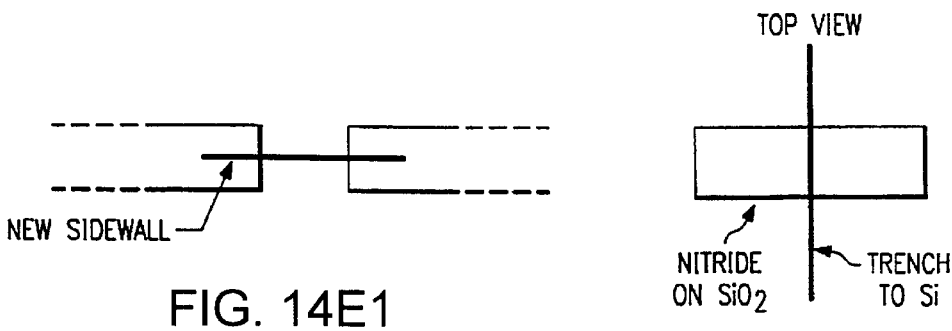
FIG. 14E1
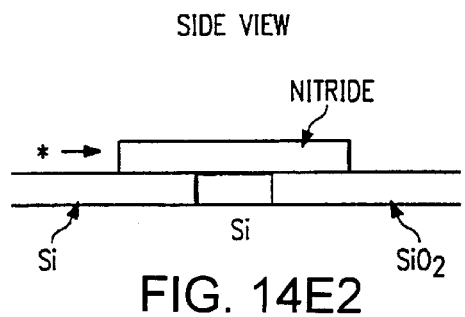
FIG. 14E2
FIG. 14F1
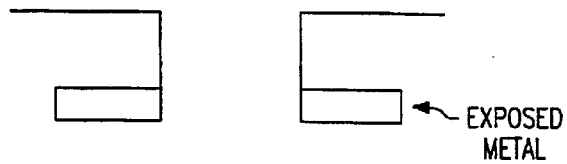
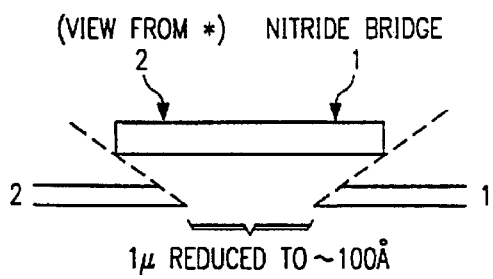
FIG. 14F2

SUB-NANOSCALE ELECTRONIC DEVICES AND PROCESSES

This application is a divisional of U.S. application Ser. No. 08/595,130, filed Feb. 1, 1996 now U.S. Pat. No. 6,320,200, which is a continuation-in-part of U.S. application Ser. No. 08/261,867, filed Jun. 16, 1994 now abandoned, which is a continuation-in-part of U.S. application Ser. No. 07/891,605, filed Jun. 1, 1992 now abandoned.

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

BACKGROUND AND SUMMARY OF THE INVENTIONS

The present inventions relate to a new generation of electronic microcircuit technology, having dimensions much smaller than those of semiconductor integrated circuits, and to related systems and processes.

To better explain the significance and advantages of these innovations, the following paragraphs (down to page 15) will review some technological context. This technological context is not necessarily prior art, but is intended to help in pointing out the disclosed inventions.

The Era of Downscaling

Since about 1960, the steady downscaling of integrated circuit minimum dimensions has permitted ever-increasing density, and thus an ever-increasing range of functionality at an ever-more favorable cost. This wealth of opportunity has permitted system designers to introduce many of the electronic products which have revolutionized industry and daily life in these decades. Continued downscaling steadily improves the available functionalities and pricing, and thus steadily challenges system designers. This fosters a continuing climate of active innovation and competition.

The most obvious index of downscaling is the steady reduction in the "minimum geometry" which can be specified for fabrication of an integrated circuit. This corresponds to a reduction in the size and spacing of the individual transistors, and thus steadily increases the number of transistors which can be fabricated in a given area. However, it is important to note that scaling has also provided exponential improvements in device speed and power dissipation, which has led to substantial enhancement of system performance. Thus, an end to the epoch of downscaling would drastically reduce the speed of progress in electronics.

Limitations of Semiconductor Microelectronics

The danger now in sight is that the downscaling of minimum geometries of transistor-based integrated circuits will eventually be brought to an end by a combination of problems related to devices, interconnections, noise, and reliability.[1] The resulting saturation of circuit densities almost certainly implies a saturation of the historical exponentially downward trend in cost and volume per bit or function.

[1]These issues have been widely discussed; see, e.g., Chattedjee et al., 130, PROC. IEE 105 (1983), which is hereby incorporated by reference.

A technology-dependent issue is where existing ULSI ("ultra-large-scale integration," i.e. semiconductor fabrication with minimum dimensions of a micron or less) will usefully end. From recent work, it is reasonable that this will occur in the 0.1 micron regime; scaling to just the 100s of Å level may not be cost-effective in relation to the development costs of the technology. Thus, identifying an atomic-scale device technology seems the only approach worth the investment.

Several constraints are visibly converging to cut off the advantages of further scaling. While it is likely that clever process modifications can postpone the impact of some constraints, it does not seem likely that all can be avoided.

Alignment Tolerances

One of the basic problems is alignment tolerances: formation of features at a small minimum size $\lambda$ does not imply that that minimum size can be used for fabrication of working circuits: it is also necessary to have alignment tolerances which are much smaller than $\lambda$ (preferably well under $\lambda/4$). (Thus, a 0.8 $\mu$l lithography process will typically have a specified alignment tolerance of $\pm 0.15\mu$ or less.)

With further scaling, this imposes several nonobvious difficulties. One is thermal stability, as discussed below.

Dopant Diffusion Lengths

Diffusion lengths scale approximately as $(Dt)^{1/2}$, where t is time at the highest temperature, and D is a temperature-dependent diffusion constant characteristic of the dopant and the background material. As dimensions are reduced, the dopant diffusion lengths in silicon are posing difficulties in process design. In the past decade, many accommodations have been made to reduce dopant mobility and to reduce time at high temperatures. However, it is not clear that such accommodations can be continued indefinitely. For example, arsenic (or antimony) dopants are now used increasingly in place of phosphorus, but there is no suitale N-type dopant with significantly lower diffusivity than these two.

Punch-Through, Doping Levels, Electric Fields, and Hot Electrons

A voltage applied across a semiconductor junction (in the reverse-bias direction) will naturally create a depletion region around the junction. The width of the depletion region depends on the doping levels of the semiconductor. If the depletion region spreads to contact another depletion region, "punch-through," i.e. uncontrolled current flow, may occur.

Higher doping levels will help to minimize the separations required to prevent punch-through. However, if the voltage change per unit distance is large, this creates a further difficulty.

A large voltage change per unit distance implies that the magnitude of the electric field is large. An electron traversing such a sharp gradient may be accelerated to an energy level significantly higher than the minimum conduction band energy. Such an electron is known as a "hot" electron, and may be sufficiently energetic to pass through an insulator. Thus, hot electrons can irreversibly degrade some common types of devices.

Isolation in a Monolithic Semiconductor Substrate

Conventional semiconductor integrated circuit technology uses a monolithic substrate which is all one crystal. Such substrates provide great advantages in processing.

However, this device architecture poses some inherent difficulty with further scaling. One difficulty is lateral isolation of devices from each other. Another difficulty is leakage current scaling. Another difficulty is presented by the diffusivity of carriers within the substrate: free carriers (generated, e.g., by an alpha particle hit) can diffuse over many tens of microns to help neutralize a stored charge. Some attempts have been made to overcome these difficulties by using total isolation from the substrate, but to date such technologies have not demonstrated favorable economics of scaling.

Considerations in Further Downscaling

Theoretically, further downscaling of devices would still be achievable with the appropriate device technology, IF the approach could simultaneously address the interconnection, reliability, and implied fabrication limitations. Estimates based on abstract physical switching device models which are independent of specific device technologies indicate that several orders of magnitude in downscaling of device power in devices would be theoretically permitted,[2] if an appropriate device technology could be found. The key to this search is to employ electronic phenomena which are characterized by dimensions much smaller than the depletion layer widths and diffusion lengths which provide the basis for conventional transistor function.

[2]See R. T. Bate, "VLSI Electronics" (N. G. Einspruch, ed.), Vol. 5, p. 359 (Academic Press 1982), which is hereby incorporated by reference.

Limitations of Semiconductor Nanoelectronics

Within the last decade, tremendous progress in semiconductor nanofabrication and nanoscale spatial and charge quantization phenomena has bridged the gap from the 0.1 micron regime to the ~10s of Å scale, and even to the atomic level with scanning probe techniques.[3] These advances allow one to create electronic structures that exhibit manifest quantum and single electron effects. However, proposed solid state device implementations at this level suffer from three problems. The first is critical dimensional control. Electron devices which operate in this range must operate by tunneling, since a barrier (heterostructure, oxide, or otherwise) is a prerequisite for isolation in a 3-terminal device that can exhibit gain. However, electron tunneling is exponentially sensitive to atomic-layer fluctuations in the tunneling barriers, resulting in device characteristic variations unacceptable for large scale integration. Secondly, device embodiments utilizing discrete electron charging (single electron transistors, or SETs) suffer from reduced operating temperatures; for room temperature operation, 1 nm or less size junctions are required, dimensions which imply severe tunnel barrier fluctuation problems for solid state embodiments. Finally, none of these approaches address the interconnection and alignment problems. It is instructive to note that these investigations have had little impact on extending ULSI, due to the fundamental limitations of conventional semiconductor devices and fabrication. Fabrication at the nanoscale, and ultimately at the atomic level, of even the simplest structures (interconnects and contacts) is a daunting task. Techniques such as electron beam and STM[4] lithography for pattern transfer appears to bottom out at ~100 Å, due to the requirement of pattern transfer. Atomic manipulation with scanning probes has been demonstrated, but it is unlikely that this technique will be more than a laboratory curiosity since it is essentially a serial approach. (This criticism also holds for STM micromachined arrays, due to registration and access time limitations).

[3]See for example, NANOSTRUCTURE PHYSICS AND FABRICATION, edited by M. A. Reed and W. P. Kirk, Academic Press, 1989; and NANOSTRUCRURES AND MESOSCOPIC SYSTEMS, edited by W. P. Kirk and M. A. Reed, Academic Press, 1992; both of which are hereby incorporated by reference.

[4]"STM" is a conventional abbreviation for scanning tunnelling microscope (or microscopy).

Solid state embodiments of quantum size electronic devices suffer from a number of problems. They are:

Dimensional Fabrication Tolerance:

In a quantum device that utilizes quantum size effects, the intrinsic energy levels (and therefore the threshold voltage) are at least inversely proportional to the size of the device, dependent on the detailed shape of the device potential. If there are fabrication-induced dimensional variations, the quantum state energy will be different from device to device. The smaller the device becomes, the larger the voltage fluctuations. For many semiconductors, such as silicon and gallium arsenide, it is impossible to both make the device small enough such that the quantum energy level spacing is large compared to room temperature thermal energy, and large enough such that a fluctuation of a single monolayer does not unacceptably shift the threshold voltage.

Fabrication Tolerance Limits:

Fabrication tolerance is critical when a tunnel barrier (semiconductor or metal oxide) is used. The current transmitted through the tunnel barrier is exponentially proportional to the tunnel barrier thickness, so again one has the limitation of changes of a single monolayer from device to device in a ULSI circuit will drastically change the output current, and therefore the input voltage to the next stage. The only way to reduce this intrinsic problem (other than a fabrication scheme which guarantees atomic precision) is to increase the barrier thickness to the point where a monolayer thickness fluctuation does not affect the overall current. However, this drastically reduces current density, and thus does not make a good device. Most useful semiconductor and metal oxide tunnel barriers are in the range 5–10 monolayers.

Contact Statistics:

When one makes a quantum device, the contacts to the device must also be reduced to this dimension. If the ohmic contact between devices is made too small, the wavefunction of one device will overlap the second device. This has been demonstrated in high mobility two-dimensional gas layers, where the change of the wavefunction in one part of the layer remotely affected another part. This is not acceptable, since electron devices as we know them must have isolation from one to the next. This implies that the minimum distance between devices is the inelastic scattering length, which is approximately a few tens of nanometers in useful semiconductor materials. Since this defines a minimum contact volume (i.e., a few hundred cubic Ångstroms), we can estimate the number of dopant atoms in the contact, which for this size is only a few tens of dopant atoms. This means that the statistical fluctuations in the number (and position) will dramatically shift the voltage threshold.

Temperature and Voltage Limits:

Quantum wave mechanical devices suffer not only from the above mentioned fabrication fluctuation problems, but also from low temperature/voltage intrinsic limitations. A wave mechanical interference device may be conceived where the output is modulated by an external gate or potential. However, destructive interference of the waves implies that the wave is monochromatic; this implies that only one subband can be used. Not only does this imply very low temperature operation (the electron energy distribution at the Fermi level must be much less than the room temperature thermal distribution), but the maximum conductance of the device is intrinsically very low (80 $\mu S$).

Proposed "Waveguide" Devices:

A different proposed structure is the "waveguide" type of device, in which it has been suggested that the electron wavefunctions will remain in a standing wave pattern which can be changed by inducing a reactance shift at a control point (analogous to an RF stub tuner). However, this proposal has a difficulty due to the multiple subbands available for electrons in semiconductors: sincce the different subbands will typically have different effective wavelengths in a physical structure, the phase shifts which switch the lowest subband off will not necessarily switch off the higher subbands.

The Interconnect Problem:

Even if a technology can be identified which solves the device scaling problem, the problems of interconnections and reliability will require revolutionary solutions. The "interconnect problem" is manifested as propagation delays in device interconnections that limit ultimate system performance. This is especially crucial for the complex logic circuitry of general-purpose processors. Though incremental evolutionary improvements in present transistor technology will surely continue, the resultant yield loss and subsequent increase in cost-per-function will eventually reach a minimum. An interesting example of these limitations is the problem of achieving large dynamic range alignment in this regime. Imagine that in the future one could achieve 100 Å pitch and size active devices, which corresponds to approximately 1 part in $10^7$ dimensional resolution when approximately conserving present chip dimension, for cost and function scaling. This implies optimistically demanding less than 0.5° C. temperature gradients during any fabrication step requiring alignment, which are clearly untenable dimensional and thermal requirements.

The ultimate device technology (if it exists) at this scale, independent of device embodiment, will thus solve the interconnection problem and will be predominantly self-aligned.

The generic properties of a technology which addresses the critical problems can be detailed as follows:

a key innovation must be the solution to the interconnect problem.

The fabrication technology must be predominantly self-aligned, perhaps non-lithographic and self-limiting.

Scaling to the atomic level, and room temperature operation, is desired.

Conjugated Conductive Polymers[5]

[5]In this application, the term "conductive polymer" is used only to refer to conjugated polymers (in which the conjugation of π orbitals leads to electron delocalization, and hence to the potential for high conductivity with appropriate doping). Unfortunately, this term is also used, in engineering literature, to refer to a quite different class of materials, in which a conductive particulate material (typically graphite or metal fibers or powder) is incorporated as filler in a non-conducting polymer matrix.

A vast amount of work has been done, by chemists and physicists, in studying the structure, synthesis, and electronic behavior of conjugated conductive polymers.[6] For many years these materials were not candidates for commercial applications; but more recently newer families of materials have been identified.

[6]See generally all of the articles in the two-volume set *Handbook of Conducting Polymers* (ed. Skotheim 1986), and the references cited in those articles; all of which are hereby incorporated by reference.

π-Orbitals and Extended States

"Conjugated" conductive polymers are those which have overlapping π-orbitals. The resulting extended molecular orbitals provide a pathway through which electrons can travel, IF an external field is applied and IF excess electrons are present, to provide conduction.

Note that conjugated bonding is not itself sufficient to provide good conduction. Therefore, conductive polymer molecular structures often include "dopant" atoms which are selected to provide an adequate carrier density for conduction.

Improvements in Conductivity

Modern conductive polymer compounds have achieved bulk conductivities of greater than 1 $Scm^{-1}$. This begins to be comparable with metals. (For example, the bulk conductivity of copper is slightly less than 600 $Scm^{-1}$.)

Improvements in Stability

Dramatic improvements have occurred in chemical stability of conductive polymers. The first extensively studied material was polyacetylene, which is unstable and highly reactive with oxygen, but a succession of investigators have found more stable and less reactive materials with higher conductivities, as detailed below.

Innovative Systems, Modules, Circuits, Devices, and Methods

The present application discloses a novel technological approach which fits these requirements, and can lead to a new era in ultra-dense electronic systems.

Among the disclosed innovations is self-aligned spontaneous assembly of chemically synthesized interconnects, active devices, and circuits. This is a revolutionary approach for spontaneously assembling atomic scale electronics. It attacks the interconnection and critical dimension control problems in one step, and is implicitly atomic scale. Concurrently, the approach utilizes an inherently self-aligned batch processing technique which addresses the ultimate fabrication limitations of conventional ULSI.

There has been sporadic discusssion of molecular electronic devices for some years now. However, one key deficit of all previous proposals is their failure to solve the problem of achieving electrical GAIN in a molecular electronic device. The technology disclosed below provides a true gain modulation, by modulating the electron wavefunction of a polymeric conductor.

The innovative technology disclosed herein also radically improves the economics of downsizing electronic devices. In conventional semiconductor technology, the cost per transistor is no longer decreasing with reduced size; but the disclosed innovative technology returns to a regime of more favorable cost evolution.

The innovative technology disclosed herein provides an inherently very high degree of self-alignment in processing. Moreover, this new technology is inherently very well suited to batch processing. Many of the problems of fabrication tolerance, which limit the further progress of conventional methods, are solved in the new technology by chemical purification and selection techniques.

New Interconnect Technology

Among the many innovations disclosed herein is a new self-aligned integrated circuit interconnect technology which uses conductive polymers. This technology has many features in common with the active device embodiments described below, but can be exploited independently of those embodiments.

Self-Assembling Wires

There exist non-semiconductor candidates for atomic scale electronic structures which are presently at the molecular level. Since the 1970s, researchers have been exploring 1D conductive organic polymers, such as polyacetylene. Advances in synthesis have identified more promising candidates, such as diphenylpolyene, polythyolenes, polyarylenevinylene, polyarylene, polyphenylene, and polythiophenes. Conductivities of these wires (such as doped polyacetylene) have approached that of copper.[7] These organic chains can have long electron delocalization lengths; for example, delocalization lengths of 20–34 atoms can be calculated from diphenylpolyene results,[8] and ~50 Å for polythiophenes.[9]

[7] See Chiang et al., 100 J. AM. CHEM. SOC. 1013 (1978), which is hereby incorporated by reference.
[8] See the paper by C. W. Spangler which was presented at *The 2nd International Conference on Molecular Electronics—Science and Technology*, Dec. 15–19, 1991, St. Thomas, USVI (unpublished), and which is hereby incorporated by reference.
[9] See the paper by J. Tour presented at PROCEEDINGS OF THE 2ND INTERNATIONAL CONFERENCE ON MOLECULAR ELECTRONICS—SCIENCE AND TECHNOLOGY, Dec. 15–19, 1991, St. Thomas, USVI (unpublished), which is hereby incorporated by reference.

Though the synthesis of 1D molecular wires has been known for some time, the inability to manipulate and assemble organic structures into useful complexes in a manner analogous to semiconductor devices has hindered any application toward electronics. The isolation and measurement of a single organic 1D wire, a key step toward electronic utilization of conductive polymers, has yet to be demonstrated (though the conductivity of large assemblages of the material has been measured). Yet the utilization of the atomic-scale control inherent in organic synthesis could provide an elegant solution to the fundamental fabrication limitations described previously.

The present application presents a new approach which combines molecular synthesis and nanofabrication. We take a conductive polymer, and attach ("functionalize") onto the ends a compound that can selectively attach to a metal probe. Numerous examples of these "self-assembling" compound/metal pairs are known; for example, n-alkanethiols onto Au, isonitrile onto Pt, and alkanecarboxylic acid onto aluminum oxide.[10] This is in essence a conducting string with sticky ends, which could bridge a gap between metallic contacts (of the selective metal). By fabricating (by E-beam or STM) closely-spaced metallic contacts, the molecular wire can be spontaneously deposited from solution. Note that if the molecular wire is synthesized with different end groups on opposing ends, the polarity of the attachment can be defined. The specific contact resistance of such an ohmic contact is not yet precisely known, though the large value of the bond energies imply this may not be a problem; for the organic thiolates and Au, this is 40–45 kcal/mole. These "selective-attachment conducting polymers" (specifically, conjugated organic oligomers with functionalized selective attachment termini) provide a technique for spontaneously generating contacts between metallic endpoints, at the molecular scale (10–100 Å).

[10] See the paper by G. M. Whitesides and P. E. Laibinis at 6 LANGMUIR 87 (1990), which is hereby incorporated by reference.

An advantageous application is for simple self-aligned interconnects; given a device with metal A on one terminal (for example, collector), and a second device with metal B on one terminal (for example, base), a molecular wire with end groups A' and B' (which attach selectively to A and B, respectively) can bind selectively to make an interconnect, without a lithography step. Though we will see that interconnects are not the most important application, this spontaneous "lock-and-key" concept is the basic ingredient. Also note that this process is, to a degree, length dependent. Interconnections of contacts separated by longer than the designed molecular wire length are prevented. An important technology issue is the nuisance of unwanted binding of the polymers other than at the terminal ends. It appears that this concern can be solved for large metallic contacts (other than simple binding posts) by either selective exposure of the metal (i.e., in the simplest case by via holes) through an insulating overlayer coating at only the contact points desired, or by post-attachment scavenging of the unwanted dangling molecular wires.

Selective Auto-connection to Terminals

The disclosed process innovations provide a self-aligned connection of molecular "wires" to their target terminals. If the deposition process is allowed to go to completion, the number of polymer chains connected in parallel will be determined by the available area of the semiconductor or metal contact which the chains are attaching to.

Active Device Operation

One class of sample embodiments operates using the principle of resonant tunnelling.

FIG. 1A shows a resonant tunnelling device in the on-state. Note that an energy level in the well region provides an allowed transition for electrons which tunnel through the barrier into the well. Such electrons can then tunnel through the second barrier toe a region of lower potential, providing a net current.

FIG. 1B shows the device of FIG. 1A in the off-state (after the potential of the base has been shifted). In this state the well no longer has an allowable energy state at the potential of incoming electrons. Therefore, normal conduction electrons cannot tunnel through the two barriers sequentially.

These Figures provide a simple schematic representation of a principle of operation which has been extensively analyzed, and which has been realized in heterojunction semiconductor devices. In such devices, the well region must be physically very small to produce the needed separation of allowable energy states, and these small dimensions cause the fabrication difficulties reviewed above.

However, the innovations disclosed in the present application provide a different way to achieve the same principle of operation (and also other principles of operation). Polymeric molecular structures are manipulated to produce combinations of well and barrier regions, with connections so that the well and/or barrier potentials can be manipulated.

FIG. 4A shows the spatial variation of conduction band (CB) and valence band (VB) energy levels across a first example monomer unit which can form conjugated conductive polymer structures. FIG. 4B shows the spatial variation of conduction band (CB) and valence band (VB) energy levels across a second example monomer unit which can form conjugated conductive polymer structures. FIG. 4C shows how, when two such monomer units are chemically combined, the resulting dimer structure has a band structure which produces a barrier-well-barrier-well-barrier profile.

FIGS. 5A and 5B are a corresponding pair of drawings of two states of operation of a novel molecular electronic device.

FIG. 5A shows the ON state. In this state an energy level in the well region is aligned with the energy level of incoming electrons, and thus resonant tunnelling can occur, to produce a net flow of electrons from the "emitter" terminal through to the "collector" terminal.

FIG. 5B shows the OFF state. In this state a different potential has been induced at the "base" terminal. This induced potential propagates, through the chain X, to change to energy levels in the well region. As a result of this change, no energy level in the well region is aligned with the energy level of incoming electrons, and thus resonant tunnelling does not occur, and therefore current flow does not occur between the "emitter" terminal and the "collector" terminal.

Modulation of Conductor's Conductivity

With a conductive polymer (unlike a semiconductor structure) there are two ways to change the conductivity of the structure. FIGS. 5A and 5B show one architecture, in which the well potential is modulated to achieve gated resonant tunnelling. However, another alternative is to modulate the BARRIER height, as shown in FIGS. 2A and 2B. In this alternative, the modulator chain would be coupled to a barrier location rather than to a well location.

The "Base Isolation" Barrier

To connect the modulator chain to the conductor chain, a coupling unit is preferably used which corresponds to a well in the prinary conductor chain. From the base connection point, the modulator chain is (in the presently preferred embodiment) highly conjugated for short period; then a relatively high barrier is interposed, then a well, then a lower barrier; then the modulator chain is conductive for as long as needed. The barrier$_{high}$-well-barrier$_{low}$ structure serves, in effect, as a base isolation barrier. Note that gain would not be possible without some form of "base isolation." Thus, this feature of the architecture gives substantial advantages.

Electrical Asymmetry of the Active Device

To get electrical asymmetry between Emitter→Collector and Collector Emitter operation, different barrier heights can be used on different sides of the modulated tunnelling region. Moreover, the position of the modulated tunnelling region within the conductive oligomer chain can easily be made asymmetric if desired.

Connecting Signals into the Coupling Chain

Several methods are disclosed for coupling an input signal into the modulator side-chain of an oligomeric active device. The simplest connects the side-chain to an electrical contact. Another disclosed method uses a photosensitive compound to generate a voltage shift under illumination. Another disclosed method uses direct coupling of the modulator side-chain (the "base") of one active device to the output chain (the "collector") of another.

Also disclosed is a self-aligned contact process for preparing metal pads for the oligomeric conductors to bond to.

Inorganic Starting Structure

Preferably a semiconductor integrated circuit structure provides the starting point for fabrication of moecular devices. The conventional structure provides a transition from macroscopic signals down to the small magnitudes characteristic of molecular electronics. In particular, conventional integrated circuit structures can advantageously provide input ESD protection and output drivers.

Isolation

The isolation problem is not nearly as severe as in semiconductor devices, since there is no continuous substrate for carriers to diffuse through. Conduction normally occurs along a single molecule, and the connections of those molecules are largely defined by the formation process.

Device Density

Note that the technologies disclosed herein are inherently suitable for 3D fabrication—as opposed to any planar technology, in which more layers implies more process steps.

Interconnect Density

The novel interconnect technologies disclosed herein provide self-aligned interconnects which are length-constrained, but are NOT limited to line of sight. For example, a molecular electronic active device could even be positioned in an undercut trench if desired.

Configuring SSI-Equivalent Gates

It is also easy to configure devices with multiple inputs. For example, the detailed structure of a NOR gate is described below.

Passivation

Not all conductive polymers are as reactive as polyacetylene, but all are at least somewhat prone to react with $O_2$. (In general, doped polymers are more reactive toward owygen than are the corresponding undoped polymers.) However, advances in conductive polymer research in the 1980s revealed that several families (particularly modified thiophenes) are much more stable, and much less reactive toward oxygen. For long-term use, it is still necessary to package such materials in an anaerobic light-shielded package, but this is easily done as described below.

Available Principles of Operation

The electronic transport mechanisms for quantum-sized systems with tunnel barriers are either; a) tunneling through localized states (i.e., resonant tunneling), or; b) hopping (with attendant issues of Coulomb blockade); or, c) a combination of both.

Resonant tunneling (as schematically shown in FIGS. 2A–2C) is a conduction mechanism which depends on quantum mechanical tunneling through a quasi-bound quantum-confined state. The simplest embodiment is a quantum well cladded by thin tunnel barriers. Electrons from the emitter of such a structure tunnel through the first barrier into the central well region, and then quickly tunnel out. If the central quantum state is made to be energetically misaligned with the incoming emitter electrons, such as by a base potential applied to the central quantum well, the current is dramatically reduced. By this mechanism, a transistor with gain can be produced. Such embodiments have been extensively demonstrated in semiconductor devices, but not in molecular electronic structures.

Hopping, or Coulomb blockade, is a different conduction mechanism, wherein the structure can be thought of as a series of small capacitors. If the structure is sufficiently small, the charging energy of the capacitor, $Ec=e^2/2C$, can be so large that it is energetically unfavorable for 2 or more electrons to be on the central terminal; thus, a single electron at a time "hops" through the structure. FIGS. 3A–3C schematically show this mode of operation, and FIG. 3D shows the corresponding electrical model.

The hopping mechanism is differentiated from resonant tunneling mainly by current density; if the collector barrier is sufficiently thin, electrons quickly tunnel through the structure, so Coulomb blockade never has a chance to take effect; thus, resonant tunneling is the mechanism. If the collector barrier is thick and/or high, the electron resides in the central region for a long time, and thus Coulomb blockade occurs.

The advantage of resonant tunneling is that high current density and large gain are possible. In Coulomb blockade, the ultimate limit of an electron device (i.e., a single electron device), the current density is low, and it is as yet unclear that large gain can be achieved in such a device.

According to one embodiment of the present invention there is provided:

A system comprising:
- a master clock circuit, and an optical output driver connected to follow the frequency and phase of said master clock circuit;
- a plurality of electronic circuits, on one or more integrated circuits,
- wherein plural ones of said electronic circuits include semiconductor active devices configured as output drivers,
- and wherein plural ones of said electronic circuits include first and second conductive contacts thereof and a photoconductive oligomeric structure connected therebetween;
- and where light from said optical output driver is optically coupled to multiple ones of said photoconducive oligomeric structures in multiple ones of said circuits.

According to another embodimenmt of the present invention there is provided:

A circuit comprising:
- a semiconductor integrated circuit, comprising semiconductor driver devices, and electrically configured to be connected to first, second, and third contacts;
- a first molecular electronics device, electrically configured to receive
- a first input signal and to provide a conductivity, between said first and third contacts, which is modulated in accordance with said first input signal;
- a second molecular electronics device, electrically configured to receive a second input signal and to provide a conductivity, between said second and third contacts, which is modulated in accordance with said first input signal;
- a voltage detection circuit, electrically connected to detect the voltage of said third contact and provide a corresponding output;
- whereby said output of said voltage detection circuit provides a signal which is equivalent to a NOR of said first and second input signals.

According to another embodimenmt of the present invention there is provided:

A picoelectronic device comprising:
- first and second conductor chains, each comprising multiple monomor units having mutually conjugated bonding;
- a first barrier region, connected to said first conductor chain, said first barrier having a potential energy for electrons which is less favorable than that of said first conductor chain;
- a second barrier region, connected to said second conductor chain, said first barrier having a potential energy for electrons which is less favorable than that of said second conductor chain;
- a well region, connected to said first and second barrier regions, said well region having a potential energy for electrons which is more favorable than that of said first and second barrier regions;
- a third barrier region, connected to said well region, said third barrier having a potential energy for electrons which is less favorable than that of said well;
- a third conductor chain, comprising multiple monomor units having mutually conjugated bonding, and operatively connected to said well region through said third barrier region;
- whereby changing potentials applied to said third chain can effect modulation of currents between said first and second chains.

According to another embodimenmt of the present invention there is also provided:

An integrated circuit structure, comprising:
- a plurality of transistors;
- a plurality of thin-film conductor interconnects, interconnected to form electronic circuits in a predetermined electrical configuration;
- a plurality of pairs of contact pads, connected to said thin-film conductor interconnects, each adjacent pair of contact pads being interconnected being electrically connected only by a conductive oligomer of a precisely predetermined number of units.

According to another embodimenmt of the present invention there is also provided:

An integrated circuit structure, comprising:
- a plurality of transistors;
- a plurality of thin-film conductor interconnects, interconnected to form electronic circuits in a predetermined electrical configuration;
- a plurality of pairs of contact pads, connected to said thin-film conductor interconnects, each adjacent pair of contact pads being electrically connected only by a conductive oligomer of a precisely predetermined number of units.

According to another embodimenmt of the present invention there is also provided:

An integrated circuit structure, comprising:
- a plurality of semiconductor transistors;
- a plurality of thin-film conductor interconnects, interconnected with said semiconductor transistors to form electronic circuits in a predetermined electrical configuration;
- a plurality of pairs of contact pads, connected to said thin-film conductor interconnects;
- a plurality of molecular electronic active devices, each including a conductive oligomer connecting one of said contact pads, and a barrier-well-barrier structure connected to modulate the conductivity of said conductive oligomer.

According to another embodimenmt of the present invention there is also provided:

An integrated circuit structure, comprising:
- a plurality of transistors;
- a plurality of thin-film conductor interconnects, interconnected to form electronic circuits in a predetermined electrical configuration;
- a plurality of pairs of contact pads, connected to said thin-film conductor interconnects, each adjacent pair of contact pads including a first pad of a first conductive material and a second pad of a second conductive material, and being electrically connected only by a conductive oligomer of a precisely predetermined number of units.

BRIEF DESCRIPTION OF THE DRAWING

The present invention will be described with reference to the accompanying drawings, which show important sample embodiments of the invention and which are incorporated in the specification hereof by reference, wherein:

FIG. 5A shows the ON state. In this state an energy level in the well region is aligned with the energy level of incoming electrons, and thus resonant tunnelling can occur, to produce a net flow of electrons from the "emitter" terminal through to the "collector" terminal.

FIG. 5B shows the OFF state. In this state a different potential has been induced at the "base" terminal. This induced potential propagates, through the chain X, to change to energy levels in the well region. As a result of this change, no energy level in the well region is aligned with the energy level of incoming electrons, and thus resonant tunnelling does not occur, and therefore current flow does not occur between the "emitter" terminal and the "collector" terminal.

FIG. 10 shows a structure in which a conductive polymer provides self-aligned length-selective connection of metal contact pads M1 and M2, to connect semiconductor devices together.

FIG. 11 shows a NOR gate using molecular electronic devices.

FIG. 12 shows a structure in which length-selective oligomeric interconnects provide interconnection and electrical orientation of molecular electronic devices.

FIGS. 13A, 13B, and 13C show three alternative structures for inputting a signal into the modulator side-chain (in a device like that of FIGS. 5A and 5B):

FIG. 13A shows how photonic input provides a potential change at a photosensitive end-group on the modulator chain;

FIG. 13B shows how electrical input, from a metal or semiconductor contact, provides a direct potential change at an end-group on the modulator chain; and FIG. 13C shows how ionic population shifts, in a microlocalized medium, provides a potential change on the modulator chain.

FIGS. 14A, 14B, 14C, 14D1, 14E1, and 14F1 show a first self-aligned process for fabrication of contacts of two different materials, with sublithographic spacing, in an integrated circuit fabrication process.

FIGS. 14A, 14B, 14C, 14D2, 14E2, and 14F2 show a second self-aligned process for fabrication of contacts of two different materials, with sublithographic spacing, in an integrated circuit fabrication process.

DESCRIPTION OF THE PREFERRED EMBODIMENTS

Figure 1A:
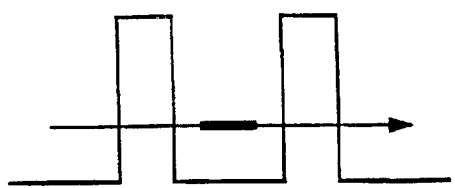
FIG. 1A shows a resonant tunnelling device in the on-state.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Oligomeric Interconnects

The oligomers, in the presently preferred embodiment, will be thiophene and thiophene-ethynylene oligomers of 100 Å in length (two 50A chains separated by a barrier-well-barrier structure). Thiophenes exhibit conductivities, in the bulk, of 100–200 $\Omega^{-1}cm^{-1}$. The ends of the oligomers will be functionalized with a thiol group on one end and a carboxyl groups on the other. Thiophene units can be readily deprotonated using bases like LDA, butyllithium, or alkyllithiums; hence, end group functionalization such as an organolithium can be easily accomplished. (Since lithium is at the top of the electropositivity scale, one can transmetalate to almost all other metals, or react with almost any electrophile. For example, a thiophene end group can be lithiated and converted to a (1) thiol for adhesion to Au surface, (2) for adhesion to Pd surfaces, (3) carboxylated for adhesion to oxide surfaces, (4) transmetalated and cross-coupled to bipyridyls for adhesion to Fe, etc.) The thiol group will selectively attach to a gold metal pad, and the carboxyl group to an aluminum pad, selectively for pad spacing of less than or equal to 100 Å. The pads will be defined by E-beam lithography and liftoff.

Synthesis of Controlled-Length Oligomers

In the presently preferred embodiment, thiophene units are used as the optimal organic subunits for controlled oligomer growth. This is because (1) oligo- or polythiophenes exhibit conductivities, in the bulk, of 100–200 $\Omega^{-1}cm^-$, (2) The oligomers are air and light stable and they can be handled with no exotic precautions, (3) the alkyl groups afford materials that are freely soluble in organic solvents with no loss in the conductivities due to distortions in planarity of the contiguous p-backbone, and (4) thiophene units can be readily deprotonated using bases like LDA or butyllithium; hence, end group functionalization can be easily accomplished.

The synthesis of thiophene-ethynylene systems is expected to allow the rapid chain growth of conjugated oligomers (molecular wires). Simply, monomer will be converted to dimer, dimer to tetramer, tetramer to octamer, octamer to 16mer, 16mer to 32-mer, etc. In this way, there would be a rapid growth of the molecular chains. The synthetic route with the progress to date is shown in Scheme II.

Selective Attachment to Electrical Contact Pads

The present application provides an automatic attachment process, in which we take a conductive polymer, and attach ("functionalize") onto the ends a compound that can selectively attach to a metal probe. Numerous examples of these "self-assembling" compound/metal pairs are known; for-example, n-alkanethiols onto Au, isonitrile onto Pt, and alkanecarboxylic acid onto aluminum oxide.[11] This is in essence a conducting string with sticky ends, which could bridge a gap between metallic contacts (of the selective metal). By fabricating (by E-beam or STM) closely-spaced metallic contacts, the molecular wire can be spontaneously deposited from solution. Note that if the molecular wire is synthesized with different end groups on opposing ends, the polarity of the attachment can be defined. The specific contact resistance of such an ohmic contact is not yet precisely known, though the large value of the bond energies imply this may not be a problem; for the organic thiolates and Au, this is 40–45 kcal/mole. These "selective-attachment conducting polymers" (specifically, conjugated organic oligomers with functionalized selective attachment termini) provide a technique for spontaneously generating contacts between metallic endpoints, at the molecular scale (10–100 Å).

[11]See the paper by G. M. Whitesides and P. E. Laibinis at 6 LANGMUIR 87 (1990), which is hereby incorporated by reference.

An advantageous application is for simple self-aligned interconnects; given a device with metal A on one terminal (for example, collector), and a second device with metal B on one terminal (for example, base), a molecular wire with end groups A' and B' (which attach selectively to A and B, respectively) can bind selectively to make an interconnect, without a lithography step. Though we will see that interconnects are not the most important application, this spontaneous "lock-and-key" concept is the basic ingredient. Also note that this process is, to a degree, length dependent. Interconnections of contacts separated by longer than the designed molecular wire length are prevented. An important technology issue is the nuisance of unwanted binding of the polymers other than at the terminal ends. It appears that this concern can be solved for large metallic contacts (other than simple binding posts) by either selective exposure of the metal (i.e., in the simplest case by via holes) through an insulating overlayer coating at only the contact points desired, or by post-attachment scavenging of the unwanted dangling molecular wires.

Using synthesis similar to that outlined above, functional groups will be inserted into the conducting oligomer chain. An organic quantum well (more properly, quantum dots) with p-conjugated benzene rings and —O— barriers will be synthesized. A single thiophene unit would serve as the embedded quantum dot, cladded with —O tunnel barriers. The thiophene unit will also be conjugated to another tunnel barrier, —S—, which forms the base. This barrier will have attached to it another thiophene unit, another barrier (—O—), and an oligomer chain with a functionalized end. Voltage input to the base via the conducting oligomer will modify the energy structure of the quantum well, thus modulating the current. Each of the 3 terminals (emitter with a thiol group, collector with a carboxyl group, and base with a diarylphosphine group) will attach spontaneously and selectively from solution to the metal pads (gold emitter, aluminum collector, and palladium base) in a unique configuration. This is a single molecule organic resonant tunneling (or Coulomb blockade) structure, with exact fabrication tolerance.

Optional Side Groups

The additional of a stabilizing side group, such as ethyl, can help to maintain the solubility of a large oligomer.

Option for Stabilizing Conductor Strands

One advantage of polythiophenes is that alkoxy (—OR) sidegroups (such as —OCH$_3$ or —OCH$_2$CH$_3$) add environmental stability to the polythiophene chain. Thus, use of such sidegroups may provide further advantages in the presently preferred embodiment.

To provide additional in situ stability, it is also possible to add side-groups which will have affinity for a known substrate. Thus, for example, if the polymer conductor is to connect two metal contacts across an oxide surface (e.g. SiO$_2$), a side group with a mild affinity for oxide can be added. An alkyl chain can be added without harming the conductivity of thiophenes, and a hydroxyl end group on the alkyl chain will form weak hydrogen bonding to the silicon dioxide.

Option for Fusing Conductor Strands

If one wanted small cross-linked packets of molecules that could bridge the gap between two surface, there remains the possibility of using the same self-assembly techniques. The metal surfaces would be made large enough that several hundred molecules could bridge the gap. Once the oligomeric units are bridging the gap and attached via the Z groups to the metal contacts, excess oligomers could be washed away. Then, the oligomers, upon exposure to an oxidant or Lewis acid (i.e. I$_2$ or FeCl$_3$), would probably cross-link in place to form a semi-bulk-like material (which would still have a thickness only on the order of only a few hundred molecules thick). These extended oligomers are quite prone to such cross-linking upon mild acid exposure as described in Skotheim's "Handbook of Conducting Polymers" as well as in our "Macromolecules" reference above.

Device Embodiments

General Considerations

Unsuccessful Prior Designs

Up to now, researchers in organic device development have been pursuing embodiments of electron devices such as the so-called "Aviram switch".[12] In this conceptual specification, a delocalized conducting polymer chain has a non-conducting polymer fixed to it at 90% via a non-conjugated s-bonded network. This provides a simple crossbar switch. Such structures are now being realized; using similar methods as described above, two orthogonally fused oligomers (28 and 29) shown below were synthesized in the USC laboratory. Even these complex structure were freely soluble in organic solvents, due to the presence of alkyl groups at several of the thiophene units. Each of these structures have been suggested for future molecular electronic devices.[13]

[12]See the article by A. Aviram at 110 J. AM. CHEM. Soc. 5687 (1988), which is hereby incorporated by reference.

[13]See Tour et al., 112 J. AM. CHEM. SOC. 5662 (1990); Tour et al., 113 J. AM. CHEM. SOC. 7064 (1991); Aviram, 110 J. AM. CHEM. SOC. 5687 (1988); Hush et al., "Electron and Energy Transfer through Bridged Systems. 6. Molecular Switches: The Critical Field in Electric Field Activated Bistable Molecules", 112 J. AM. CHEM. SOC. 4192 (1990); Farazdel et al., "Electric Field Induced Intramolecular Electron Transfer in Spiro π-Electrol Systems and Their Suitability as Molecular Electronic Devices. A Theoretical Study", 112 J. AM. CHEM. SOC. 4206 (1990); all of which are hereby incorporated by reference.

In fact, the following orthogonally fused oligomers for an Aviram switch have actually been fabricated at the University of South Carolina:

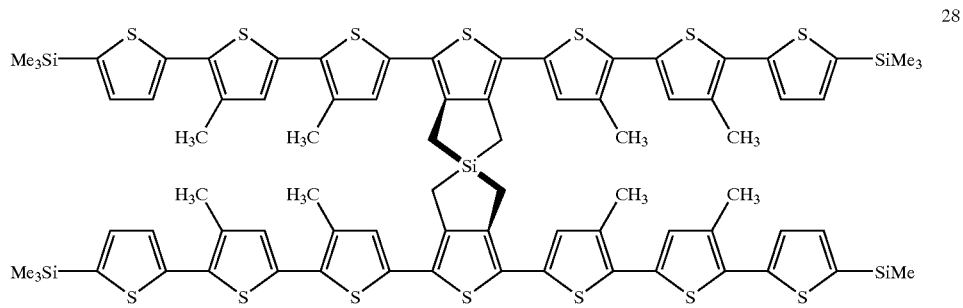

28

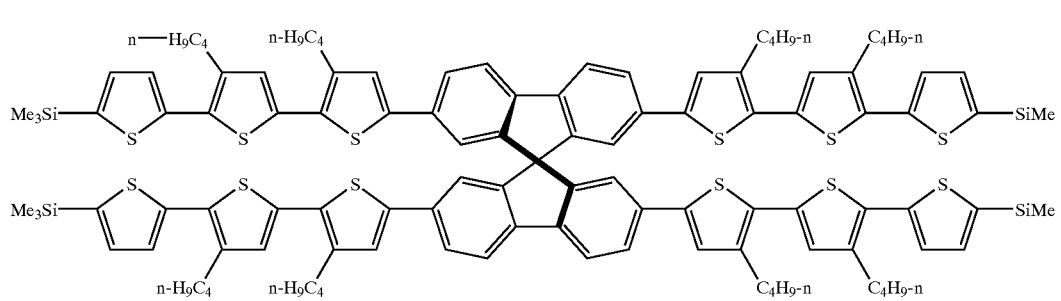

29

A straightforward application of the selective attachment technology described allows us to "tag" appropriately each of the termini. Four appropriately placed nanolithographic probes allow us to lay down the tagged molecule using a lock-and-key strategy, so that we can determine if such structures have the desired electronic properties; i.e., does an Aviram switch work, and does it have any gain?

The Aviram switch is one approach to realizing a molecular functional electron device. However, the present application discloses an alternative approach to realizing a molecular functional electron device that is a straightforward extension of the conducting oligomer work described above, and has an active region that has already been demonstrated (though only by optical characterization). Electrically, the approach is highly analogous to present solid state devices, and should provide a direct path to realizing useful electronic devices. Using synthesis similar to that outlined above, it has been demonstrated that functional groups can be inserted into the conducting oligomer chain of a simple wire to create complex bandgap engineered (in this case, molecular orbital engineered) structures, such as quantum wells or tunnel barriers. An example of a molecular quantum well is phthalocyanine,[14] which exhibits 4 quantum wells, with barrier heights of only a few 10s of $kT_{room}$.

[14]See S. Zecevic et al., "Spectroscopic and Electrochemical Studies of Transition Metal Tetrasulfonated Phthalocyanines, Part V. Voltammetric Studies of Adsorbed Tetrasulfonated Phthalocyanines (MTsPc) in Aqueous Solutions", 196 J. ELECTROAN. CHEM. 339 (1985), which is hereby incorporated by reference.

Very recently, organic quantum wells (more properly, quantum dots) with p-conjugated benzene rings and various barriers (—S—, —O—, and —CH$_2$—) have been reported.[15] Optical measurements exhibit shifts in the optical absorption peak corresponding to appropriately changing either the size of the "dot" (i.e., changing the number of benzene units in the dot region) or the barrier height (using different barrier molecules). Thus, one can achieve the same type of bandgap engineered (here, molecular orbital engineered) electronic structures analogous to those that exist in quantum solid state heterojunction devices. Examples of the type of molecular tunnel barriers and quantum wells that have already been realized are illustrated in FIGS. 4A–4C.

[15]See T. Yoshimura et al., "Quantum wire and dot formation by chemical vapor deposition and molecular layer deposition of one-dimensional conjugated polymer", 60 APPL. PHYS. LETT. 268 (1992), which is hereby incorporated by reference.

Figure 4A:
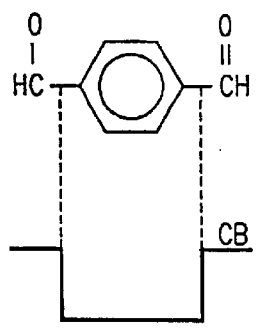
FIG. 4A shows the spatial variation of conduction band (CB) and valence band (VB) energy levels across a first example monomer unit which can form conjugated conductive polymer structures.
Figure 4B:
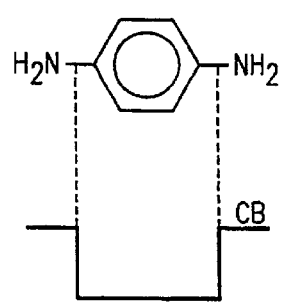
FIG. 4B shows the spatial variation of conduction band (CB) and valence band (VB) energy levels across a second example monomer unit which can form conjugated conductive polymer structures.
Figure 4C:
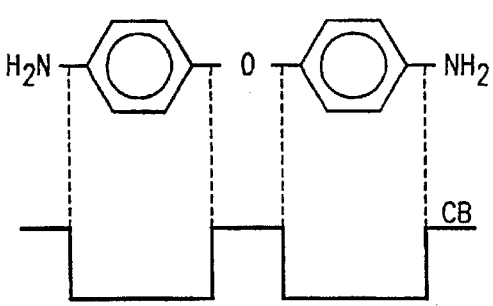
FIG. 4C shows how, when two such monomer units are chemically combined, the resulting dimer structure has a band structure which produces a barrier-well-barrier-well-barrier profile.

FIGS. 4A–C show how the monomer components of a polymer can provide electronic operation analogous to solid state heterojunction quantum wells and tunnel barriers (see reference 18). The schematic conduction band (CB) and valence band (VB) are diagrammed.

According to the teachings of the present application, such organic molecular bandgap engineering is used to realize electronic structures by conjugating a selective-attachment wire to the designed quantum well active region; for example, the molecular equivalent of a resonant tunneling structure is achieved by conjugating the conducting oligomers onto the barrier ends of an organic quantum well (e.g., the example on the far right of FIGS. 4A–4C), then attaching this resultant molecule between nanofabricated contacts. This is a single molecule organic resonant tunneling (or Coulomb blockade) structure, with exact fabrication tolerance. The organic embodiment eliminates the problem of dimensional tolerance found in the heterojunction solid state version, since the synthesis in the molecular case is atomically discrete and unique, whereas self-limiting mechanisms are difficult to achieve in the solid state (i.e., the molecular approach achieves the goal of atomic layer epitaxy). Whether one has resonant tunneling or single electron charging depends on the details of the energy band (i.e., molecular orbital) structure; a priod, it would seem that high current density resonant tunneling would be preferable. It is expected that the large orbital energies will ensure room temperature operation. In the proposed structure, a single thiophene unit would serve as the embedded quantum dot, cladded with —O— or —S— tunnel barriers. Onto the barriers, the conducting oligomers with selective attachment ends would be conjugated. Modeling would help identify sufficiently low tunnel barriers for large current drive. To our knowledge, this approach to molecular quantum devices and the ability to fabricate selective contacts has neither been reported or proposed.

This two-terminal structure is a major milestone in this technology, as it combines the three key ingredients of the technology; 1) synthesis of conducting oligomers with selective attachment end groups; 2) conjugation of these oligomers onto a designed active region; and, 3) spontaneous attachment of a single molecule electron device onto nanofabricated contacts. This is an important intermediary diagnostic step toward achieving the final goal, three (or more) terminal organic transistors with gain. The fabrication of these transistors will require a non-trivial design of the "active region" molecule through modeling.

A molecular transistor that exhibits gain will have the same requirement that solid state electron devices have; that is, gain arising from modulation of non-equilibrium injected carriers by a second distribution of isolated carriers. In the molecular embodiment, it is quickly realized that the solid state analogies can no longer hold, since Coulomb blockade will not allow isolated controlling carriers to exist in the active region. However, there is an alternative, which has a demonstrated proof-of-principle (though so far only in optical embodiments). This alternative uses an active region structure that operates similar to a hot electron transistor (HET). The requirements would be that the quantum well active region (base), which can carry a large transport current density, be conjugated via s-bonds to a remote charge transfer molecule. The properties of this molecule is designed so that the base molecular orbital energy can change dependent on the charge state of the remote (a few bond lengths away) section of the molecule; i.e., gating via deformation of molecular orbitals.

Several methods are disclosed for coupling an input signal into the modulator side-chain of an oligomeric active device. The simplest connects the side-chain to an electrical contact. Another disclosed method uses a photosensitive compound to generate a voltage shift under illumination. Another disclosed method uses direct coupling of the modulator side-chain (the "base") of one active device to the output chain (the "collector") of another.

A common example of a molecule having photovoltaic properties is bacteriorhodopsin, which exhibits photoisomerization between two stable molecular orbital configurations. Specifically, incident light in a dye molecule produces a singlet excited state, which transfers an electron to a remote bacteriopheophytin molecule. In this case, the absorption level due to the molecular orbital reconfiguration changes by ~0.35 eV. (For a comparison to solid state systems, this level change is almost as great as the entire (direct gap) conduction band offset of a $GaAs/Al_xGa_{1-x}As$ quantum well).

Bacteriorhodopsin and rhodopsin are not themselves practical candidates for use with molecular electronic devices in a quasi-thin-film environment. However, many other classes of molecules provide useful photosynthetic reaction centers.[16] Some attractive candidate species are listed by Pieroni in 114 J.A.C.S. 2734 (1992),[17] and by J. -M. Lehn, 1991 J. CHEM. SOC. 1179, both of which are hereby incorporated by reference.

[16] See generally the Tachibana article in 1992 CHEM. LETT. 173, and the review article by R. R. Birge in 41 ANNU. REV. PHYS. CHEM. 683 (1990), both of which are hereby incorporated by reference.
[17] The references cited in this article also merit review, and are also hereby incorporated by reference.

Choice of Oligomeric Conductor

Thiophene is the preferred conductor. Thiophene has been demonstrated to provide adequate conductivity and stability, and also permits convenient modification with sidegroups and endgroups as detailed elsewhere herein. However, alternative conductive oligomers can be used if they provide adequate conductivity and stability.

In general, the thiophene monomeric units provide their best conductivity between ring positions 2 and 5 (the two positions adjacent to the sulfur atom). Thus, the specific examples given below use this configuration. Adjacent thiophene monomers preferably have opposite (but approximately coplanar) orientations. This permits the oligomer to take a more extended trans-oid configuration.[18]

[18] By contrast, if adjacent thiophene monomers have a more nearly parallel (and approximately coplanar) orientation, the oligomer will take up the coiled cis-oid configuration.

Barrier Design at Modulator Input

Figure 5A:
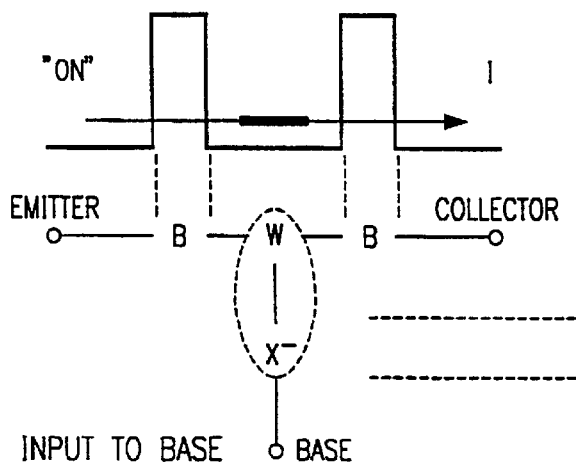
FIGS. 5A and 5B are a corresponding pair of drawings of two states of operation of a novel molecular electronic device.
Figure 5B:
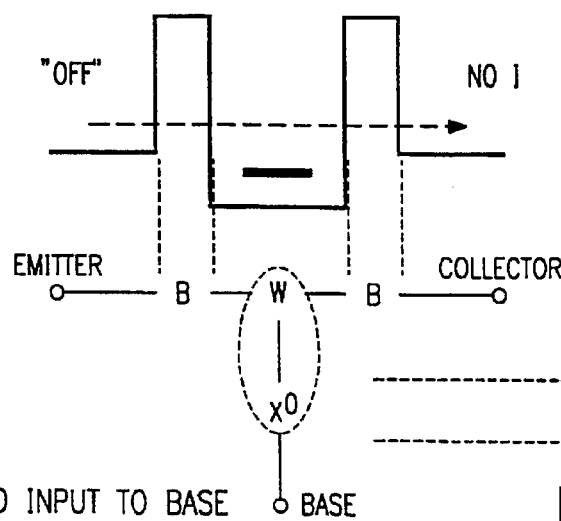

FIGS. 5A and 5B are a corresponding pair of drawings of two states of operation of a novel molecular electronic device.

FIG. 5A shows the ON state. In this state an energy level in the well region is aligned with the energy level of incoming electrons, and thus resonant tunnelling can occur, to produce a net flow of electrons from the "emitter" terminal through to the "collector" terminal.

FIG. 5B shows the OFF state. In this state a different potential has been induced at the "base" terminal. This induced potential propagates, through the chain X, to change to energy levels in the well region. As a result of this change, no energy level in the well region is aligned with the energy level of incoming electrons, and thus resonant tunnelling does not occur, and therefore current flow does not occur between the "emitter" terminal and the "collector" terminal.

Figure 6:
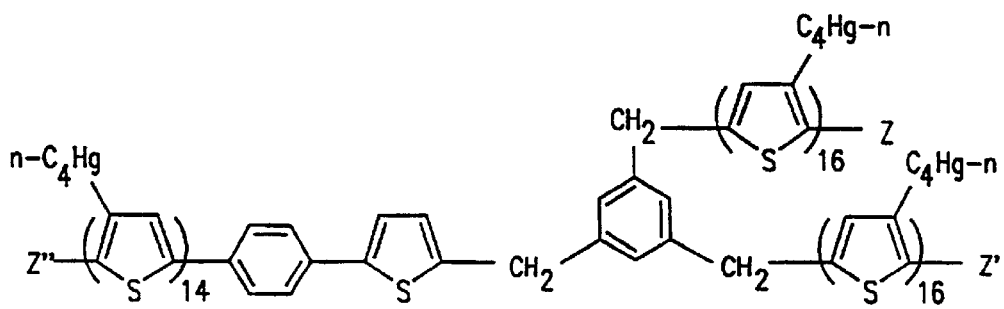
FIG. 6 shows a sample structure for realizing the coupling between the modulator side chain and the energy levels of a well in the conductive polymer chain.

FIG. 6 shows a sample structure for realizing the coupling between the modulator side chain and the energy levels of a well in the conductive polymer chain.

The trisubstituted emitter/collector/base unit can be prepared as follows. The central 1,3,5-benzenetrimethanol is a known compound[19] and can serve as the junction or "W" unit represented in FIGS. 5A and 5B. Treatment with excess p-toluenesulfonyl chloride ("TsCl" or "tosyl chloride") in pyridine would rapidly afford the 1,3,5-benzenetris (hydroxymethylenetosylate). An oligothiophene of 16 units with a metal binding group Z (see below for a description of Z) and n-butyl groups attached would be fully soluble based on our previous experience with thiophene oligomer synthesist. Treatment of the thiophene oligomer with LDA would afford the terminal thiophene anion which could be reacted with an excess of the 1,3,5-benzenetris (hydroxymethylenetosylate) to form the monosubstituted core. Likewise, treatment of the monosubstituted core with a second oligomer anion containing the same or a different metal binding group Z' would afford the disubstituted core. Undoubtedly, a separation would be needed here; however, sterics interactions of the incoming nucleophile should favor the formation of the disubstituted core shown. Again treatment of the disubstituted core with a third oligomeric anion containing the same or a different metal binding group Z" would afford the desired trisubstituted emitter/collector/base unit shown. The methylene units ($CH_2$ groups) serve as the large barrier units. The phenyl group serves as the low barrier unit. It is well-known that conversion of a benzenoid structure to the quinoidal form for conduction is far more difficult than conversion of the thiophene units to their corresponding quinoidal forms. This trend is easily seen in the band-gap differences for polyphenylene and polythiophene at 3.2 eV and 1.9 eV, respectively,[21].

[19] See CHEM. ABSTR. #82:125625g, which is hereby incorporated by reference.
[20] See Tour and Wu, in MACROMOLECULES 1992, 25, 1901; Tour et al. in J. AM. CHEM. SOC. 1991, 113, 7065; Tour et al. in J. AM. CHEM. SOC.

1990, 112, 5662; all of which are hereby incorporated by reference.
[21]See the paper by Bott, Service, and Winter in CHEM. BRITAIN, May 1992.

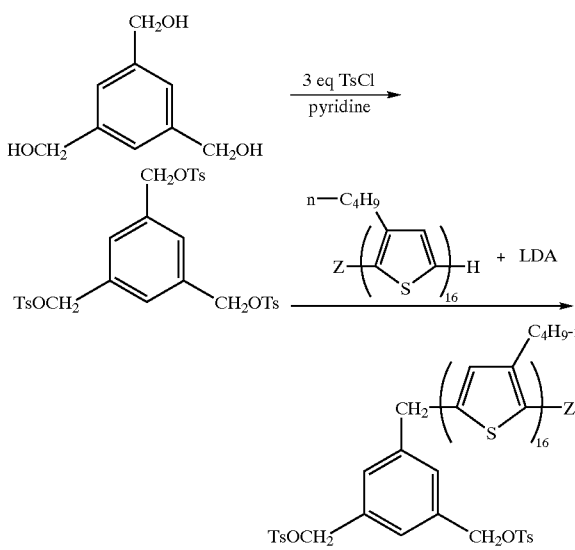

The Z groups would be metal binding groups such as protected carboxyl, protected thiol, phosphine, or bipyridyl group. The protection groups would be base-stable and would be removed at the final step off the reaction. For numerous functional protecting groups, see "Protective Groups in Organic Synthesis" 2nd Edition by Greene, T. W. and Wuts, P. G. M.; Wiley: New York, 1991.

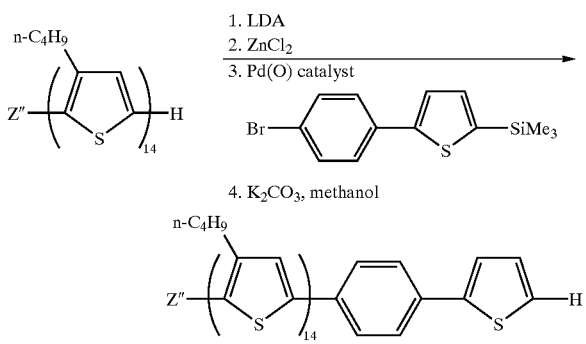

The thiophene oligomers could be synthesized according to methods described previously for soluble thiophene oligomer synthesis. The one chain containing the thiopheneiphenylene unit could be synthesized as shown below. These metal-catalyzed coupling are quite standard in organic synthesis and our three previous papers listed above outline these procedures. Note that "Me" stands for methyl of $CH_3$ group. Similarly, the thiophene-phenylene dimer could be prepared as follows.

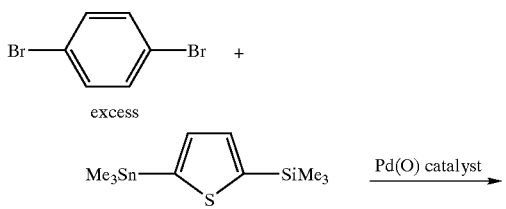

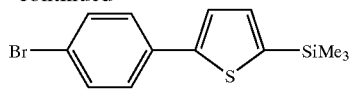

Choice of Modulation Input Source

Figure 13C:
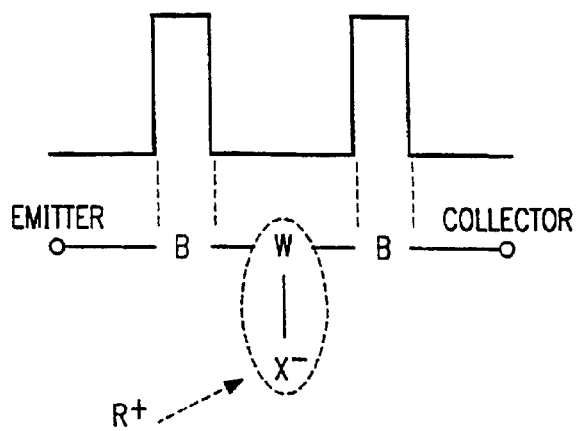

Several methods are disclosed for coupling an input signal into the modulator side-chain of an oligomeric active device. The simplest connects the side-chain to an electrical contact. Another disclosed method uses a photosensitive compound to generate a voltage shift under illumination. Another disclosed method uses direct coupling of the modulator side-chain (the "base") of one active device to the output chain (the "collector") of another. Yet another disclosed method uses ion pumping in a confined gel (as schematically shown in FIG. 13C, to effect an ionic coupling of the modulator side-chain (the "base") of one active device to the output chain (the "collector") of another.

Off-State Impedance

For some applications, a driving need is to modulate the device current down to zero in the off state. For such applications, the device is preferably modified to include multiple modulated gain stages in series. This can be implemented as a molecular structure which includes a barrier-well-barrier-well-barrier structure.

Tunnelling Versus Hopping Operation

The electronic transport mechanisms for quantum-sized systems with tunnel barriers are either; a) tunneling through localized states (i.e., resonant tunneling), or; b) hopping (with attendant issues of Coulomb blockade); or, c) a combination of both.

Figure 2A:
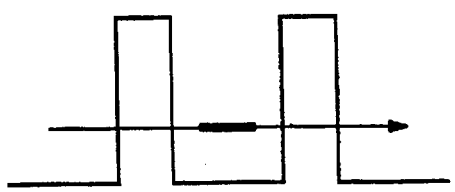
FIG. 2A shows a resonant tunnelling device in the on-state.
Figure 2B:
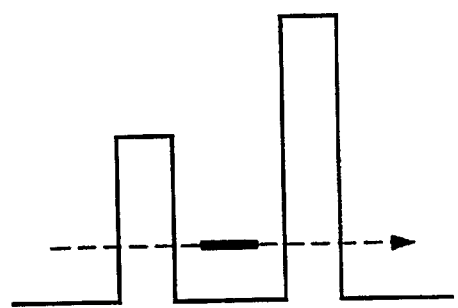
FIG. 2B shows the device of FIG. 2A in the off-state (after wave-function modulation has changed the height of the second barrier).

Resonant tunneling (as schematically shown in FIGS. 2A–2C) is a conduction mechanism which depends on quantum mechanical tunneling through a quasi-bound quantum-confined state. The simplest embodiment is a quantum well cladded by thin tunnel barriers. Electrons from the emitter of such a structure tunnel through the first barrier into the central well region, and then quickly tunnel out. If the central quantum state is made to be energetically misaligned with the incoming emitter electrons, such as by a base potential applied to the central quantum well, the current is dramatically reduced. By this mechanism, a transistor with gain can be produced. Such embodiments have been extensively demonstrated in semiconductor devices, but not in molecular electronic structures.

Figure 3A:
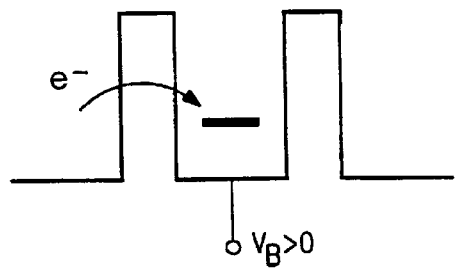
FIG. 3A shows an electron-hopping device with its well empty.
Figure 3B:
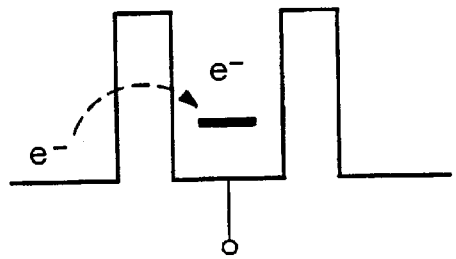
FIG. 3B shows how, if the well of the device of FIG. 3A contains an excess electron, the likelihood of another electron hopping into that well is greatly reduced by the "Coulomb blockade" effect.
Figure 3C:
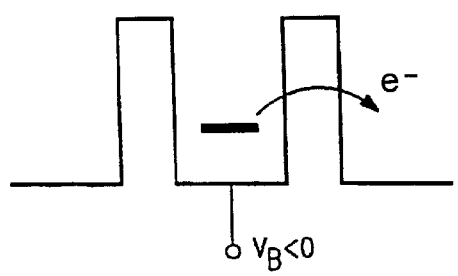
FIG. 3C shows how, if the well of the device of FIG. 3A contains an excess electron, that electron can hop out of the well.
Figure 3D:
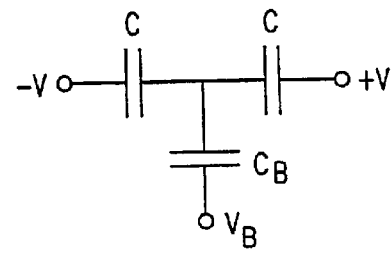
FIG. 3D shows a macroscopic-quasi-equivalent circuit diagram of the device of FIG. 3A.

Hopping, or Coulomb blockade, is a different conduction mechanism, wherein the structure can be thought of as a series of small capacitors. If the structure is sufficiently small, the charging energy of the capacitor, $Ec=e^2/2C$, can be so large that it is energetically unfavorable for 2 or more electrons to be on the central terminal; thus, a single electron at a time "hops" through the structure. FIGS. 3A–3C schematically show this mode of operation, and FIG. 3D shows the corresponding electrical model.

The hopping mechanism is differentiated from resonant tunneling mainly by current density; if the collector barrier is sufficiently thin, electrons quickly tunnel through the structure, so Coulomb blockade never has a chance to take effect; thus, resonant tunneling is the mechanism. If the collector barrier is thick and/or high, the electron resides in the central region for a long time, and thus Coulomb blockade occurs.

The advantage of resonant tunneling is that high current density and large gain are possible. In Coulomb blockade, the ultimate limit of an electron device (i.e., a single electron device), the current density is low, and it is as yet unclear that large gain can be achieved in such a device.

First Preferred Device Embodiment

This sample embodiment provides selective attachment of organic wires.

The oligomers will be thiophene and thiophene-ethynylene oligomers of 100 Å in length. Thiophenes exhibit conductivities, in the bulk, of 100–200 $\Omega^{-1}cm^{-1}$. The ends of the oligomers will be functionalized with a thiol group on one end and a carboxyl groups on the other. Thiophene units can be readily deprotonated using bases like LDA, butyllithium, or alkyllithiums; hence, end group functionalization such as an organolithium can be easily accomplished. (Since lithium is at the top of the electropositivity scale, one can transmetalate to almost all other metals, or react with almost any electrophile. For example, a thiophene end group can be lithiated and converted to a (1) thiol for adhesion to Au surface, (2) for adhesion to Pd surfaces, (3) carboxylated for adhesion to oxide surfaces, (4) transmetalated and cross-coupled to bipyridyls for adhesion to Fe, etc.) The thiol group will selectively attach to a gold metal pad, and the carboxyl group to an aluminum pad, selectively for pad spacing of less than or equal to 100 Å. The pads will be defined by E-beam lithography and liftoff.

Second Preferred Device Embodiment

This second sample embodiment provides a molecular active device which employs resonant tunneling.

Using synthesis similar to that outlined above, functional groups will be inserted into the conducting oligomer chain. An organic quantum well (more properly, quantum dots) with p-conjugated benzene rings and —O— barriers will be synthesized. A single thiophene unit would serve as the embedded quantum dot, cladded with —O— tunnel barriers. The thiophene unit will also be conjugated to another tunnel barrier, —S—, which forms the base. This barrier will have attached to it another thiophene unit, another barrier (—O—), and an oligomer chain with a functionalized end. Voltage input to the base via the conducting oligomer will modify the energy structure of the quantum well, thus modulating the current. Each of the 3 terminals (emitter with a thiol group, collector with a carboxyl group, and base with a diarylphosphine group) will attach spontaneously and selectively from solution to the metal pads (gold emitter, aluminum collector, and palladium base) in a unique configuration. This is a single molecule organic resonant tunneling (or Coulomb blockade) structure, with exact fabrication tolerance.

Third Preferred Device Embodiment

This sample embodiment provides a molecular resonant tunneling device which can be activated by optical input.

Using synthesis methods similar to that outlined above, functional groups are inserted into the conducting oligomer chain. An organic quantum well (more properly, quantum dots) with conjugated benzene rings and —O— barriers will be synthesized. A single thiophene unit would serve as the embedded quantum dot, cladded with —O— tunnel barriers. The thiophene unit will also be conjugated to another tunnel barrier, —S—, which forms the base. This barrier will have attached to it another thiophene unit, another barrier (—O—), and a dye molecule such as bacteriorhodopsin. Photon input to the base will transfer an electron to the base thiophene unit, which will modify the energy structure of the quantum well, thus modulating the current. Only 2 terminals (emitter with a thiol group, collector with a carboxyl group) will attach spontaneously and selectively from solution to the metal pads (gold emitter, aluminum collector) in a unique configuration. The base will hang freely.

Module Embodiments

Assembly of the disclosed molecular electronic devices into a complete integrated circuit bears some significant differences from the assembly and packaging of a conventional semiconductor integrated circuit.

Combination of Molecular and Semiconductor Active Devices

A major problem for most proposed nanoscale device technologies is fanout; there will always be a need for intermediate current drive (amplifiers) in few-electron systems. The solution is easy to incorporate in this technology. A conventional transistor amplifier layer would be the starting substrate. After coating with an insulating layer, the metal interconnect and molecular layers are fabricated on top, with input to the amplifiers made by via holes (for example, the post in FIG. 12). This allows one to derive or input an internal signal anywhere in the array.

Self-Aligned Processes for Preparing Metal Contacts with Nano-Scale Separation

In such a hybrid structure, one important consideration is how to prepare contacts, within a semiconductor fabrication process, which will have small enough dimensions to take advantage of the very small scale of the molecular devices. One option for doing this is E-beam direct write, and a probably long-term alternative is masked ion beam lithography.

However, it can also be advantageous to prepare gaps which have sublithographic spacing. The following process flow is an example of a self-aligned process for achieveing this.

Figure 14A:
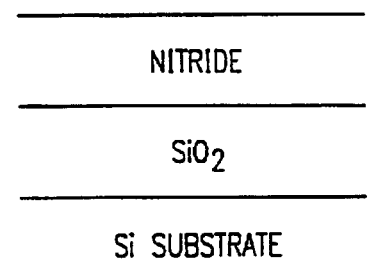
Figure 14B:
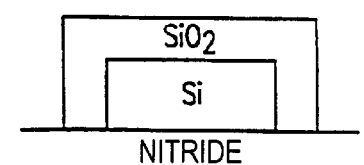
Figure 14B:
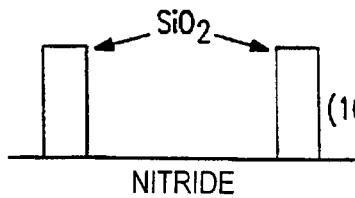
Figure 14C:
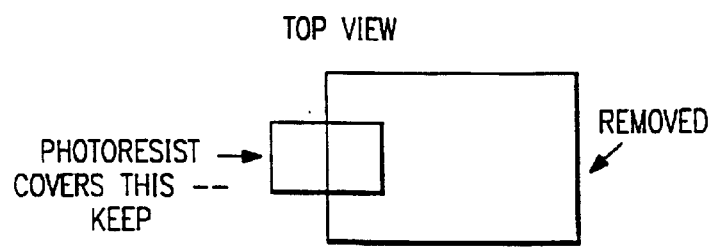

1) (See FIG. 14A) Start with Si substrate; oxidize (thick) $SiO_2$ layer; put on nitride layer.
2) (See FIG. 14B) define "thin sidewall" by
   i) CVD Si
   ii) pattern small Si squares
   iii) recrystallize Si (if necessary)
   iv) 100 Å $SiO_2$ anneal
   v) ion etch briefly (150 Å)
   vi) RIE Si
3) (See FIG. 14C) remove sidewall except for 1 side (photoresist & $SiO_2$ etch)
4) (See FIG. 14D1) Define contact pads (optical); evaporate metals 1 and 2
5) Etch $SiO_2$—lifts off metal to create a 100 Å break.
6) (See FIG. 14E1) Do same "sidewall" trick to create a 100 Å wall across pads
7) (See FIG. 14F1) evaporate some insulator (e.g. $CaF_2$); etch $SiO_2$ (lift off $CaF_2$); left with exposed metal
8) Add the polymers.

This process can also be varied with alternative steps as follows:
4') (See FIG. 14D2) Pattern nitride in the following configuration (using optical photoresist and plasma etch):
5') (See FIG. 14E2)
   i) Spin on Photoresist ("PR")
   ii) Partially etch the PR in an $O_2$ plasma until the $SiO_2$ ridge sticks up.
   iii) Etch $SiO_2$ (under RIE conditions)
   iv) Etch $SiO_2$ with undercut (e.g. wet etch)
   v) Strip PR. These steps have produced a nitride bridge.
6') (See FIG. 14F2) Now evaporate metals 1 and 2 at different angles. The angle deposition provides a reduction of the $1\mu$ gap to about 100 Å (depending on the specific thicknesses and angles used).

Active Device Types

The preferred active device architecture is as shown in FIGS. 5A and 5B. However, the alternative principles of FIG. 2 or 3 may alternatively be applied instead.

The semiconductor active devices are preferably MOSFETs, for their high input impedance and low power draw. Of course, these are preferably combined with conventional ESD diodes at I/O connections.

Passivation

Of course, the completed module is hermetically sealed from atmospheric oxygen. The simplest way to do this is with a bubble seal which encloses an inert atmosphere (nitrogen or argon). A simple epoxy seal will do a good job of this.

Alternatively, a passivation layer over the active devices is used to scavenge any small amounts of oxidant from the sealed environment.

Examples of Novel Circuit Implementations

Assuming that we can create active devices with "tagged" terminals, we only need to (nanolithographically) define a connection pattern as the first step. We do not assume any specific nanolithographic tool (although it is preferable that such a step will be parallel, such as MIBL, X-ray, or masked E-beam). This initial step defines an aligning matrix for the molecules. We then attach (from solution) the synthesized device(s), in a lock-and-key strategy. Let us consider how to create simple gates. In some cases, we can work with just one "polarity" of tagging. For example, a NOR gate would only need a single polarity, as shown in FIG. 11. Here the organic transistor terminals (collector, emitter, and base; or, C, E, B) are tagged with selective attachment to metals M1, M2, and M3, respectively. After fabrication of the metals in the diagrammed pattern, the tagged molecule spontaneously and selectively arrange to form the gate as shown.

NOR Gate

FIG. 11 is a schematic of a molecular NOR gate. The shaded areas are the initially defined metals M1, M2, and M3. The triangles represent the spontaneously assembled molecular transistors. For this gate, the polarity of the tagging is {E:M2}, {B:M3}, and {C:M1}, where E=emitter, B=base, C=collector. The output can either be metal wire or a M1 tagged oligomer.

For complex designs, the metal (or otherwise) attachment pads need not be connected externally, and can serve as binding post attachment posts for transistor—transistor "soldering", as illustrated in FIG. 12, which is a schematic of a molecular binding post arrangement, for arbitrary {E,B,C} connections. The shaded area is metal M1, and the triangles represent the molecular transistors with attachment ends L1.

This allows us to define a topology, unaligned (indeed, as the initial step), of active device interconnections without external contacts. Some more complex circuits will require a number of different polarities and types of active elements. The fabrication for such a system would require sequential spontaneous absorptions of each type, from solution. The only constraint is that each polarity have a unique contact geometry, and that each successive step does not disturb the subsequent stages (i.e., process integration. While this is clearly not a trivial engineering feat, there are no fundamental limitations yet identified.) Thus, the circuit configuration is determined in the reverse order than that of conventional fabrication; the active devices spontaneously self-assemble onto the interconnects. Note that the interconnects that run long distance are few; most are simply attachment sites to connect emitter to base, etc.; thus, metal interconnects will not define the lower limit of device scaling, with a design that mixes metal and conductive oligomer contacts. This approach appears to optimally pack devices.

Multi-Input (Quasi-Analog) Gates

By including multiple modulator chains at separate inputs on a conductor chain, conductivity can be modulated independently by several separate inputs. Such quasi-analog gates may be useful for applications such as pattern recognition.

Novel System Applications

The device and circuits described lend themselves well to systems in which an array of molecular circuits can advantageously be formed, in a wholly self-aligned manner, by a sequence of batch-processed steps.

Clock Distribution

A significant issue for any large integrated system is clock distribution and skew. As was previously discussed, there exists a class of photoisomerization molecules which could be directly utilized here. At nodes where one wishes to distribute a global clock that cannot be distributed by the underlying amplifier array, a photosensitive electron transfer molecule would be attached to the base, thus supplying an optically generated clock with no skew. The ability to conjugate a variety of different photosensitive electron transfer molecules on the same basic transistor structure could provide the capability of a multiphase clock.

Large Neural Networks

Neural networks are an extremely attractive technology which has attracted increasing interest over the last 30 years. A great advantage of the neural network architecture is that it is not necessary to directly specify every connection, nor to have direct access to every stored bit of data. However, this imposes a correlative difficulty in scaling to large sizes: the peripheral access circuits become less closely coupled to the "interior" of a neural net as the size of the array increases.

The disclosed novel architectures, by providing self-asembling electronic devices with electrical access available at any point, offer the potential to provide a large advance in neural network architectures.

Holographic Storage

The disclosed innovative technology provides a new way to economically fabricate arrays with very high density. Therefore, one particularly attractive application is in direct or internal addressing of holographic memory.

Holographic memory exhibits many attractive characteristics, but its difficulties have prevented it from making any serious threat to become other than marginal. One contribution potentially available from the disclosed inventions is to permit direct access to modify or overlay holographically-organized date.

Sample Processing Sequence

We now outline the detailed synthetic organometallic approach to realizing these conjugated organic oligomers. The oligomers will be well-defined, homogeneous materials that are fully characterized from the structural standpoint. No range of molecular weight compounds or molecular lengths will exist. These will be chemically pure (>97%) materials (initially thiophene and thiophene-ethynylene oligomers), of lengths that can be determined to 0.5 Å. The oligomers will range from 10 Å to at least 100 Å in length. In the undoped form, they will be air and light stable for at least 24 hours, and stable for months or years in an inert ($N_2$) atmosphere in the absence of light.

The ends of the oligomers will be appropriately functionalized with various organic groups that are known to adhere to specific nanolithographic probe surfaces. These functionalities may be thought of as molecular "alligator clips". Once these functionalized oligomers are synthesized, we can electrically characterize a single molecular oligomer by "stringing" it between nanofabricated 100 Å spacing metal contacts. Simultaneously, we can structurally characterize the adhered oligomer, in situ, by STM. At present, conjugated oligomers with maximum lengths of ~50 Å have been fabricated. These lengths need to be extended to ~100 Å to coincide with long term nanolithographic requirements. Thus, the synthesis effort will have two parallel paths; extend the conjugated oligomer length to 1000 Å; and conjugate selective attachment structures onto existing, shorter lengths to gain synthesis experience of compatibility of processes.

Candidate attachment end groups are thiol, carboxyl, pyridyl, or phosphine groups. The electronic properties of the attachment structures are key to the synthesis direction. The fabrication/characterization effort simultaneously will be characterizing the attachment end groups, by attachment onto nanofabricated structures, and subsequent STM. These results will provide information about the binding energies and properties of the various proposed attachment structures.

The synthesis of homogeneous conjugated oligomers beyond 50 Å in length has never before been accomplished. Two groups recently reported the formation of 40 Å oligomers; however, there were two primary deficiencies in those systems that would make it difficult for their incorporation into nanolithographic architectures.[22] First, the conjugated polyolefins are not stable to air and light at ambient temperatures for even short time periods (<30 min half lives). Second, and even more importantly, the syntheses do not lend themselves to the preparation terminally functionalized oligomers which are necessary if the molecules are to bind to probe surfaces. The group of Prof. J. Tour recently described the synthesis of thiophene oligomers from 3 Å to 30 Å. The synthesis and reagents necessary for the synthesis are shown as follows in Scheme I.[23]

[22]See the paper by M. Blanchard-Desce, presented at THE 2ND INTERNATIONAL CONFERENCE ON MOLECULAR ELECTRONICS—SCIENCE AND TECHNOLOGY, Dec. 15–19, 1991, St. Thomas, USVI (unpublished), which is hereby incorporated by reference. There was one report of a 75 Å molecular wire (P. W. Kenny and L. L. Miller, "Synthesis of Molecular Lines, Rigid Linear Molecules with Nanometer Scale Dimensions", 84 J. CHEM. SOC. CHEM. COMMUN. 1988); however, the many amide linkages along the backbone would probably be an electron sink. Specifically, a conducting backbone was not utilized.

[23]See J. Tour and R. Wu, MACROMOLECULES 1992, which is hereby incorporated by reference.

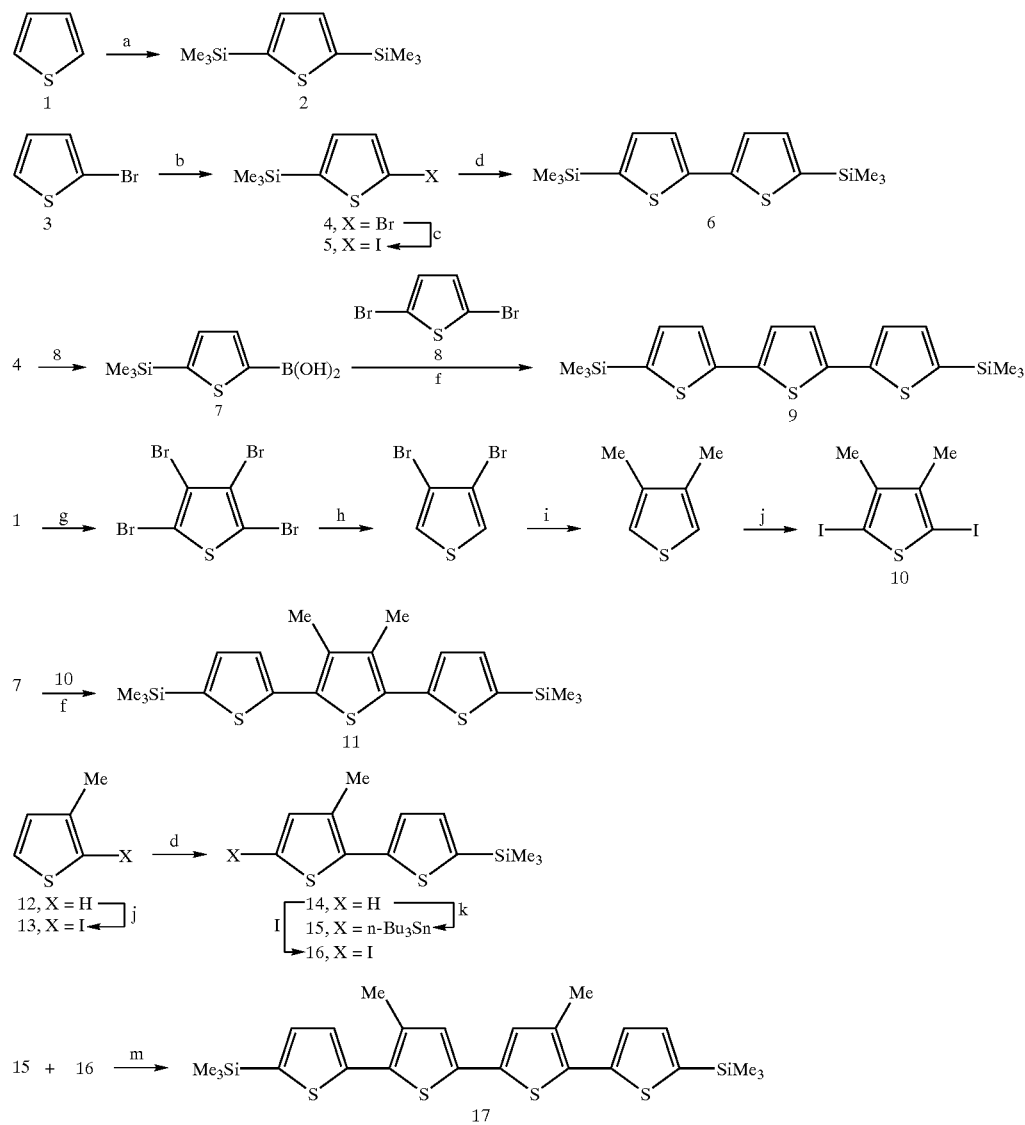

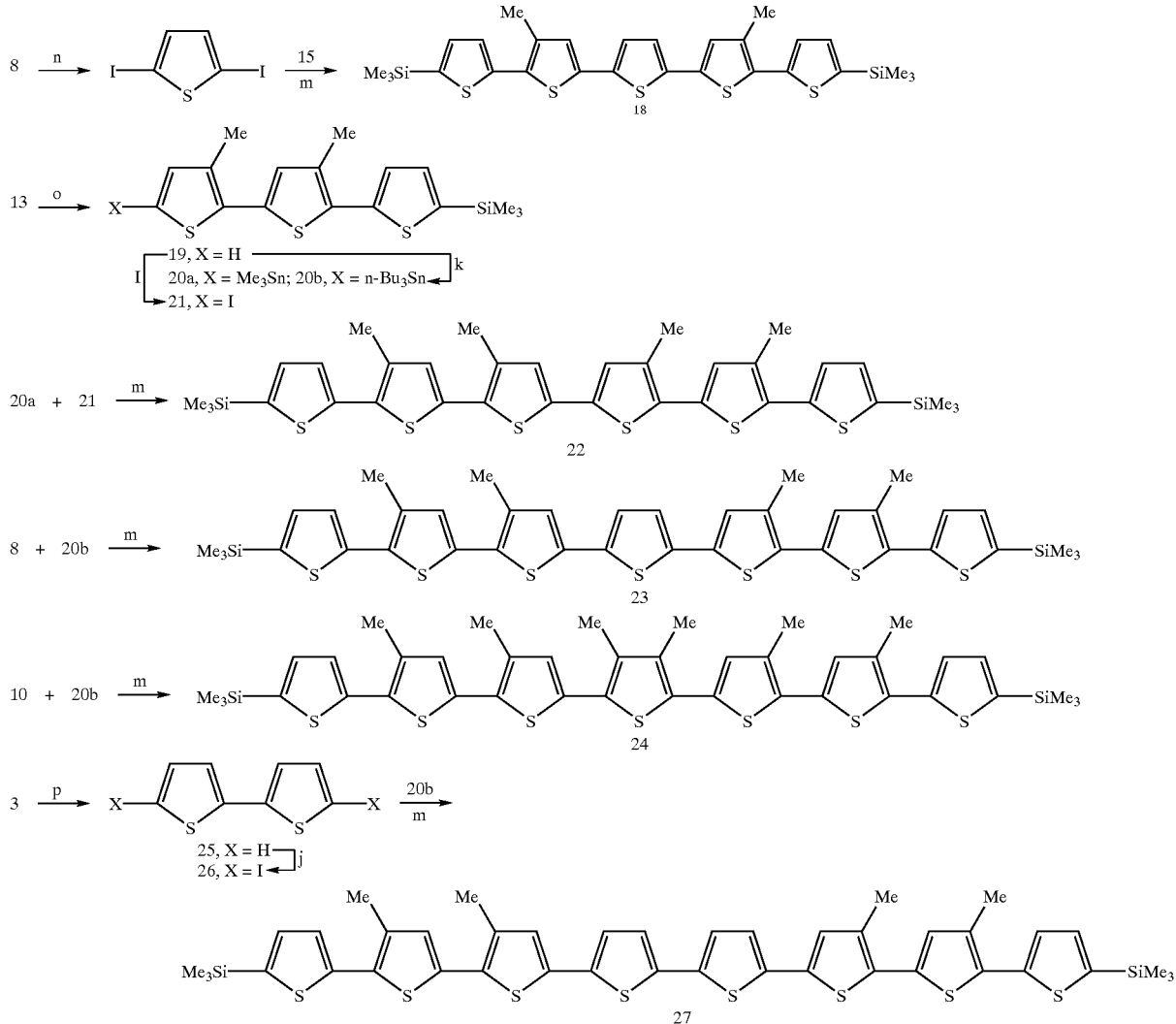

In this process schema, the reagents are:
(a) n-BuLi, TMEDA[24]; TMSCl[25]
[24]This is a conventional abbreviation for N,N,N',N'-tetramethylethylenediamine.
[25]This is a conventional abbreviation for chlorotrimethylsilane.
(b) LDA[26]; TMSCl
[26]This is a conventional abbreviation for lithium diisopropylamide.
(c) n-BuLi; $I_2$
(d) Mg; 5, $Cl_2Ni(dppp^{27})$
[27]This is a conventional abbreviation for diphenylphosphinopropane.
(e) t-BuLi; B(O-i-Pr)3; $H_3O+$
(f) $Pd(PPh_3)_4$, $Na_2CO_3$, $H_2O$
(g) $Br_2$
(h) n-BuLi; $H_2O$
(i) MeMgBr, $Cl_2Ni$ (dppp)
(j) HgO, $I_2$
(k) LDA; $R_3SnCl^{28}$
[28]The radical R can be, for example, $CH_3$ or $n-C_4H_9$.
(l) LDA; $I_2$
(m) $Pd(PPh_3)_4$, toluene
(n) t-BuLi; $I_2$
(o) Mg; 16, $Cl_2Ni(dppp)$
(p) Mg; 3, $Cl_2Ni(dppp)$.

In the presently preferred embodiment, thiophene units are the optimal organic subunits for controlled oligomer growth. This is because (1) oligo- or poly-thiophenes exhibit conductivities, in the bulk, of 100–200 $\Omega^{-1}cm^{-1}$, (2) The oligomers are air and light stable and they can be handled with no exotic precautions, (3) the alkyl groups afford materials that are freely soluble in organic solvents with no loss in the conductivities due to distortions in planarity of the contiguous p-backbone, and (4) thiophene units can be readily deprotonated using bases like LDA or butyllithium; hence, end group functionalization can be easily accomplished.

Scheme I shows how trimethylsilyl groups have been demonstrated in use to cap the ends of thiophene oligomers. The trimethylsilyl groups allowed control of the oligomer growth at each stage in the synthesis, and may provide a handle for future chemoselective modifications.[29]
[29]See T. H. Chan and I. Fleming, SYNTHESIS 1979, 761, which is hereby incorporated by reference.

The synthesis of thiophene-ethynylene systems is expected to allow the rapid chain growth of conjugated oligomers (molecular wires). Simply, monomer will be converted to dimer, dimer to tetramer, tetramer to octamer, octamer to 16-mer, 16-mer to 32-mer, etc. In this way, there would be a rapid growth of the molecular chains. The synthetic route with the progress to date is shown in Scheme II.

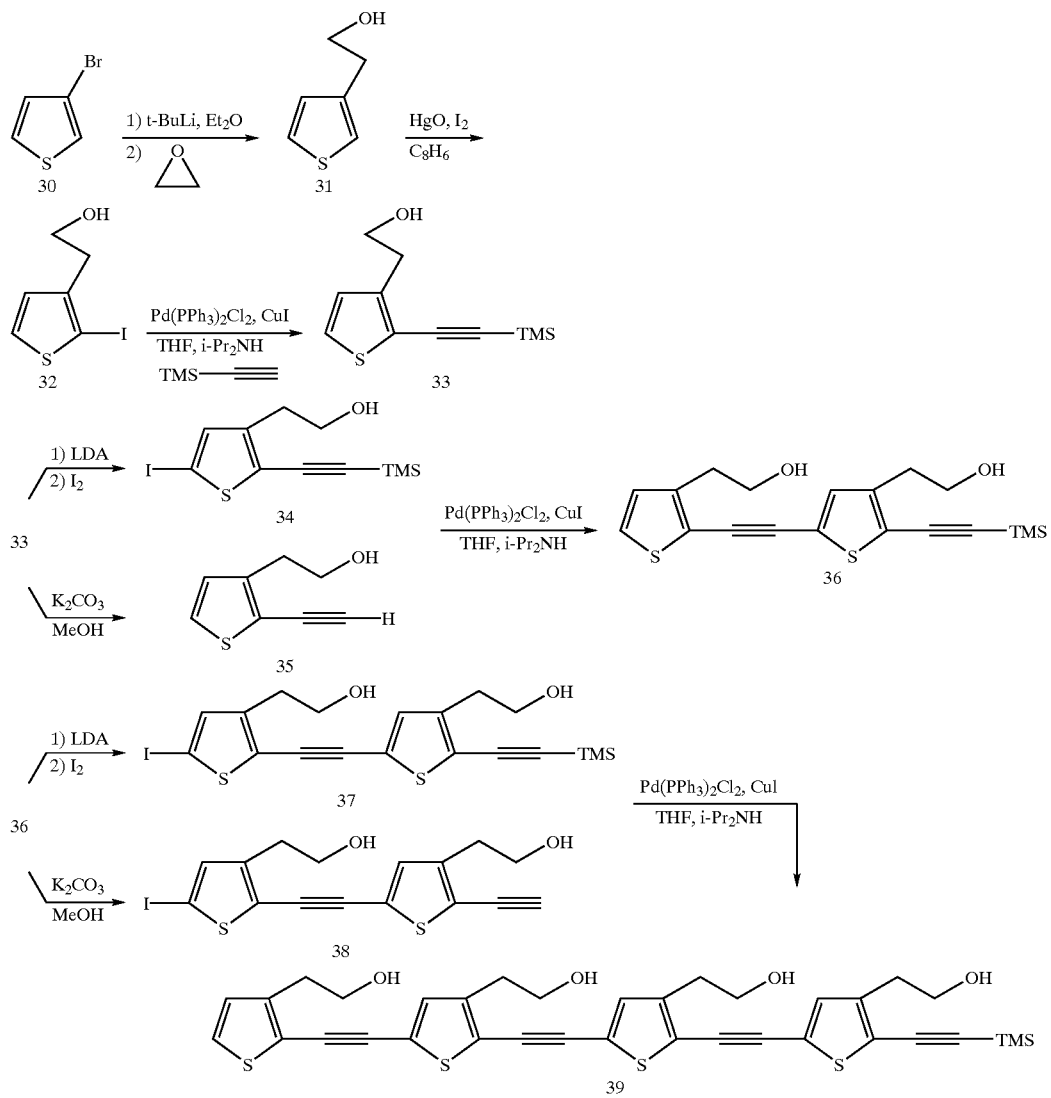

We have presently completed the synthesis of the tetramer 39. Notice that the monomer 33 was converted to the activated systems 34 and 35, and then coupled to form the dimer 36. Analogously, the dimer 36 was activated to 37 and 38, and then coupled to form the tetramer 39. We hope to continue this approach to rapidly grow the molecular wires with doubling length at each consecutive coupling. Note that each coupling step utilized only a catalytic amount of palladium and copper and excesses of base were used to satisfy the hydroxyl deprotonation as well as the thiophene deprotonations. The next coupling will provide the octamer, followed by the 16-mer, etc. However, if one wanted a chain of 24-mer in length, coupling of a 16-mer with an octamer could analogously be accomplished. The hydroxyl functionalities provide a handle for simple purification; however, if desired, they could easily be blocked (protected as the TBDMS ether) to prevent possible bonding to the lithographic surface. Hence, we have rapidly constructed molecular wires and we have demonstrated a method to extend molecular chain length rapidly and efficiently. Thus, we have demonstrated that, from the synthetic standpoint, thiophene-based chains are the optimal chains to use for molecular wire synthesis. Moreover, Scheme II outlined a method to rapidly build molecular chains so that successive monomer utilization is not necessary.

There are two initial synthesis objectives: Functionalize "alligator clip" termini for adhesion of a single molecular chain to nanolithographic probes. The beauty of the thiophene and ethynylene methodology becomes immediately apparent. Thiophenes and alkynes can be easily deprotonated with strong lithium bases such as LDA or alkyllithiums. Thus an organolithium can be obtained. Since lithium is at the top of the electropositivity scale, we can transmetalate to almost all other metals, or react with almost any electrophile.[30] For example, a thiophene end group can be lithiated and converted to a (1) thiol for adhesion to Au surface, (2) diarylphosphine for adhesion to Pd surfaces, (3) carboxylated for adhesion to oxide surfaces, (4) transmetalated and cross-coupled to bipyridyls for adhesion to Fe, etc. (see Scheme III below). Note that the same thing could be done for the alkyne terminated ends. Moreover, through nickel and palladium-catalyzed cross-couplings, these units could be introduced at the outset of the synthetic sequence, or at the last step. The introduction of these units at the last step would certainly prove to be more advantageous since simple modification to an existing chain would permit the affixing of a variety of end functionalities. Moreover, the ends of the chains in the thiophene-ethynylene systems (i.e. structure 39 in Scheme I) allow selective differentiation of the two ends. In this way, we could have, for example, one thiol cap and one phosphine cap. Deactivation of the palladium catalyst by the thiol would be avoided by protection of the thiol as the t-butylthioether followed by Hg(OAc)$_2$ removal at the final stage.[31]

[30]See B. J. Wakefield, ORGANOLITHIUM REAGENTS (1988), which is hereby incorporated by reference.
[31]See Callahan et al., "The Tertiary Butyl Group as a Blocking Agent for Hydroxyl, Sulfhydryl and Amido Functions in Peptide Synthesis," 85 J. AM. CHEM. SOC. 201(1963); Nishimura et al., "New Method for Removing the S-p-Methoxybenzyl and St-Butyl Groups of Cysteine Residues with Mercuric Trifluoroacetate," 26 CHEM. PHARM. BULL. 1576 (1978); both of which are hereby incorporated by reference.

Scheme III shows the planned process to extend the molecular chains to at least 100 Å in length.

Modeling will speed identification of the candidate organics that are stable, solution synthetic, conjugatable with selective attachment ends and barriers, have acceptable conductivity and mechanical strength, and attach strongly to particular metal groups with good ohmic contact. These are not necessarily compatible or automatic requirements. It should be stressed that complex device structures cannot be realized with "Edisonian" approaches, and that interactive modeling is key to realizing the goals of this program. Crucial to the success of spontaneously assembled molecular circuits is a detailed understanding of the electronic and mechanical (thermoelastic) properties of the polymers and junctions used as the fundamental assembly blocks of the design. A modeling effort to attack this problem decomposes into two phases; 1) construction of molecular wires and gluing pads, and 2) design of active gain elements. Modeling tools for detailing the orbital structure responsible for delocalization include:

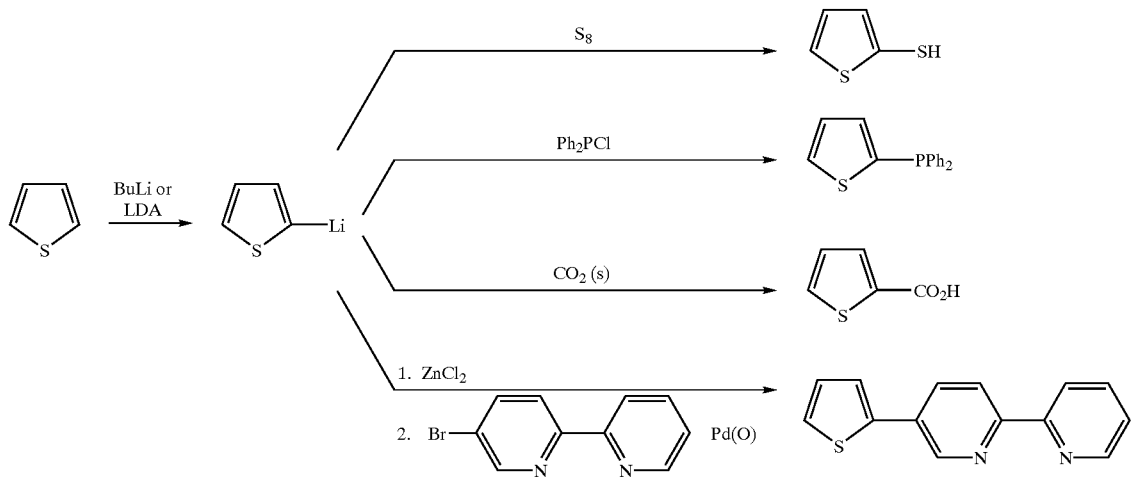

Several options are available for fabrication of sub-100 Å contact probe spacing. For monotype contacts, STM lithography, etching, or diamond-AFM tip[32] scribing of a ~50 Å gap in a metal wire 100–200 Å wide is possible. Sub-100 Å polytype metal contacts, for a selective attachment polarity (i.e., Au and Pt) is possible by a combination of step-edge and angle evaporation techniques. Alternatively, chain extension of the conjugated oligomers, similar to the process outlined in Schemes I and II will be used to continue the chain length extensions. We use a combination of palladium and nickel-catalyzed cross-coupling reactions and palladium-copper-catalyzed Sonogashira couplings. These are the most advanced and highest yielding carbon—carbon couplings for the required synthesis.[33] The extension to 100 Å is achievable from the nanofabrication standpoint, and is desirable for variable length connectivity considerations.

[32]This technique is preferably performed with modified instruments from Park Scientific Instruments.
[33]See Stille, "The Palladium-Catalyzed Cross-Coupling Reactions of Organotin Reagents with Organic Electrophiles", 25 ANGEW. CHEM. INT. ED. ENGL. 508 (1986); Stille, "Palladium Catalyzed Coupling of Organotim Reagents with Organic Electrophiles," 57 PURE & APPL. CHEM. 1771 (1985); Sonogashira et al., "A Convenient Synthesis of Acetylenes: Catalytic Substitutions of Acetylenic Hydrogen with Bromoalkenes, Iodoarenes, and Bromopyridines", 50 TETRAHEDRON LETT. 4467 (1975); Stephans et al., "The Substitution of Aryl iodides with Cuprous Acetylides: A Synthesis of Tolanes and Heterocyclics," 28 J. ORG. CHEM. 3313 (1963); Suffert et al., "Towards Molecular Electronics: A New Family of Aromatic Polyimine Chelates Substituted with Alkyne Groups", 32 TETRAHEDRON LETT. 757 (1991); all of which are hereby incorporated by reference.

Hartree-Fock methods, which give the most accurate results, but are limited to approximately 70 atoms (on a Cray Y class machine or a Connection Machine-2).

MNDO (modified neglect of differential overlap) techniques, which can easily deal with the wavefunctions or orbital structure of approximately 250 atoms on sophisticated scientific workstations.

Extended Hückel methods, which can calculate orbital structure of ten thousand atoms, but are sufficiently semi-empirical that they are considered unreliable for complex delocalization calculations.

The strategy will be to use MNDO methods to quickly identify candidates, cross-checking with detailed Hartree-Fock simulations to insure that the MNDO methods have given accurate results. The first objective is to find and analyze suitable conducting oligomers (monomers), examining delocalization as a function of unit size and the binding energy of these oligomers to each other. This will build a catalog of conductive chains which the experimentalists can interactively design with, and have appropriate conductivity and stability. The second objective is to examine the end group problem and the interaction of end groups with various metals, for selectivity and binding strength, satisfying conductivity and stability constraints (the functionalization of endgroups onto such short chains will alter the orbital behavior of the chain-endgroup complex, as well as when the endgroup is attached to the metal). An attractive flexibility of the fabrication approach is that the functionalized end group need not be restricted to just metal attachment.

Attachment of selective molecules to various semiconductors (and oxides) has been demonstrated. For example, one could fabricate an alignment substrate that is the combination of heterostructures and metallic contacts (perhaps with appropriate vias in an overlayer) for very general structures. This capability, as well as the ability to deposit the selective attachment oligomers from solution, and possible CVD deposition of some critical steps (as in the to be described organic quantum dot work), gives the fabricator tremendous flexibility.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Note that self-aligned deposition from solution of contacts from oligomer ends can be targeted to selectively to semiconductor contact areas, as well as to metal pads.

The conductive oligomers do not have to thiophene or thiophene derivatives. Alternative conductive oligomers can be used if they provide adequate conductivity and stability. In particular, it is contemplated that doncutive oligomers with a ladder structure may be advantageous for some applications.

Note that the conductive oligomers, and the charge-transfer structures, do not necessarily have to be organic compounds, although the vast experience base of organic chemistry simplifies the fabrication detailed above.

Note that the ultimate local environment of the conductive polymers does not strictly have to be dry, as in the presently preferred embodiment. Alternatively, the molecular electronic material can be allowed to reside in a solvent environment. This is preferably a nonpolar solvent, but could alternatively be aqueous or another polar solvent.

As will be recognized by those skilled in the art, the innovative concepts described in the present application can be modified and varied over a tremendous range of applications, and accordingly the scope of patented subject matter is not limited by any of the specific exemplary teachings given.

Appendix A

Iterative Divergent/Convergent Doubling Approach to Linear Conjugated Oligomers. A Rapid Route to a 128 Å Long Potential Molecular Wire and Molecular Alligator Clips Jeffry S. Schumm, LeRoy Jones II, Darren L. Pearson, Ryuichiro Hara and James M. Tour*

The ultimate computational system would consist of logic devices that are ultra dense, ultra fast, and molecular-sized.[1] Even though state-of-the-art nanopatterning techniques allow lithographic probe assemblies to be engineered down to the 100 Å gap regime,[2] the issue of electronic conduction based upon single or small packets of molecules has not been addressed and the feasibility of molecular electronics remains theoretically controversial.[1,3] In an attempt to assess the possibility of molecular wire[4] conduction by spanning the 100 Å probe gaps with small packets of molecules, we describe here the synthesis of phenylene-alkynylene oligomers that remain in a near-linear conformation due to 1,4-phenylene-substitution patterns and alkyne linearity. This linear arrangement should minimize undesired conformational movement during adhesion and testing between nanofabricated probes. Our approach to such a molecular framework involves a rapid iterative method that doubles molecular length at each iteration[5] to provide an air and light-stable linear conjugated oligomer that is 128 Å long that could also serve as a useful model for understanding bulk polymeric material properties.[4i,j,6] Moreover, the product could easily permit independent functionalization of the ends to serve as "molecular alligator clips" that might be required for surface contacts to metal probes for molecular electronics studies.[7]

We recently described the synthesis of a thiophene-ethynylene oligomer by an iterative divergent/convergent approach. In its extended zig-zag form, it was 100 Å

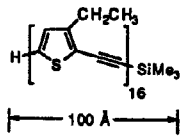

long.[8] Thus the linear system described here is complementary. The synthesis of the ethyl-containing monomer 1 is shown in eqs 1 and 2. The iterative
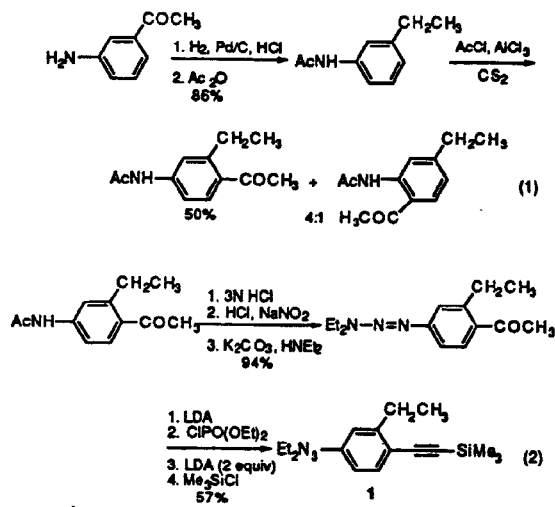
divergent/convergent approach to molecular length doubling is shown in Scheme I. Notice how just three

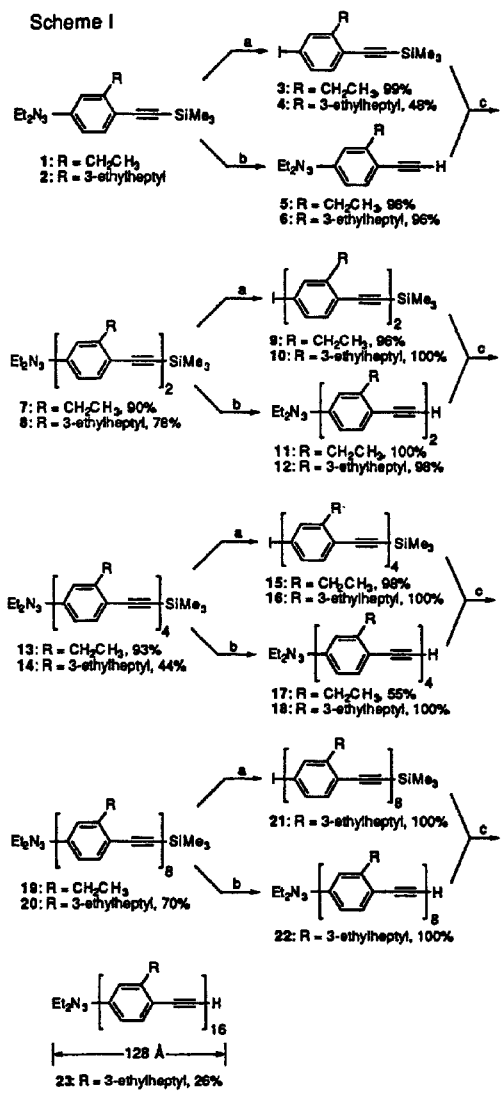

different reactions are needed at each stage to double the molecular length.[5c,d,9] We initially conducted the synthesis starting from monomer 1 with the notion that the ethyl group would provide sufficient solubility to permit formation of a 16-mer that has a length sufficiently long to bridge between lithographically-derived probe gaps. Unfortunately, the octamer 19 was nearly insoluble. Therefore, we were only able to obtain a UV-visible spectrum and a direct exposure mass spectrum (MS) (Table 1).

In an effort to insure the solubility of the linear rigid rod oligomer through to the 16-mer, we prepared monomer 2 as shown in Scheme II.[10] In addition to

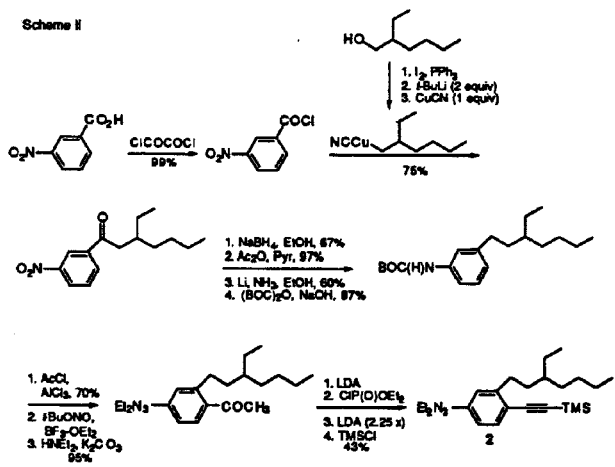

possessing a longer alkyl chain than 1, 2 also has a stereogenic center which, upon successive dimerization, will afford numerous diastereomers that will retard crystallization and thereby increase the likelihood of solubility. Indeed, we were delighted to discover that both the octamer 20 as well as the 16-mer 23 (Scheme I) were quite soluble and they could both be adequately spectroscopically characterizated. While 1, 2, 7, 8, 13, 14, and 19 were characterized by direct exposure via electron impact MS, in order to obtain MS data on 20 and 23, it was necessary to use matrix assisted laser desorption/ionization (MALDI) MS (Table 1). 23 was 128 Å long as determined by a conformational minimization using MMX with extended π-Hückel and multiconformational parameters.

With the phenylene-ethynylene and thiophene-ethynylene oligomers now in hand, we have begun to synthesize and attach end groups that could serve as "molecular-sized alligator clips". The thioacetates, upon

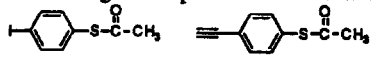

hydrolysis, will form thiols. The thiols form gold-thiolates on exposure to gold surfaces.[7] We have also synthesized arylformamides which, after coupling to the oligomers, can be converted to isonitriles with $PPh_3$, $CCl_4$, $CHCl_3$, and $NEt_3$. These can serve as good adhesion units to tungsten surfaces. We hope to use self-assembly methods to affix single or small packets of molecules between nanolithographically-derived probes or two STM tips.

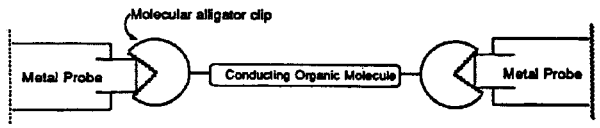

Table 1. Characterization Data.
19: Direct exposure MS statistical isotopic range calculated for $C_{87}H_{83}N_3Si$: 1198 (95%), 1199 (100%), 1200 (55%). Found: 1098.6 (signifying loss of the triazene moiety at 100 amu). $\lambda_{max}$ ($CH_2Cl_2$) = 364 nm. UV 10% edge value = 500 nm.
20: IR (neat) 2952, 2198, 2147, 1464, 827 cm$^{-1}$. $^1$H NMR (300 MHz, CDCl$_3$) δ 7.48 - 7.27 (m, 24 H), 3.77 (q, J = 7.1 Hz, 4 H), 2.98 - 2.63 (m, 16 H), 1.84 - 1.58 (m, 8 H), 1.58 - 1.10 (m, 86 H), 1.10 - 0.78 (m, 48 H), 0.27 (9 H). $\lambda_{max}$ ($CH_2Cl_2$) = 376. UV 10% edge value = 422 nm. $M_n$ = 2800, $M_w$ = 2960, $M_w/M_n$ = 1.05. MALDI MS (sinapinic acid matrix, positive ion mode) average molecular weight calculated for $C_{143}H_{195}N_3Si$: 1984. Found peak maximum (M + 1): 1791±9 (large error due to broad signal), (loss of -SiMe$_3$ at 73 amu, -N$_3$Et$_2$ at 100 amu, -C≡C at 24 amu which a common phenyl-alkynyl cleavage route).[11]
23: IR (neat) 2956, 2927, 2360, 2340, 1506, 1458 cm$^{-1}$. $^1$H NMR (300 MHz, CDCl$_3$) δ 7.47 - 7.24 (m, 48 H), 3.77 (q, J = 7.1 Hz, 4

H), 2.95 - 2.65 (m, 32 H), 1.82 - 1.58 (m, 16 H), 1.58 - 1.10 (m, 166 H), 1.10 - 0.70 (m, 96 H), 0.26 (s, 9 H). $\lambda_{max}$ ($CH_2Cl_2$) = 376 nm. UV 10% edge value = 422 nm. $M_n$ = 6649, $M_w$ = 7114, $M_w/M_n$ = 1.07. MALDI MS (sinapinic acid matrix, positive ion mode) average molecular weight calculated for 23 with $C_{279}H_{371}N_3Si$: 3795. Found (M + 1): 3486±14 (large error due to broad signal), (signifying loss in the MS of the $-SiMe_3$ at 73 amu, $-N_3Et_2$ at 100 amu, $-C\equiv C$ at 24 amu which a common phenyl-alkynyl cleavage route, and a $-C_8H_{17}$ fragment at 113 amu which represents a typical benzylic methylene-ethylene cleavage site.)[11]

Acknowledgments. We are thankful for support from the Office of Naval Research and the Advanced Research Projects Agency. We also thank Molecular Design Ltd. for the use of their synthetic data base.

References and Notes

[1] (a) *Molecular Electronics: Science and Technology*, A. Aviram, Ed.; Confer. Proc. No. 262, American Institute of Physics: New York, 1992. (b) J. S. Miller, *Adv. Mater.* 1990, *2*, 378. (c) D. H. Waldeck, D. N. Beratan, *Science* 1993, *261*, 576. (d) J. Guay, A. Diaz, R. Wu, J. M. Tour, *J. Am. Chem. Soc.* 1993, *115*, 1869.

[2] (a) M. A. Reed, Yale University, personal communication, 1993. (b) *Nanostructures and Mesoscopic Systems*, W. P. Kirk, M. A. Reed, Eds.; Academic: San Diego, 1992.

[3] (a) J. S. Miller, *Adv. Mater.* 1990, *2*, 495, 601.

[4] For a presentation of some foundational work in the area of potential molecular wires, see: (a) P. W. Kenny, L. L. Miller, *J. Chem. Soc., Chem. Commun.* 1988, 85. (b) F. Wudl, S. P. Bitler, *J. Am. Chem. Soc.* 1986, *108*, 4685.

[5] An iterative doubling approach was first described by Whiting and then later used by Moore to prepare oligo(1,3-phenylene-ethynylenes). See: (a) E. Igner, O. I. Paynter, D. J. Simmonds, M. C. Whiting, *J. Chem. Soc., Perkin Trans. 1*, 1987, 2447. (b) I. Bidd, D. J. Kelly, P. M. Ottley, O. I. Paynter, D. J. Simmonds, M. C. Whiting, *J. Chem. Soc., Perkin Trans. 1*, 1983, 1369. (c) J. Zhang, J. S. Moore, Z. Xu, R. A. Aguirre, *J. Am. Chem. Soc.* 1992, *114*, 2273. (d) Z. Xu, J. S. Moore, *Angew. Chem. Int. Ed. Engl.* 1993, *32*, 1354.

[6] (a) J. Guay, A. Diaz, R. Wu, J. M. Tour, L. H. Dao, *Chem. Mater.* 1992, *4*, 254. (b) J. M. Tour, R. Wu, *Macromolecules* 1992, *25*, 1901. (c) J. Guay, P. Kasai, A. Diaz, R. Wu, J. M. Tour, L. H. Dao, *Chem. Mater.* 1992, *4*, 1097. (d) *Handbook of Conducting Polymers*; T. A. Skotheim, Ed.; Dekker: New York, 1986.

[7] (a) N. L. Abbott, J. P. Folkers, G. M. Whitesides, *Science* 1992, *257*, 1380. (b) D. H. Charych, M. D. Bednarski, *Mater. Res. Soc. Bull.* 1992, *17*(11), 61.

[8] D. L. Pearson, J. S. Schumm, L. Jones II, J. M. Tour, *Polym. Prepr. (Am. Chem. Soc., Div. Polym. Chem.)* 1994, *35*(1), 202.

[9] For the iodination procedure, see: (a) J. S. Moore, E. J. Weinstein, Z. Wu, *Tetrahedron Lett.* 1991, *32*, 2465. For the cross coupling procedure, see: (b) K. Sonogashira, Y. Tohda, N. Hagihara,

*Tetrahedron Lett.* 1975, 4467. (c) R. D. Stephens, C. E. Castro, *J. Org. Chem.* 1963, *28*, 3313. (d) J. Suffert, R. Ziessel, *Tetrahedron Lett.* 1991, *32*, 757.

[10] M. P. Doyle, W. J. Bryker, *J. Org. Chem.* 1979, *44*, 1572.

[11] F. W. McLafferty, F. Turecek, *Interpretation of Mass Spectra*, 4 Edition, University Science: Mill Valley, California, 1993.

Appendix B

Sent to J. Am. Chem. Soc. 14/04/94

UNDER REVIEW

Characterisation of the Conductivity of Organic Thiols by Field Emission Microscopy and Field Emission Spectroscopy

S. T. Purcell,[§*] N. Garcia,[‡] Vu Thien Binh,[§] L. Jones II,[†] and J. M. Tour[†]

*Contribution from Département de Physique des Matériaux, UA CNRS, Université Claude Bernard Lyon 1, 69622 Villeurbanne, France, Fisica de Sistemas Pequenos, Consejo Superior de Investigaciones Cientificas, Universidad Autonoma de Madrid, 28049 Spain and Department of Chemistry and Biochemistry, University of South Carolina, Columbia, South Carolina 29208.*

Abstract: The conducting properties of two organic thiols (5-mercapto-2,2'-bithiophene and 4-mercaptobiphenyl) deposited by the self-assembly method on Pt tips have been characterised in ultra high vacuum by field emission microscopy and spectroscopy. It was shown that these two molecular species can be successfully adsorbed from solution on the Pt tip. The presence of the molecules causes a large decrease in the required field emission voltages by a factor of ~3-5. Measurement of the total energy distributions of the emitted electrons showed that the electrons are emitted from a narrow band which is not pinned at the Fermi level but which shifts to lower energy with increased applied field. The molecules thus appear more like an insulator than a conductor. Significant current-induced heating of the molecules was found: for example $\Delta T \sim 80$ K for 0.3 nA. Taken together these properties pose problems for the use of these and similar one-dimensional molecules as current-carrying connections in proposed nanoscale electronic applications. However, when used in the sub-picoampere range, the current through the wire maybe sustainable and dissipation small. In general, these experiments open a door to exploring other molecules.

*Characterisation of the Co⬤ ·vity of Organic Thiols ...*  2

Introduction

One of the most important points for the construction of nanostructure-based devices is the finding of wires at the nanometer scale that can be assembled and connected for communication between the nanostructures. For this purpose one could envisage the possibility of connecting the structures by thin metallic wires (~1 nm diameter). However this will be a tremendously demanding task. A proposed alternative is to search for organic one-dimensional elongated molecules that can self-assemble and have enough conductivity to transfer electrons between the nanostructure devices[1].

A class of possible candidates for interconnection molecules are long-chain organosulfur compounds which form robust, ordered monolayer films on Au[2], particularly those compounds terminated with thiols[3,4]. These have been shown in extensive studies to adhere with a strong covalent bond between the sulfur head group and the Au surfaces when deposited in solution and to have their long axes oriented away from the substrate surface. These properties may make the self-assembling of these molecules as interconnections at prepared sites on the nanostructures possible. However, despite an intense research effort in this field, the important qualities of the conductivity and the dissipation of heat in the molecules are as yet unknown[1]. This is largely due to the experimental difficulty of attaching electrodes to the nanometric scale molecules. In this article we present studies by the field emission (FE) technique in ultra high vacuum of the conductivity and current-induced-heating of one-dimensional thiol molecules of ~10 Å length deposited on pre-prepared and characterised Pt field emitters. This method has the crucial advantage of eliminating the difficult connection of a second electrode to the molecule.

Experimental Section

*Preparation of Organic Thiols*

5-Mercapto-2,2'-bithiophene (defined as Thiol A - see fig. 1(a)) was prepared by the following sequence of reactions. (1) 2,2'-Bithiophene was converted to 5-bromo-2,2'-bithiophene with N-bromosuccinamide in a mixture of acetic acid and chloroform. (2) Lithium halogen exchange on 5-bromo-2,2'-bithiophene with *n*-butyllithium followed by

*Characterisation of the Conductivity of Organic Thiols ...* quenching with trimethylsilyl chloride afforded 5-trimethylsilyl-2,2'-bithiophene which was (3) treated with n-butyllithium then dimethyldisulfide to afford 5-thiomethyl-5'-trimethylsilyl-2,2'-bithiophene. (4) Treatment with sodium methyl thiolate in dimethyl propyl urea (DMPU) afforded the desired 5-mercapto-2,2'-bithiophene. All the intermediates as well as the final product were purified by flash chromatography on silica gel. The final product was >99% pure and it had the following spectral characteristics: $^1$H NMR (300 MHz, CDCl$_3$) δ 7.25 (dd, J = 5.0, 1.1 Hz, 1 H), 7.19 (dd, J = 3.6, 1.2 Hz, 1 H), 7.05 (ABq, J = 3.6 Hz, Δv = 6.6 Hz, 2 H), 7.00 (dd, 5.1, 3.6 Hz, 1 H), 2.14 (s, 1 H). The NMR was recorded in the presence of triethylamine to convert the conjugately added dimer to the monomer[5]. LRMS calculated for C$_8$H$_6$S$_3$: 198. Found: 198. The length of this molecular system is approximately 10 Å.

4-Mercaptobiphenyl (defined as Thiol B - see fig. 1(a)) was prepared according to the following synthetic sequence. (1) 4-Bromobiphenyl was treated with two equivalents of t-butyllithium and then with dimethyldisulfide to afford 4-(thiomethyl)biphenyl. (2) The 4-(thiomethyl)biphenyl was treated with sodium methyl thiolate in DMPU to provide the desired 4-mercaptobiphenyl. All the intermediates as well as the final product were purified by flash chromatography on silica gel. The final product was >99% pure and it had the following spectral characteristics: $^1$H NMR (300 MHz, CDCl$_3$) δ 7.53 (m, 5 H), 7.43 (m, 3 H), 7.33 (m, 2 H), 3.48 (s, 1 H). LRMS calc'd for C$_{12}$H$_{10}$S: 185. Found: 185. The length of this molecular system is approximately 10 Å.

*Experimental Set-up*

The conductivity properties were studied by using field emission[6] from the thiols deposited on Pt field emitters. Pt was used in place of the more common gold substrate because gold field emitters are very unstable even at room temperature. Pt has similar resistance to oxidation as Au and has been used successfully as a substrate for self-assembled layers of the aromatic molecules[7]. Pure polycrystalline Pt wire was first spot-welded on a W wire heating loop. Sharp Pt field emitters were produced by electrochemical etching in a CaCl$_2$-HCl solution. The tips were studied in a ultra-high vacuum (UHV) system (base

Figure 1B:
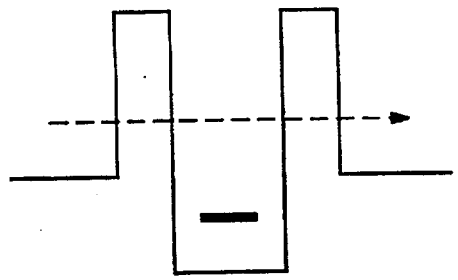
FIG. 1B shows the device of FIG. 1A in the off-state (after the potential of the base has been shifted).

*Characterisation of the Co[...] 'vity of Organic Thiols ...* pressure $5*10^{-11}$ Torr) equipped with a channelplate for imaging the field electron emission microscopy (FEM) and a modified commercial electron energy analyser with a nominal resolution of 10 meV placed behind a probe hole (see fig. 1(b)) for field emission electron spectroscopy (FEES). The electron energy analyser allows measurement of the total energy distributions[6] (TED's) of the emitted electrons. The tip mounting system allowed both mechanical and electrical deflection for immediate changing between FEM or FEES. The FE patterns were filmed by video camera. Freshly etched Pt tips were inserted in the UHV and were then cleaned by a combination of heating, ionic bombardment and field desorption until clean field emitter patterns were obtained. The I/V characteristics and FE patterns were recorded after final tip preparation. The general idea was to make quantitative measurements on the *in situ* prepared tips for initial conditions just before exposure to the organic molecules so that quantitative comparisons could be made.

*Deposition of the organic thiols*

The thiols were deposited in a $N_2$ environment on the cleaned and characterised Pt tips immediately after they were removed from the UHV. The deposition of the molecules was performed by immersing the Pt emitters in solutions of 7 mg of either of the thiols dissolved in 10 ml of dry dichloromethane for roughly 18 hours. The tips were lightly rinsed in the pure solvent after the deposition cycles. The tips were immediately re-introduced into the UHV after the rinsing. The vacuum system was only partially baked out after the re-introduction to avoid damaging the molecular films, but pressures of $(2-5)*10^{-10}$ Torr were obtained before starting the FEM/FEES studies. Five depositions were made in total: 3 of 5-mercapto-2,2'-bithiophene (defined as thiol A), 1 of 4-mercaptobiphenyl (defined as thiol B) and one control immersion in the pure solvent. The emission currents were very unstable at room temperature after exposure to the molecules and solvent. To improve the stability, all FEM and FEES measurements reported here were made at liquid-air temperatures (~80 K) with currents well under the nanoampere range. A schematic diagram depicting emission from the tip with the molecules is shown in Fig. 1(c).

*Characterisation of the Conductivity of Organic Thiols ...*

Results

The experimental results consist of three basic measurements:

- (1) the field emission patterns - These give information on the spatial distribution of the field emission areas with absolute resolution ~20Å (see ref. 6 for example).

- (2) the I/V characteristics - These allow analysis of the modification of the apparent tunneling barrier. They must be correlated with (3).

- (3) the measurement of the total energy distributions of the emitted electrons -The TED's of the emitted electrons[6] give details on the tunneling barrier, the energy of the emission with respect to the Fermi level and the local temperature at the emission region.

*Influence of the solvent*

To study the behaviour of the pure solvent on the FE, the same sequence of deposition was followed but without the organic thiols. In Fig. 2 we show photographs of field emission patterns and I/V characteristics of a Pt field emitter after UHV treatment and after immersion of the tip in the pure solvent. The pattern of the clean tip and after exposure to the solvent shows the four-fold symmetry of the tip-ending (100) single crystal with the low work function (100) plane in the center. The pattern of the tip after exposure to the solvent consisted of many unstable bright spots. In fig. 2(c) the corresponding Fowler-Nordheim plots are given which show no appreciable differences in the overall FE behaviour.

*Influence of the organic thiols*

Figure 3:
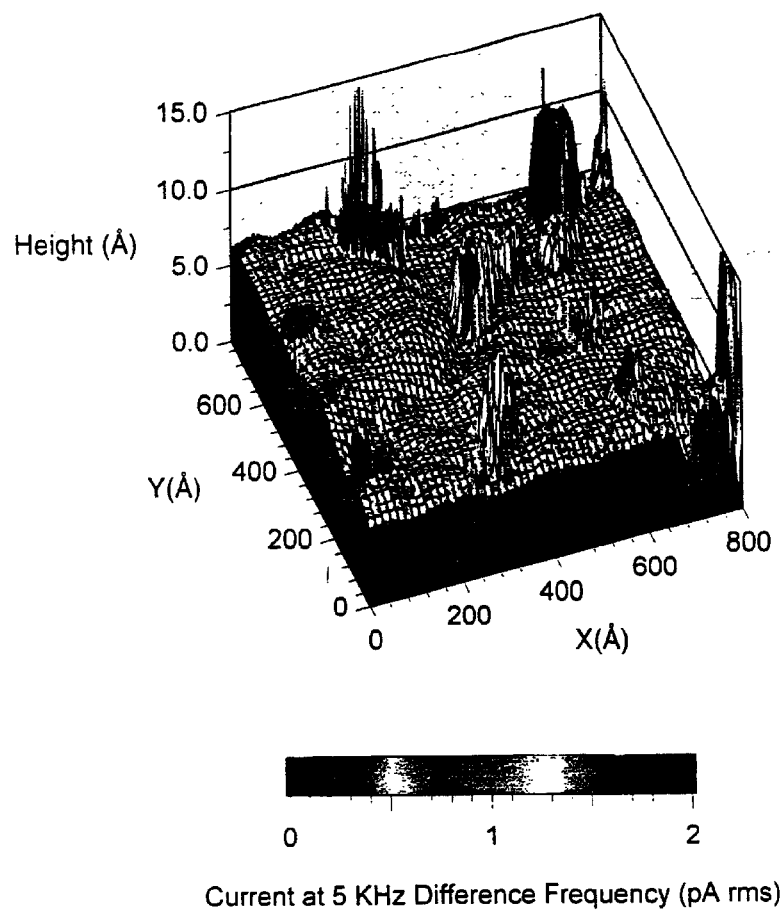

The field emission patterns and I/V characteristics after deposition of the thiol A and after deposition of thiol B are shown in figs. 3 and 4, respectively. In contrast to the above cases, the emission patterns from the tips after deposition of the organics showed emission from localised areas at voltages of 3-5 times lower than the initial Pt tips. The emissions were not obviously related to the crystal symmetry of the apex. More areas of emission at somewhat higher voltages can be seen by over saturating the lowest emission areas (see photos in 3(a-b) and 4(a-b)). The emissions were relatively more stable than in the case of the pure solvent and the features tended to be broader or less punctual, indicative of emission from a more continuous layer rather than very localised sites. Similar emission properties were found for all four depositions of the organic molecules. These results establish that successful deposition of the organic thiols on the Pt tips was achieved. The main result from FE was that the presence of the thiols caused a very large reduction of the effective tunneling barrier. This large reduction for the molecules is difficult to quantify at this time because of the gross uncertainties of the work function and the electric field at the vacuum side of the molecule. However two factors that reduce the barrier are (1) the reduction of the physical length of the tunneling barrier by the molecule and (2) the field will tend to be enhanced at the molecules due to their reduced size and protruding geometry[8].

TED's of the emitted electrons[6] for a clean Pt tip at two voltages is shown in Fig. 5(a). As is generally the case for metal emitters, the spectra consists of a single peak pinned at the Fermi energy ($E_F$) reflecting a continuous distribution of the electron density until ($E_F$). The high energy side of the spectra is controlled by the temperature through the Fermi-Dirac distribution. The low energy side is controlled by the shape of the tunneling barrier which favours higher energy electrons. It widens with applied voltage because the increase in the slope of the tunneling barrier allows proportionally more electrons to be emitted from lower in the conduction band.

The TED's for the organic molecules show different, specific characteristics, an example of which is shown in Fig. 5(b) for thiol A. The TED shown consists of a single peak roughly 0.2 eV wide. This peak is not fixed at $E_F$, but shifts linearly with applied voltage. Also the peak shape does not change with applied voltage. As we discuss below this means that the electrons are emitted from a localised narrow band and not from a wide conduction band. The results were similar for thiol B. The positions of the peak and their shifting with field varied for the different bright emitting areas but their spectra almost always consisted of one peak whose extrapolated zero field value was above $E_F$. Similar results have been observed for the emission through various organic molecules adsorbed on W and Mo emitters in UHV[9] and more recently on high metallic protrusions formed on W field emitters[10].

During the measurements it was very apparent that currents even in the sub-nanoampere range considerably increased the instability of the emitted current. We interpret these instabilities as an increase in the temperature during FE. We have made a quantitative measurement of this in the case of Thiol A by measuring the effect of the current on the emission spectra. As for emission from a metal emitter, the slope of the high energy edge of the spectra decreases with increasing temperature. By fitting the spectra to the known function for field emission[6], the relative temperature change ΔT due to the field emission current at the emission area can be found[11]. In Fig. 6 we plot ΔT as a function of current. In this example ΔT is ~75 K with the base tip cooled to 80 K for only 0.3 nA current. Therefore, to have FE without heating effects, one has to go to sub-picoampere currents.

Discussion

The experiments have revealed two features that have a direct bearing on the conductivity of the molecules:

- (1) the FEES spectra showed that the emission comes from a narrow band which is not pinned at the Fermi level;
- (2) there were substantial heating effects in the molecules for very moderate currents.

Figure 7A:
FIGS. 7A, 7B, and 7C show a sequence of steps to produce self-aligned deposition from solution of selective contacts between oligomer ends and metal contact pads.
Figure 7B:
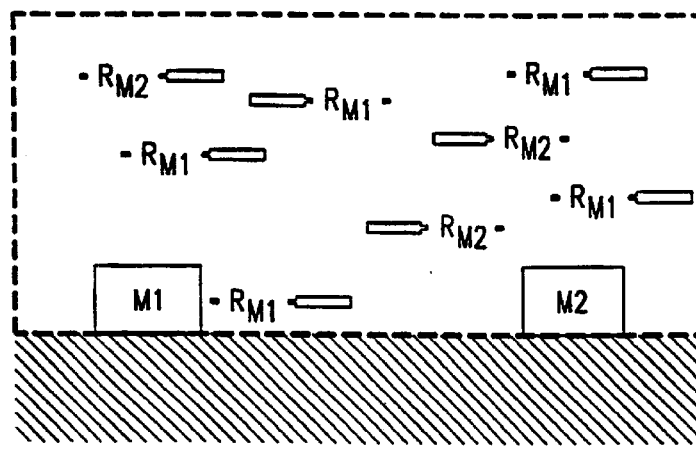

The emission through polyatomic molecules has been a subject of research in the field emission community in the past (see reference 9 for examples). Various models have been used to explain the results. The simplest is that the tunneling occurs through a double wall. Potential diagrams for emissions from a bare and molecule-covered metal tip are shown schematically in Fig. 7(a) and 7(b) respectively. For the bare tip the electrons pass through the tunneling barrier of ~15 Å directly from the Fermi sea. For the case of the molecules, the basic idea is that local electron levels will exist in the molecule due to it reduced dimension and that tunneling occurs mainly through or from these levels. The validity of this picture is supported by the narrowness of the peak and the independence of its shape on applied field. The shifting of the peak to lower energy with electric field is a consequence of the molecule not containing sufficient free electrons to provide complete electrical screening. This implies field penetration into the molecule, a signature of insulating behaviour. In the presented example the molecule blocks all direct tunneling from the Fermi sea of the Pt tip. Similar results were also found in earlier studies on polyatomic molecules[9], though the reduction in emission voltages and reduction of the emission at the Fermi level was generally less marked than for these relatively longer thiol molecules.

Conclusions

These field emission studies have demonstrated that the thiol molecules in contact with Pt surfaces do not pass electrons directly from the Fermi sea of the metal and that important temperature rises occur even for currents well under the nanoampere range. The molecules can be used as interconnecting wires without heating effects for currents in the sub-picoampere range. These points should be considered in the possible use of these molecules as interconnecting wires in proposed nanoscale electronics. Finally, the experiments on these particular molecular wires opens the door for continuing to study other wires that may have more free or extended electrons.

Acknowledgements. We acknowledge G. Whitesides and R. P Andres for discussions and for posing the study of this conductivity problem (see ref. 1). This work has the support of the European Community and French and Spanish agencies. The program of J.M. Tour is supported by the U.S. Advanced Research Projects Agency.

*Characterisation of the Conductivity of Organic Thiols ...*

Figure Captions

Fig. 1(a) Organic thiols used in the experiment. (b) Experimental set-up for the measurement of the electron energy distributions. Not shown are the mechanical and electrical deflections which allow selection of the emission zone that passes through the probe hole. (c) Schematic depiction of the field emission from a tip with adsorbed thiol molecules.

Fig. 2(a) Field emission patterns from (a) Pt (100) (1500 V) (b) Pt (100) after being immersed in the dichloromethane for 18 hours and then reinserted in the UHV (1400 V). (c) Fowler-Nordheim plots for the emission from the cleaned Pt (100) and after immersion in the solvent.

Fig. 3(a-b) Field emission patterns from a Pt (100) after deposition of Thiol A (400, 500 V). The voltages were increased from (a) to (b) to show that a relatively large area of the tip has been affected by exposure to the organics. (c) Fowler-Nordheim plots for the emission from the cleaned Pt (100) and after immersion in the Thiol A.

Fig. 4(a-c) Field emission patterns from a Pt (100) after deposition of Thiol B (550, 600 V). (c) Fowler-Nordheim plots for the emission from the cleaned Pt (100) and after immersion in Thiol B.

Fig. 5. Typical TED's for emission from (a) the initial Pt tip and (b) after the deposition of Thiol A on Pt. Inset: shift of the TED with applied electric field.

Fig. 6. An example of current-induced temperature increases during field emission from thiol A as measured from the high energy side of the TED's.

Figure 7C:
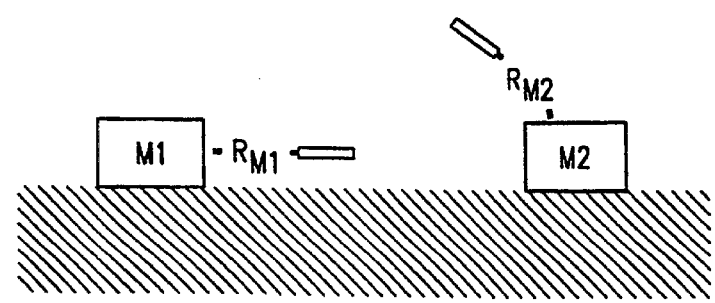
Figure 8A:
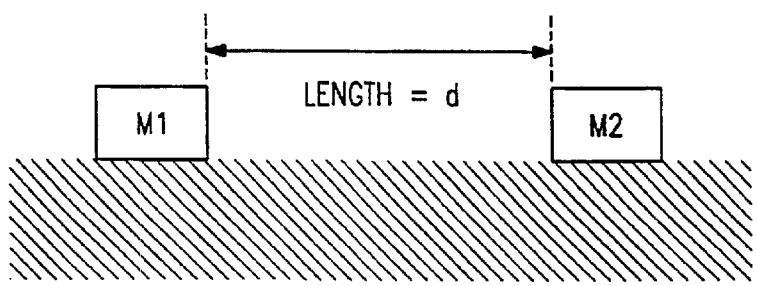
FIGS. 8A, 8B, and 8C show a sequence of steps to produce length-selective deposition from solution of only those conductive oligomers which have a predetermined length L.
Figure 8B:
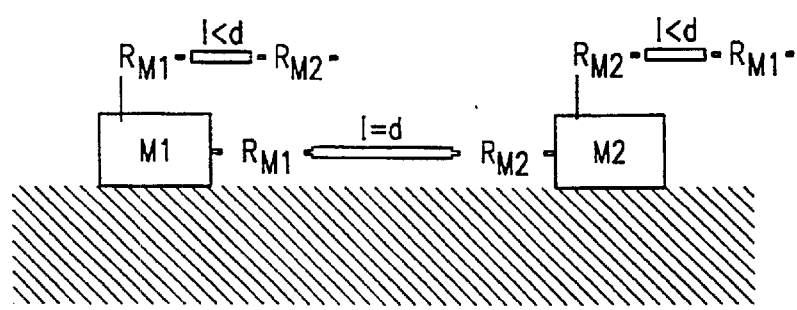
Figure 8C:
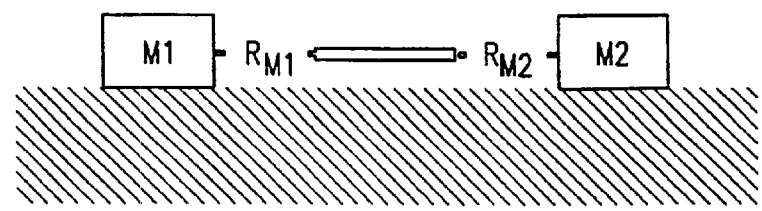
Figure 9:
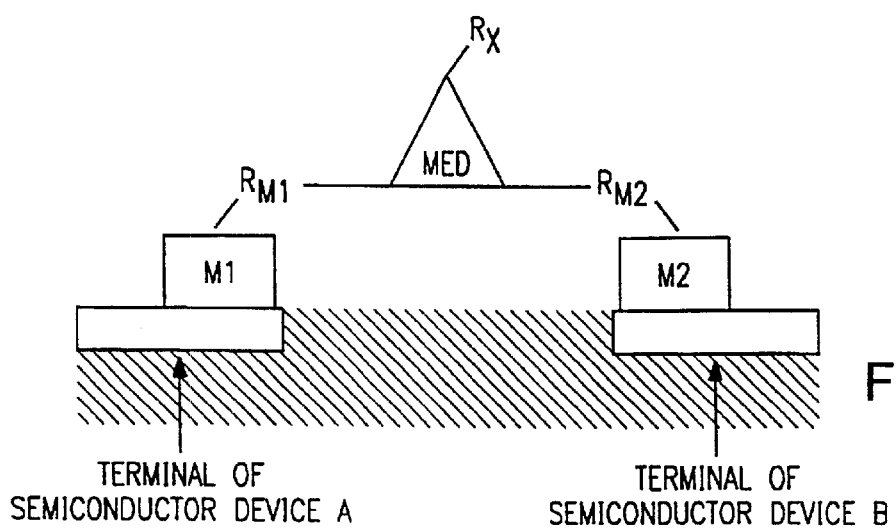
FIG. 9 shows how a molecular electronic active device is interconnected with semiconductor devices, using first and second metal contact pads M1 and M2.

Fig. 7. Schematic potential diagrams for field emission from (a) a metal emitter and (b) a metal emitter with an adsorbed species on its surface.

§Département de Physique des Matériaux
‡Universidad Autonoma de Madrid
†University of South Carolina (1) Workshop on Nanoscience: Transport in nanoscale structures. Everitt, H.O. editor, May 25-28, 1993 Seattle Washington, Sponsored by the U.S. Army Research Office. This booklet contains a discussion on properties and characterisation of molecular wires and clusters cooordinated by R. P. Andres, N. Garcia and G. Whitesides where the problem and necessity of finding one-dimensional organic conducting wires to connect nanostructures is discussed.

(2) Nuzzo, R.G.; Allara, D.L.; *J. Am. Chem. Phys.* 1983, *105*, 4481-83.

(3) Porter, M.D.; Bright,T.B.; Allara, D.L.; Chidsey, C.E.D. *J. Am. Chem. Soc.* 1987, *109*, 3359-68.

(4) Bain, C.D.; Troughton, E.B.; Tao, Y.-T.; Evall, J.; Whitesides, G.M.; Nuzzo, R.G. *J. Am. Chem. Soc.* 1989, *111*, 321-335 and references therein.

(5) Ponticello, G. S.; Habecker, C. N.; Varga, S. L.; Pitzenbeger, S. M. *J. Org. Chem.* 1989, *4*, 3223)

(6) see for examples see Gomer, R. *Field Emission and Field Ionization*, Harvard University Press, Cambridge, 1961 and Gadzuk, W. *Rev. Mod. Phys.* 1973, *45*, 487-548.

(7) Soriaga, M.P.; Hubbard, A..; T *J. Am. Chem. Soc.* 1982, *104*, 3937-3945 and references therein.

(8) Atlan, D., Gardet, G., Vu Thien Binh, Garcia, N., Saenz; J.J. *Ultramicroscopy* 1992, *42-44*, 154-162.

(9) Swanson, L.W.; Crouser, L.C. *Surf. Sci.* 1970, *23*, 1-29. Schutt,W.; Koster, H.; Zuther, G. *Surf. Sci.* 1974, *45*, 163-188.

(10) Vu Thien Binh; Purcell, S.T.; Garcia, N.; Doglioni, J. *Phys. Rev. Lett.* 1992, *69*, 2527-2530.

(11) Vu Thien Binh; Purcell, S.T.; Gardet, G.; Garcia, N. *Surf. Sci.* 1992, *279*, L197-201.

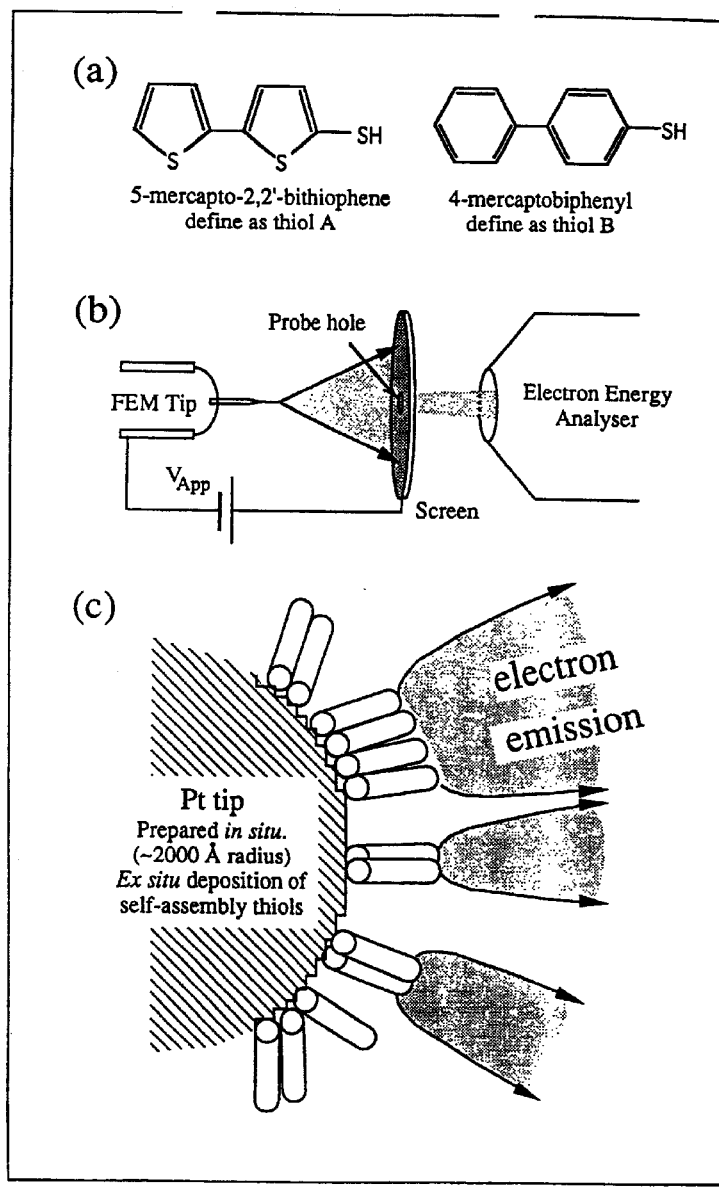

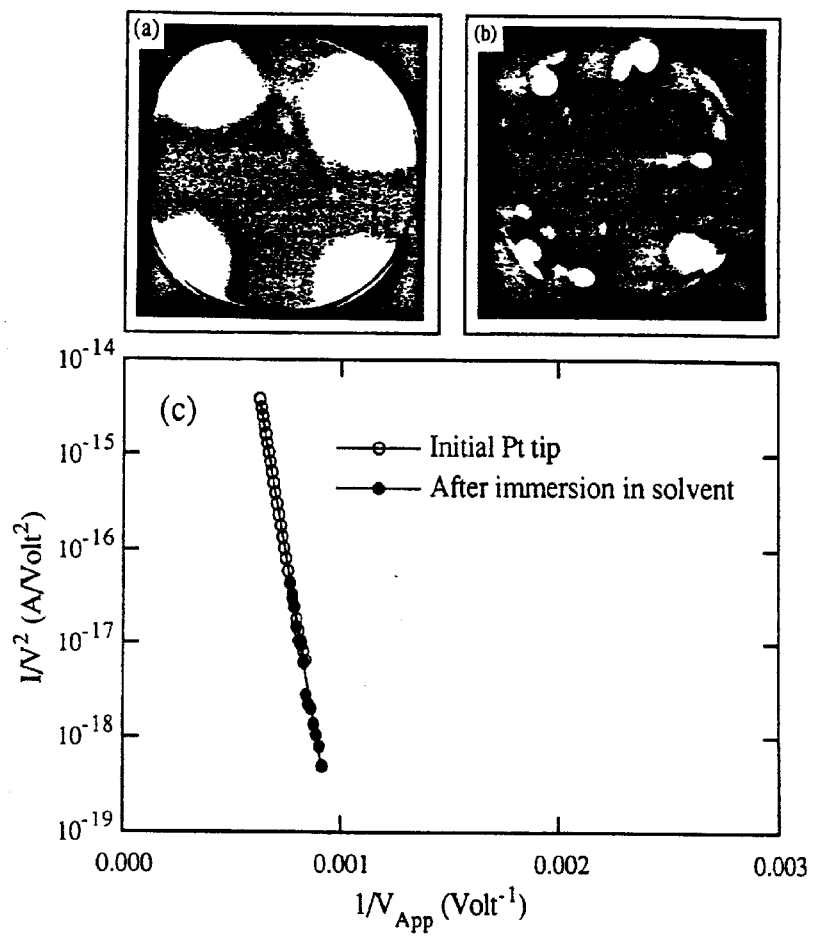

Current at 5 KHz Difference Frequency (pA rms)

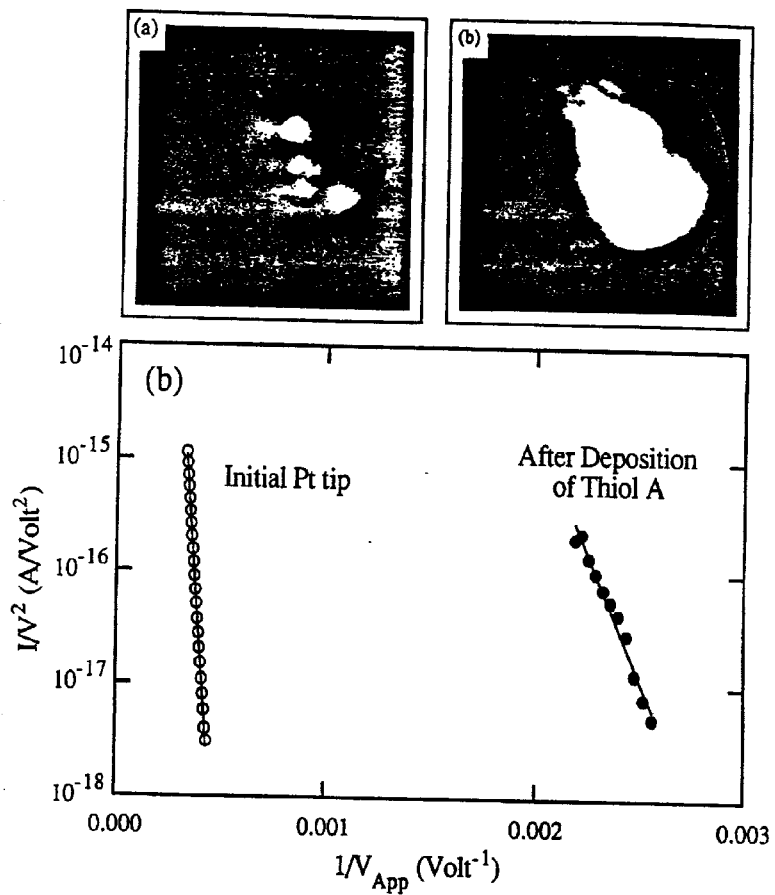

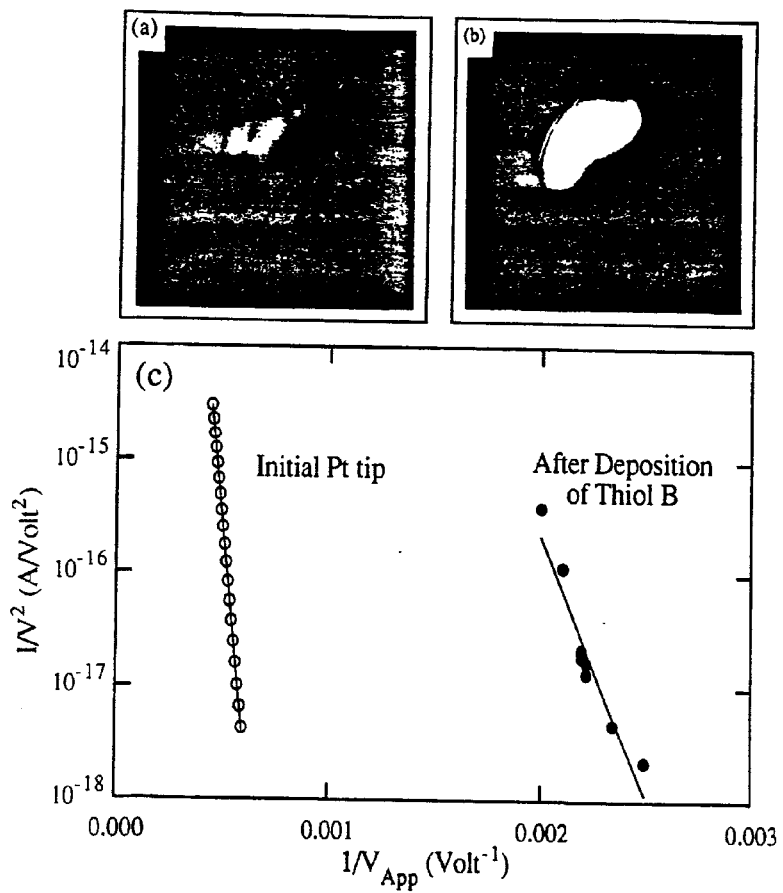

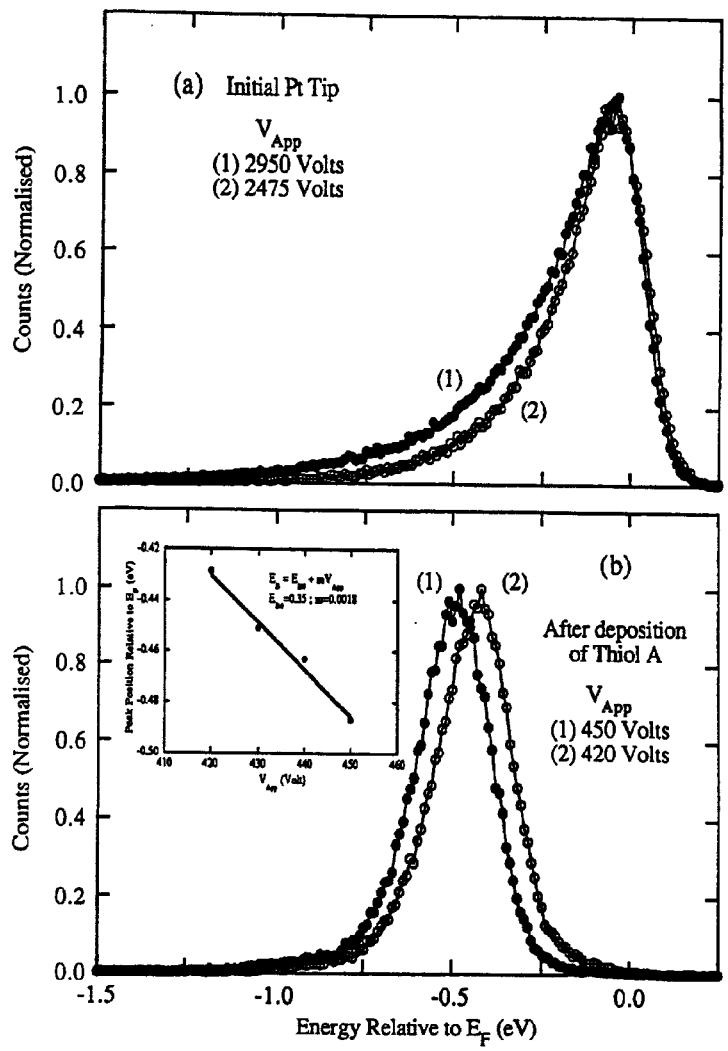

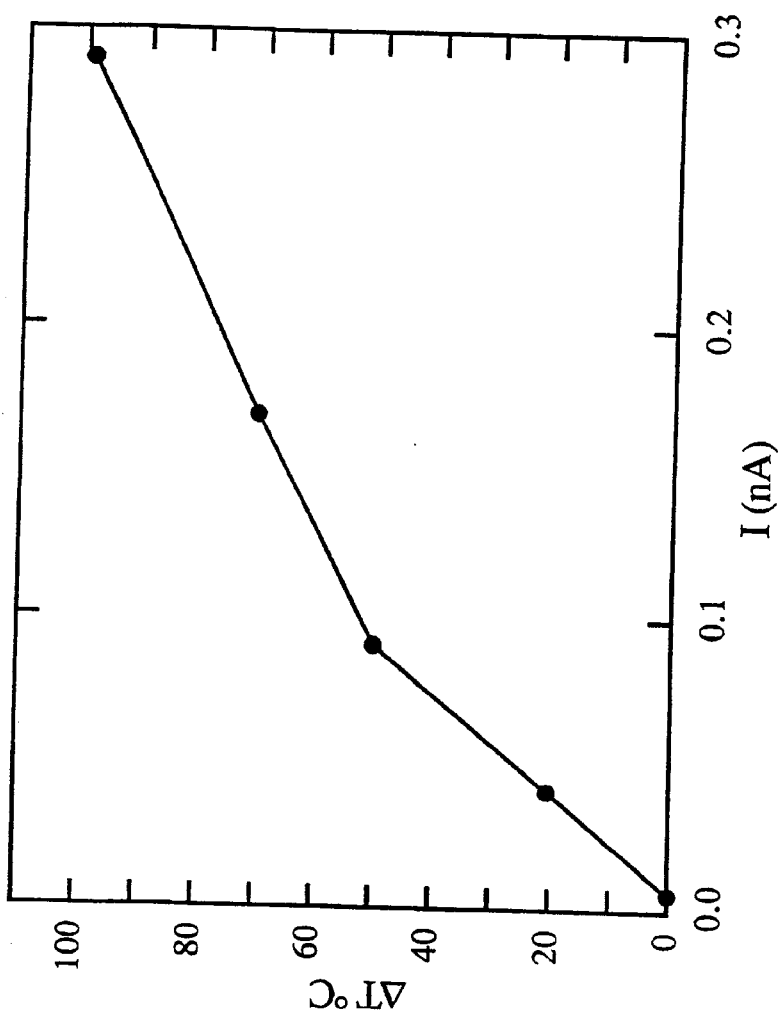

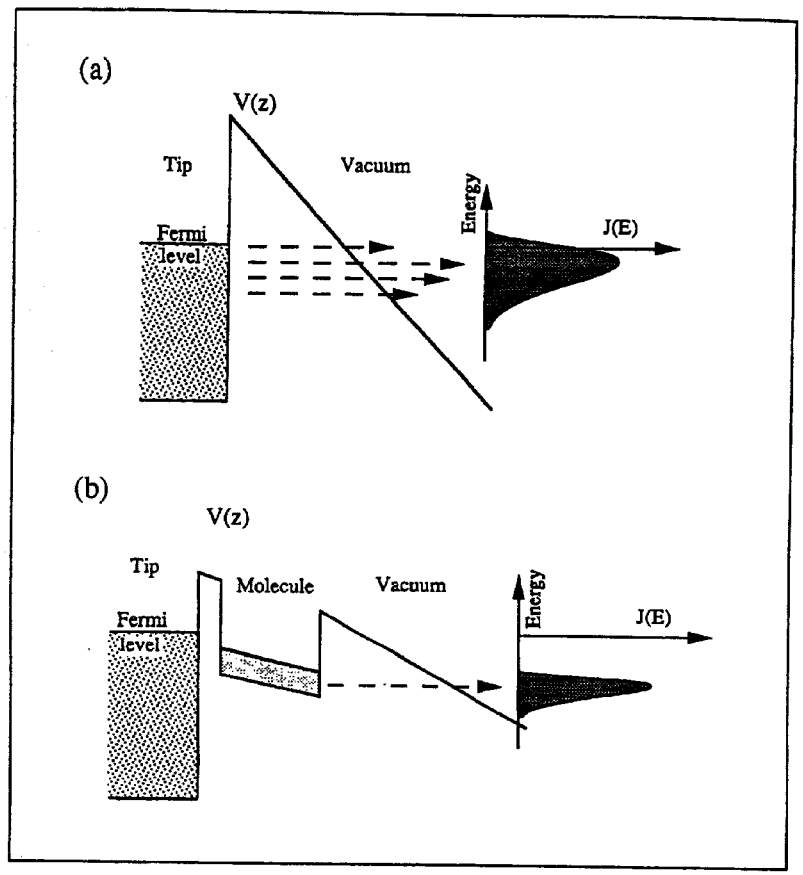

Appendix C

Polym Prepr (Am Chem Soc, Div Polym Chem)
1998 in press

Approaches to Bridged Planar Polypyridine, Polypyrazine, and Polythiophene Derivatives for Maximization of π-Conjugation Yonghui Zhang, Qing Zhang, Jaydeep J. S. Lamba and James M. Tour*
Department of Chemistry and Biochemistry
University of South Carolina
Columbia, South Carolina 29208

We have been directing synthetic efforts toward the construction of conjugated macromolecules that are fixed in a planar conformation.[1] The planar conformations should maximize the extended π-conjugation. Additionally, the bridging units, if sp²-hybridized, should further increase the extended π-conjugation of the macromolecular systems.[1,2] We previously described a synthetic route to planar poly(p-phenylene) derivatives by the retrosynthetic approach outlined in eq 1 (M = metal).[3] The actual synthetic components are shown in eq 2.

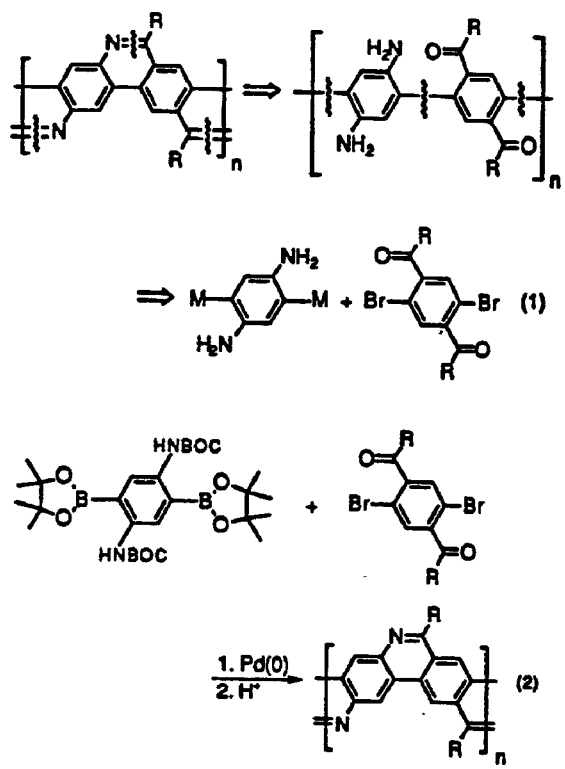
Here we describe our approach to the analogous planar polypyridine, polypyrazine, and polythiophene derivatives. The retrosynthetic approaches are shown in eqs 3-5, respectively (M = metal). The key features of these

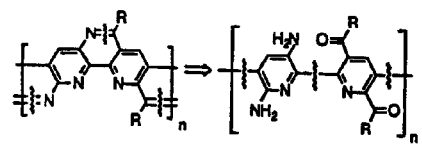
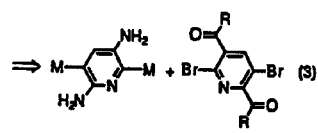
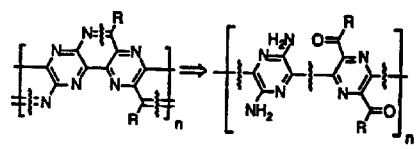
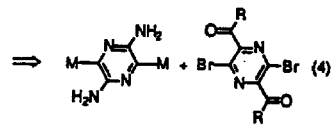
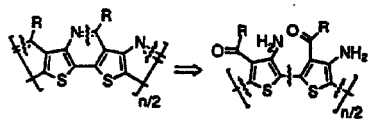
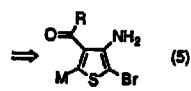
retrosynthetic approaches are, first, imine cleavage to the ketone and amine functionalized polyaromatics, and second, bond cleavage to the AB-type polymerization monomers (eqs 1, 3, and 4) or the difunctional monomer (eq 5).

The desired monomers for the planar polypyrazine are being synthesized in the following manner. According to

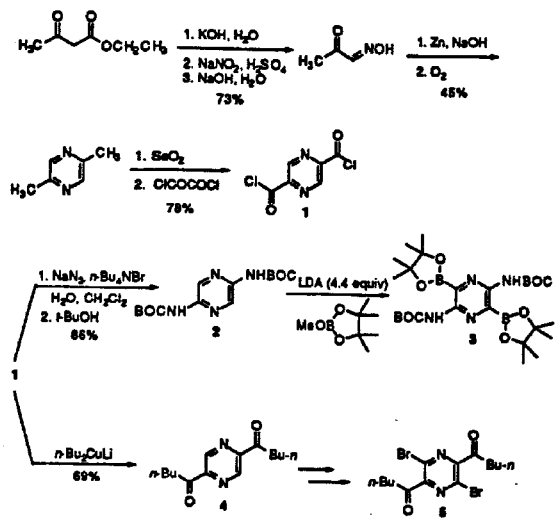

standard protocol, ethyl acetoacetate was saponified, nitrosolated, and decarboxylated to form the α-ketooxime. Reduction and condensation afforded the dihydro-dimethylpyrazine that was oxidized to dimethylpyrazine with air.[4] Selenium dioxide-promoted diacid formation[5] followed by treatment with oxalyl chloride afforded the pyrazine diacid chloride 1. This common intermediate could be used to synthesize both of the required monomers. First, conversion to the bis(acyl azide) under phase transfer conditions followed by a thermal bis-Curtius rearrangement and *t*-butanol capture afforded the bis(BOC)-protected diaminopyrazine 2.[6] Remarkably, tetralithiation with LDA or LTMP followed by treatment with methyl pinacol borate afforded the required dimetalated diamine 3. The lithiation proceeded in very high yield since the tetralithio derivative could be quenched with TMSCl to afford the bis(trimethylsilyl)arene in 91% yield after aqueous work-up and purification. Further purification of the bis(boronic ester) is required. 1 could also be dibutylated with the dialkylcuprate to afford the required diketo functionality of the second monomeric intermediate (4). Methods for the selective bromination of 4 for the preparation of the required diketodibromide 5 are currently being developed. The superb efficiency of this divergent (common intermediate 1) approach is indeed apparent.

The required monomer for the planar polythiophene is being prepared in the following manner. Standard protocol

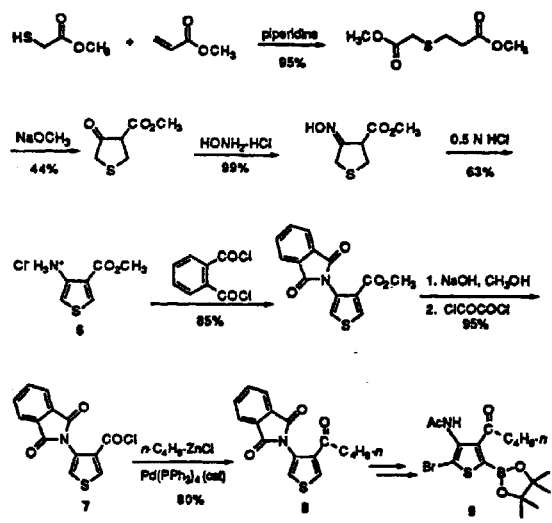

was used for thiol conjugate addition, ester enolate formation, cyclization, oxime formation, and dehydration to afford the thiophene skeleton (6) with the amine and carbonyl moieties in place.[7] Imide formation, saponification, and acid chloride formation afforded 7 which could be converted to the ketone (8) with butylzinc chloride and Pd(0) catalysis.[8] We are presently working on methods to permit 2-position bromination and 5-position metalation to afford the required monomer 9 for the step growth polymerization.

Our approach to the planar polypyridine monomers is less well-developed, however, our progress is as outlined below. Dimethylpyridine was brominated under forcing

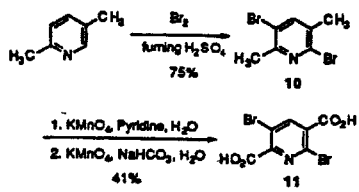

conditions to yield 10.[9] A two step oxidation procedure afforded the desired dibrombis(acid) 11.[10] We hope to utilize a divergent approach as outlined for 1 to convert 11 into the two monomers needed for the planar polypyridine material.

Acknowledgments. We are grateful for support from the Office of Naval Research, and the National Science Foundation (EHR-91-08772, DMR-9158315), and generous industrial contributors to the NSF Presidential Young Investigator Award (1991-96): Hercules, IBM, Ethyl, Shell, Exxon, Farchan, Molecular Design Ltd., and Eli Lilly Corporations.

References and Notes

(1) For some discussions of aromatic ladder polymers, see: (a) Overberger, C. G.; Moore, J. A. *Adv. Polym. Sci.* 1970, 7, 113. (b) Schlüter, A.-D. *Adv. Mater.* 1991, 3, 282. (c) Yu, L.; Chen, M.; Dalton, L. R. *Chem. Mater.* 1990, 2, 649. (d) Hong, S. Y.; Kertesz, M.; Lee, Y. S.; Kim, O.-K. *Chem. Mater.* 1992, 4, 378. (e) Godt, A.; Schlüter, A.-D. *Adv. Mater.* 1991, 3, 497. (f) Yu. L.; Dalton, L. R. *Macromolecules* 1990, 23, 3439. (g) Scherf, U.; Müllen, K. *Macromolecules* 1992, 25, 3546. (h) Goldfinger, M. B.; Swager, T. M. *Polym. Prepr. (Am. Chem. Soc., Div. Polym. Chem.)* 1994, 35(1), 273.

(2) For a discussion of twist angle versus degree of extended conjugation, see: (a) Brédas, J. L In *Handbook of Conducting Polymers*; Skotheim, T. A., Ed.; Dekker: New York, 1986. (b) Ferraris, J. P.; Andrus, R. G.; Hrncir, D. C. *J. Chem. Soc., Chem. Commun.* 1989, 1318. (c) Gorman, C. B.; Ginsburg, E. J.; Moore, J. S.; Grubbs, R. H. *Polym. Prepr. (Am. Chem. Soc., Div. Polym. Chem.)* 1991, 32(3), 714.

(3) Tour, J. M.; Lamba, J. J. S. *J. Am. Chem. Soc.* 1993, 115, 4935.

(4) Beech, W. F. *J. Chem. Soc.* 1955, 3094.

(5) Schut, W. J.; Mager, H. I. X.; Bereends, W. *Recueil* 1961, 80, 391.

(6) We developed these rearrangements conditions at the same time that Swager described an analogous procedure without BOC protection. See: Zhou, Q.; Swager, T. M. *Polym. Prepr. (Am. Chem. Soc., Div. Polym. Chem.)* 1994, *35*(1), 277. Our development was based on work by Pfister. See: Pfister, J. R.; Wymann, W. E. *Synthesis* 1983, 38.

(7) (a) Woodward, R. B.; Eastham, R. H. *J. Am. Chem. Soc.* 1946, *68*, 2229. (b) Baker, B. R.; Joseph, J. P.; Schaub, R. E. *J. Org. Chem.* 1953, *81*, 138.

(8) Negishi, E.; Bagheri, V.; Chatterjee, S.; Luo, F.-T.; Miller, J. A.; Stoll, A. T. *Tetrahedron Lett.* 1983, *24*, 5181.

(9) Abblard, J.; Decoret, C.; Cronenberger, L.; Pacheco, H. *Bull. Soc. Chim. Fr.* 1972, 2466.

(10) A similar two step oxidation procedure was suggested by Swager, T. M., personal communication.

Appendix D

Improved Route to Bridged Planar Poly(p-phenylene) Derivatives for Maximization of Extended π-Conjugation Jaydeep J. S. Lamba and James M. Tour*
Department of Chemistry and Biochemistry
University of South Carolina
Columbia, South Carolina 29208

Poly(p-phenylene) (PPP), a highly insoluble polymer that has been studied extensively for its possible electronic and photonic applications, has a 23° twist between the consecutive aryl units due to ortho hydrogen interactions.[1] Attempts to enhance the solubility by substitution of the rings forces the consecutive aryl units even further out of plane resulting in a plummet of the extended conjugation (easily observed by the optical spectra).[1] We recently described a route to soluble ladder PPP derivatives.[2] Here we describe an improved synthetic route to the monomers as well as an aryl-substituted ladder PPP derivative.[3]

Our retrosynthetic approach involved two key steps (Scheme I, M = metal). First, imine cleavage to the Scheme I

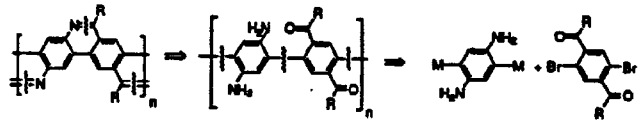

ketoamine functionalized PPP, and second, bond cleavage to the two arene systems shown. Since Pd(0)-catalyzed oxidative addition reactions are facilitated with electron deficient ring systems,[4] we chose to keep the halides on the ketoaromatic portion.

After several nearly quantitative model reactions, we synthesized the two key monomers needed for the desired AB-type step growth polymerization. Dibromoxylene was oxidized by a two-step procedure[5] which was superior to the one step Co(OAc)$_2$ procedure[2] described previously. The route described here is an improvement over our former approach in that the same dibromobis(acid chloride) (1) can be used for the synthesis of both the A and B monomer units. Conversion of 1 to the diketone was accomplished with the use of the lower order alkylcyanocuprate, or an arylzinc halide and Pd(0) catalysis.[6] This Pd(0)-catalyzed procedure proved to be superior for the aryl ketone formation. 1 could also be converted to the bis(acylazide) under phase transfer conditions. Photolysis with a UV TLC-spotting light affected the bis-Curtius rearrangement with $N_2$ expulsion. *t*-BuOH trapping of the bis(isocyanate) afforded the desired bis(BOC)-protected amine 5.[7] These phase transfer conditions and subsequent photochemical rearrangements were the only set of conditions that worked, in our studies, for this transformation. The yield of 59% for 5 is after repeated crystallization, thus, the efficiency of this process is quite good.

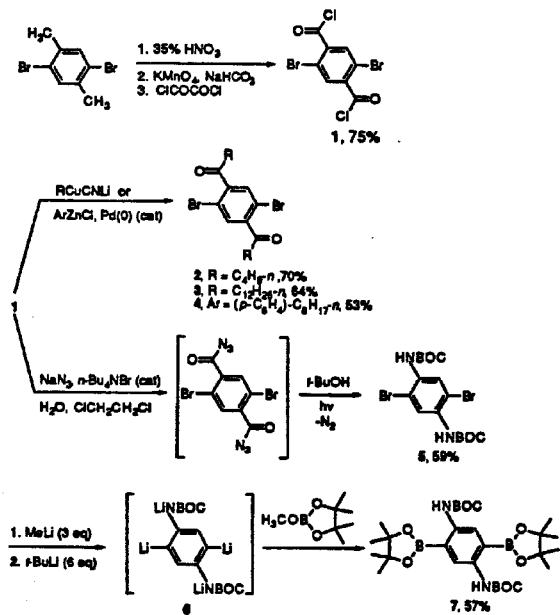

2

While 5 was nearly insoluble in ether at 0°C, it could be tetralithiated in ether to form a soluble intermediate 6 in almost quantitative yield (checked by addition of TMSCl and isolation of the arylbis(silane) after aqueous work-up). Treatment of 6 with methyl pinacol borate afforded the monomer 7 which could be purified by passage through a flash chromatography column containing a mixture of activated charcoal and Celite as the stationary phase (silica gel or neutral alumina caused rapid decomposition of the intermediate) and $CH_2Cl_2$ as the eluant followed by recrystallized to form pure 7.

Reaction of 2, 3, or 4 with 7, in the presence of a Pd(0) catalyst, yielded the soluble polymers 8, 9, and 10, respectively, from which size exclusion chromatography (SEC) could be used to determine the hydrodynamic volumes relative to polystyrene (8: 63% yield after fractional precipitation, $M_n$ = 9,850 with $M_w/M_n$ = 1.85; 9: 97% yield after fractional precipitation, $M_n$ = 28,400 with $M_w/M_n$ = 3.70; 10: 80% yield after fractional precipitation, $M_n$ = 18,500 with $M_w/M_n$ = 2.75). Upon exposure of 8, 9, or 10 to trifluoroacetic acid (TFA), quantitative loss of the BOC protecting group and cyclization afforded 11 (90% yield), 12 (97% yield), and 13 (90% yield), respectively.[8] All stretches for the ketone, carbamate, and amine in 8, 9, and 10 were absent in the FTIR spectrum of the planar polymers.

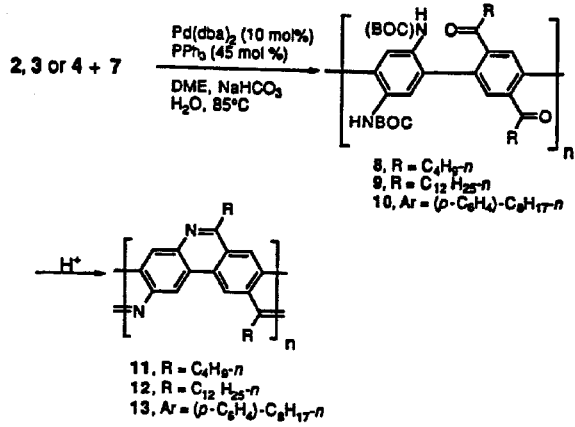

Figure 1:
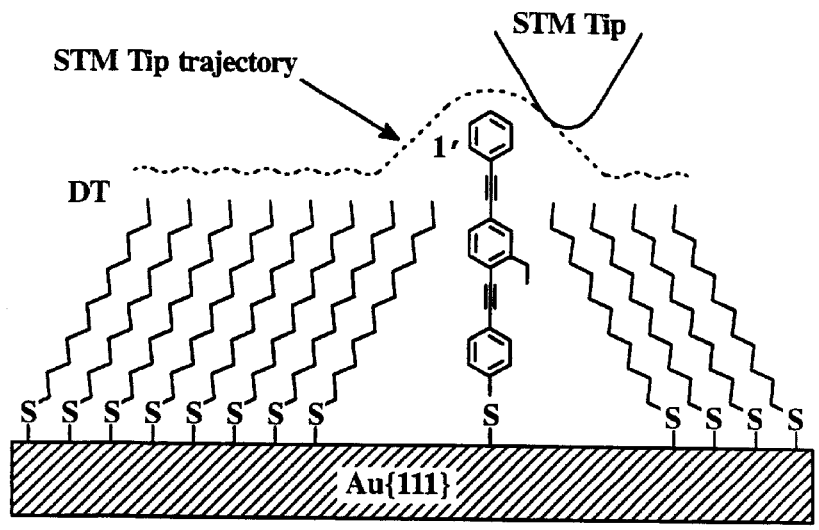
Figure 2A:
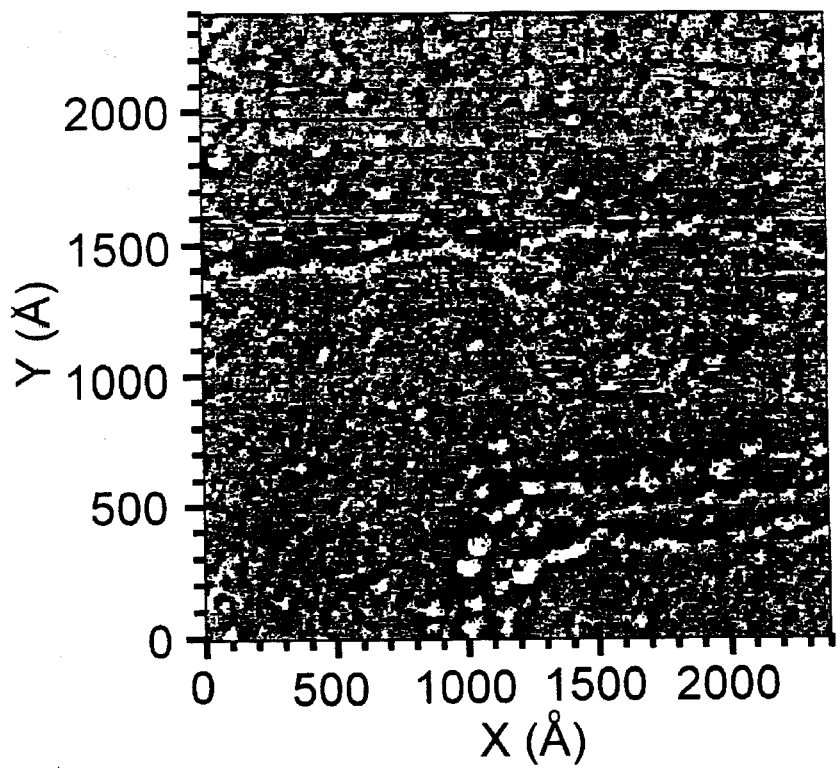
Figure 2B:
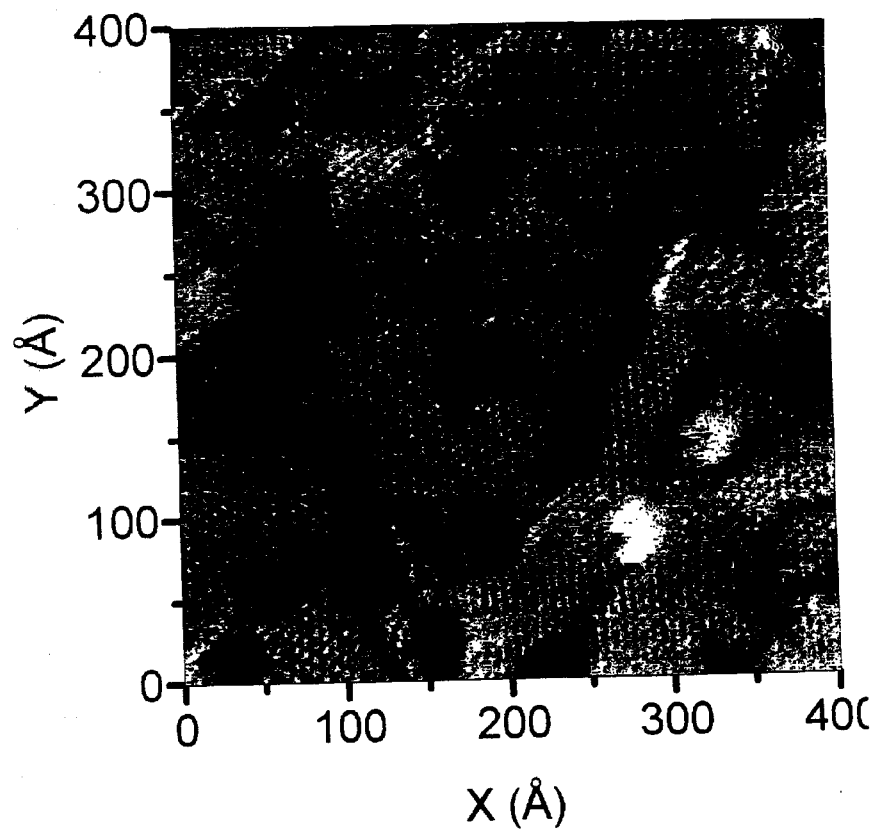

The optical absorption data showing enormous bathochromic shifts in the polymers upon cyclization (conversion of 8 to 11, 9 to 12, and 10 to 13); an observation consistent with the proposed ladder formation (Table I). The UV-vis spectrum of 13 in a CH$_2$Cl$_2$/trifluoroacetic acid (3/2) mixture is shown in Figure 1. The absorptions of these planar polymers are far more bathochromically-shifted than those of the planar trimers,[9] oligo(p-phenylenes), and PPP.[10]

Table I. Optical Absorption Data

| Compound | λ in solution (nm)[a] | λ of solid (nm)[a] |
|---|---|---|
| 8 | CH$_2$Cl$_2$: <u>250</u>, 306 (sh) | <u>248</u>, 308[b] |
| 9 | CH$_2$Cl$_2$: <u>250</u>, 388 | <u>250</u>, 398[b] |
| 10 | CH$_2$Cl$_2$: <u>254</u> | <u>254</u> |
| 11 | CH$_2$Cl$_2$/TFA: 374, <u>396</u>, 426 (sh), 514, 520 (ed)[c] | ------ |
| 12 | CH$_2$Cl$_2$/TFA: 376, <u>400</u>, 428, 478, 516, 530 (ed)[c] | <u>463–490</u>[d] |
| 13 | CH$_2$Cl$_2$/TFA: 380, <u>402</u>, 458, 506, 549[c] | ------ |
| 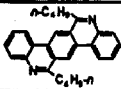 | CH$_2$Cl$_2$: <u>300</u> (ref 9) | ------ |
| 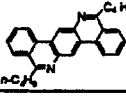 | CH$_2$Cl$_2$: <u>294</u> (ref 9) | ------ |
| p-sexiphenylene | CHCl$_3$: <u>318</u> (ref 10) | ------ |
| PPP (calcd infinite $M_n$) | <u>344</u> (ref 10) | ------ |

[a]$\lambda_{max}$ is underlined, (sh) is shoulder, (ed) is tailing edge at ~10% of $\lambda_{max}$ intensity. [b]Also a strong carbonyl absorption at 196 nm. [c]Spectrum recorded on the acid solublized, therefore, multiprotonated system. [d]These $\lambda_{max}$ values were recorded on a series of four different polymer samples of 9 in order to insure their reproduciblity.[11]

Figure 1. UV-vis spectrum of 13 in a CH$_2$Cl$_2$/TFA (3/2) mixture

Acknowledgments. We are grateful for support from the Office of Naval Research, and the National Science Foundation (EHR-91-08772, DMR-9158315), and generous industrial contributors to the NSF Presidential Young Investigator Award (1991-96): Hercules, IBM, Ethyl, Shell, Exxon, Farchan, Molecular Design Ltd., and Eli Lilly Corporations.

References and Notes (1) For some recent reviews on polyphenylene, see: (a) Kovacic, P.; Jones, M. B. *Chem. Rev.* 1987, *87*, 357. (b) Noren, G. K.; Stille, J. K. *Macromol. Rev.* 1971, *5*, 385. (c) Elsenbaumer, R. L.; Shacklette, L. W. In *Handbook of Conducting Polymers*; Skotheim, T. A., Ed.; Dekker: New York, 1986. (d) Tourillion, G. in ref 1c. (e) Baughman, R. H.; Brédas, J. L.; Chance, R. R.; Elsenbaumer, R. L.; Shacklette, L. W. *Chem. Rev.* 1982, *82*, 209. For a discussion of twist angle versus degree of extended conjugation, see: (f) Brédas, J. L. in ref 1c. (g) Ferraris, J. P.; Andrus, R. G.; Hrncir, D. C. *J. Chem. Soc., Chem. Commun.* 1989, 1318. (h) Gorman, C. B.; Ginsburg, E. J.; Moore, J. S.; Grubbs, R. H. *Polym. Prepr. (Am. Chem. Soc., Div. Polym. Chem.)* 1991, *32*(3), 714. (i) Orchard, B. J.; Freidenreich, B.; Tripathy, S. K. *Polymer* 1986, *27*, 1533.

(2) Tour, J. M.; Lamba, J. J. S. *J. Am. Chem. Soc.* 1993, *115*, 4935.

(3) For some discussions of aromatic ladder polymers, see: (a) Overberger, C. G.; Moore, J. A. *Adv. Polym. Sci.* 1970, *7*, 113. (b) Schlüter, A.-D. *Adv. Mater.* 1991, *3*, 282. (c) Yu, L.; Chen, M.; Dalton, L. R. *Chem. Mater.* 1990, *2*, 649. (d) Hong, S. Y.; Kertesz, M.; Lee, Y. S.; Kim, O.-K. *Chem. Mater.* 1992, *4*, 378. (e) Godt, A.; Schlüter, A.-D. *Adv. Mater.* 1991, *3*, 497. (f) Yu, L.; Dalton, L. R. *Macromolecules* 1990, *23*, 3439. (g) Scherf, U.; Müllen, K. *Makromol. Chem., Rapid Commun.* 1991, *12*, 489. (h) Scherf, U.; Müllen, K. *Synthesis* 1992, 23. (i) Scherf, U.; Müllen, K. *Macromolecules* 1992, *25*, 3546.

(4) (a) Miyaura, N.; Yanagi, T.; Suzuki, A. *Synth. Commun.* 1981, *11*, 513. (b) Siddiqui, M. A.; Snieckus, V. *Tetrahedron Lett.* 1988, *29*, 5463. (c) Gronowitz, S.; Lawitz, K. *Chem. Scripta* 1984, *24*, 5.

(5) Swager, T. M., personal communication.

(6) Negishi, E.; Baba, S. *J. Chem. Soc., Chem. Commun.* 1976, 596.

(7) We developed these rearrangements conditions at the same time that Swager described an analogous procedure without BOC protection. See: Zhou, Q.; Swager, T. M. *Polym. Prepr. (Am. Chem. Soc., Div. Polym. Chem.)* 1994, *35*(1), 277. Our development was based on work by Pfister. See: Pfister, J. R.; Wymann, W. E. *Synthesis* 1983, 38.

(8) 8: Anal. calc'd for $(C_{32}H_{42}N_2O_6)_n$: C, 69.79; H, 7.69; N, 5.07. Found: C, 70.55; H, 7.25; Br, <0.5; N, 5.13. 9: Anal. calc'd for $(C_{48}H_{74}N_2O_6)_n$: C, 74.38; H, 9.62; N, 3.61. Found: C, 74.99; H, 9.40; Br, <0.5; N, 3.55. 11: Anal. calc'd for $(C_{22}H_{22}N_2)_n$: C, 84.04; H, 7.05; N, 8.91. Found: C, 79.13; H, 6.77; Br, <0.5; N, 8.56. 12: Anal. calc'd for $(C_{38}H_{54}N_2)_n$: C, 84.70; H, 10.10; N, 5.20. Found: C, 81.45; H, 9.64; Br, <0.5; N, 5.22.

(9) The planar trimers were prepared during our model studies for the polymerizations described here using Pd-catalyzed couplings.

(10) Ried, W.; Freitag, D. *Angew. Chem. Intern. Ed. Engl.* 1968, *7*, 835.

(11) Drs. R. Gaudiana and P. Mehta of Polaroid Corporation kindly provided the solid-state UV-vis data.

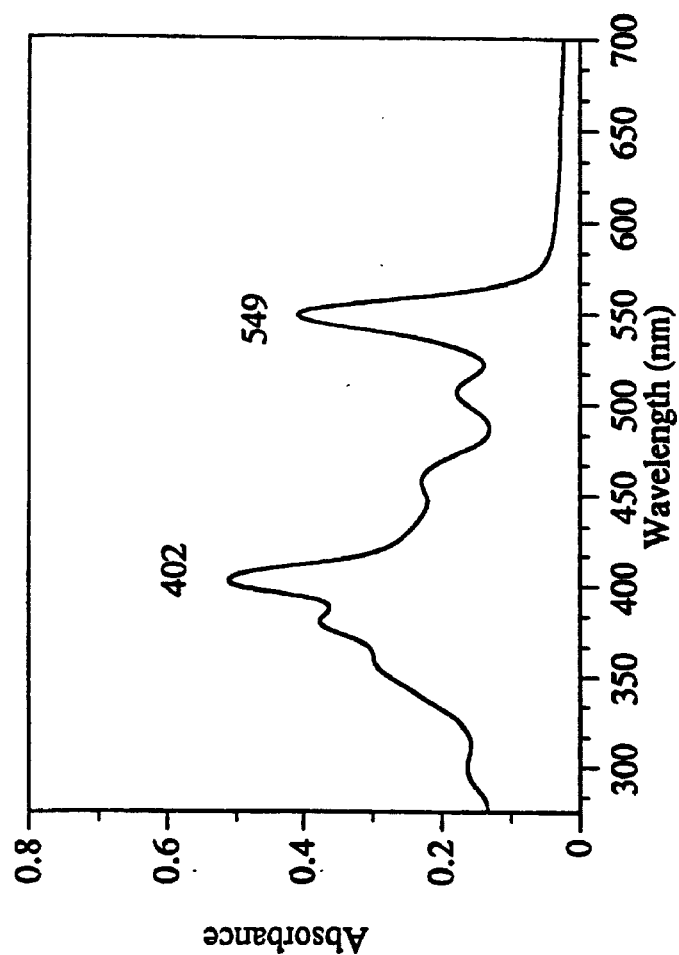

Appendix E

*Angew. Chem. Int. Ed. Engl.*, 1994, in press

Iterative Divergent/Convergent Doubling Approach to Linear Conjugated Oligomers. A Rapid Route to a 128 Å Long Potential Molecular Wire Jeffry S. Schumm and James M. Tour*

Department of Chemistry and Biochemistry

University of South Carolina

Columbia, South Carolina 29208

Abstract

Described is the synthesis of oligo(2-ethylphenyl-ethynylene)s and oligo(2-(3'-ethylheptyl)phenyl-ethynylene)s via an iterative divergent convergent approach. Synthesized were the monomer, dimer, tetramer, and octamer of the ethyl derivative and the monomer, dimer, tetramer, octamer, and 16-mer of the ethylheptyl derivative. The 16-mer is 128 Å long. At each stage in the iteration, the length of the framework doubles. Only three sets of reaction conditions are needed for the entire iterative synthetic sequence; an iodination, a protodesilylation, and a Pd/Cu-catalyzed cross coupling. The oligomers were characterized spectroscopically and by mass spectrometry. The optical properties are presented which show the stage of optical absorbance saturation. The size exclusion chromatography values for the number average weights, relative to polystyrene, illustrate the tremendous differences in the hydrodynamic volume of these rigid rod oligomers verses the random coils of polystyrene. These differences become quite apparent at the octamer stage. A plot of the actual molecular weights versus size exclusion chromatography-determined molecular weights for these linear oligomers are similar to the plots obtained for other rigid rod oligomers; therefore confirming that such plots are superbly suited for molecular weight determination of rigid rod polymers. These oligomers may act as molecular wires in molecular electronic devices and they also serve as useful models for understanding related bulk polymers.

The ultimate computational system would consist of logic devices that are ultra dense, ultra fast, and molecular-sized.[1] Even though state-of-the-art nanopatterning techniques allow lithographic probe assemblies to be engineered down to the 100 Å gap regime,[2] the issue of electronic conduction based upon single or small packets of molecules has not been demonstrated and the feasibility of molecular electronics remains theoretically controversial.[1,3] In an attempt to assess the possibility of molecular wire conduction by spanning the 100 Å probe gaps with molecules, we recently described a new rapid synthetic approach to potential molecular wires based on an oligo(thiophene-ethynylene) derivative.[4,5] Those thiophene-ethynylene-derived compounds existed in a zig-zag conformation due to the 148° bond angle across thiophenes. Complementary to that, we describe here the synthesis of phenylene-alkynylene oligomers that remain in a linear conformation. This linear arrangement should minimize undesired conformational movement during adhesion and testing between nanofabricated probes. Our approach to such a molecular framework involves a rapid iterative method that doubles molecular length at each iteration to provide an air and light-stable linear conjugated oligomer that is 128 Å long that could also serve as a useful model for understanding bulk polymeric material properties.[6] Moreover, the product could easily permit independent functionalization of the ends to serve as "molecular alligator clips" that might be required for surface contacts to metal probes.[7]

The synthesis of the ethyl-containing monomer 1 is shown in eqs 1 and 2. The iterative

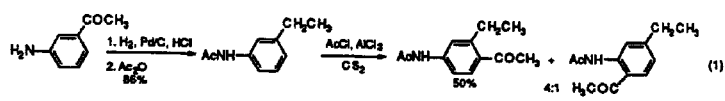

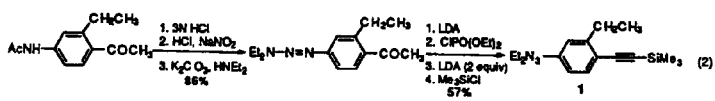

divergent/convergent approach to molecular length doubling is shown Scheme 1. Notice how just three different reactions are needed at each stage to double the molecular length.[8] We initially

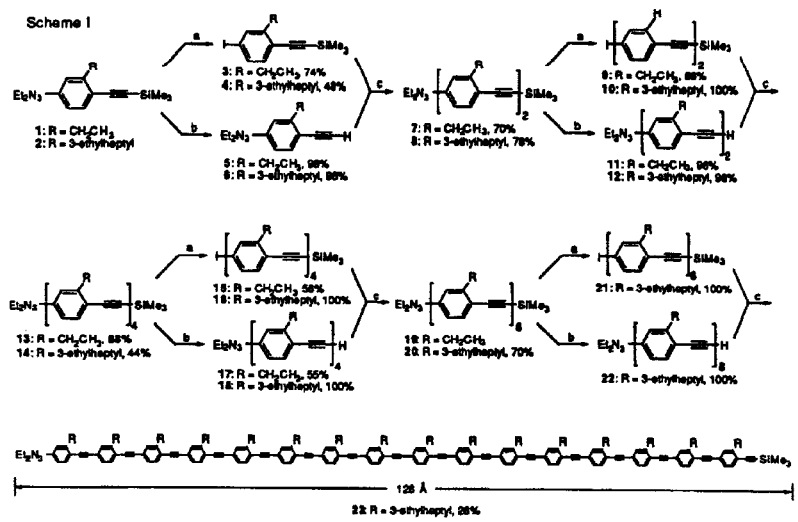

Reagents: a. MeI as solvent, 120°C in a screw cap tube. b. K₂CO₃, MeOH, 23°C or n-Bu₄NF, THF, 23°C c. Pd(dba)₂ (5 mol %), CuI (10 mol %), PPh₃ (20 mol %), iPr₂NH/THF (1:5), 23°C.

conducted the synthesis starting from the monomer 1 with the notion that the ethyl group would provide sufficient solubility to permit formation of a 16-mer that has a length sufficiently long to bridge between lithographically-derived probe gaps. Unfortunately, the octamer 19 was nearly insoluble. We were only able to obtain a UV-visible spectrum ($\lambda_{max}$ (CH$_2$Cl$_2$) = 364 nm) and a mass spectrum (MS). Further analysis and synthesis was prohibited due to the poor solubility.

In an effort to insure the solubility of the linear rigid rod oligomer through to the 16-mer, we prepared the monomer 2 as shown in Scheme II. We tried numerous methods to concomitantly reduce both the ketone and the nitro moiety, however, all methods failed, including the Pd-C/H$_2$/HCl reduction that worked for in the synthesis of 1 (eq 1 and 2). Therefore the multi-step reaction sequence shown in Scheme II had to be utilized which also required a *tert*-BuONO-promoted[9] formation of the intermediate diazonium species. In addition to 2 possessing a longer alkyl chain than 1, 2 also has a stereogenic center which, upon successive dimerization, will afford numerous

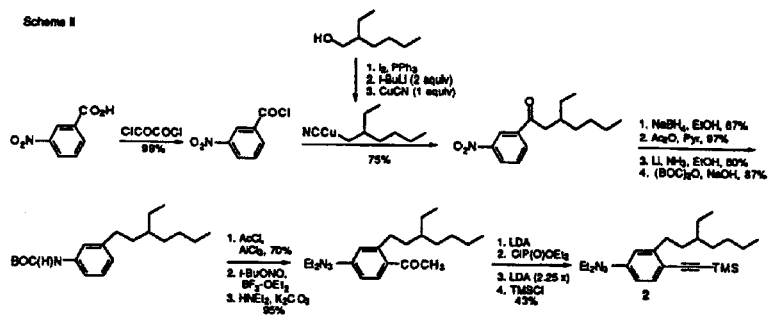

Scheme I diastereomers that will retard crystallization and thereby increase the likelihood of solubility. Indeed, we were delighted to discover that both the octamer 20 as well as the 16-mer 23 (Scheme I) were quite soluble and they could be fully characterization.

While 1, 2, 7, 8, 13, and 14 afforded molecular ions by direct exposure via electron impact mass spectrometry (MS), 19 exhibited a peak for its molecular weight minus the triazene group that was lost during MS analysis. In order to characterize 20 and 23, it was necessary to use matrix assisted laser desorption MS to observe their respective M+1 peaks (Calc'd maximum isotopic intensity for 23, with X $^{13}$C M + 1= XXXX. Found XXXX ±XX).

The optical spectra are interesting in that a saturation of the systems appears to have occurred by the octamer stage so that doubling the conjugation length to the 16-mer caused little change in the absorbance maximum (Figure 1). We also noticed that the π-extended triazene substituent shifted the absorbance maxima bathochromically.

The results of the size exclusion chromatography (SEC) are shown Figure 2 as compared with the actual molecular weights (MW) of the oligomers. SEC is not a direct measure of MW but a measure of the hydrodynamic volume. Thus, by SEC using randomly coiled polystyrene standards, the number average molecular weights ($M_n$) of rigid rod polymers are usually greatly inflated relative the actual molecular weights. Accordingly, the SEC recorded $M_n$ values of the octamer (20) ($M_n$ = 2,790, actual MW= 1,981) and 16-mer (23) ($M_n$ = 6,650, actual MW= 3,789) were much greater than the actual MWs. Conversely, the monomer (2) through tetramer

(14) had $M_n$ values that were reasonably close to the actual MWs (slope ~1.0 in Figure 2) because they are in the low MW region, prior to significant polystyrene coiling. In all cases, the SEC-determined values of $M_w/M_n$ = 1.04-1.07. Remarkably, as also demonstrated in Figure 2, the curve is quite similar to the thiophene-ethynylene-derived oligomers[4] that possess a zig-zag conformation, thus substantiating that Figure 2 could serve as a useful calibration chart for estimating the MWs of various other rigid rod polymers.

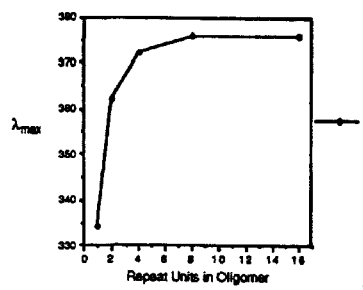

Figure 1. UV absorbance maxima (CH$_2$Cl$_2$) of the monomer through 16-mer, 2, 8, 14, 20, and 23, respectively.

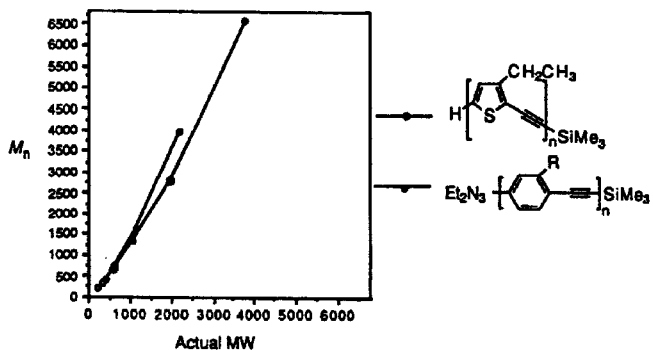

Figure 2. $M_n$ as determined using SEC (THF, polystyrene) versus the actual molecular weights of the two oligomers shown where n = 1, 2, 4, 8, and 16. R = 3-ethylheptyl.

Acknowledgments. We are grateful for support from the Office of Naval Research and the Advanced Research Projects Agency. Dr. Kevin Schey at the Medical University of South Carolina kindly obtained the laser desorption MS. We also thank Molecular Design Ltd. for the use of their synthetic data base.

References (1) (a) Bowden, M. J. In *Electronic and Photonic Applications of Polymers*; Bowden, M. J.; Turner, S. R., Eds.; (Advances in Chemistry, 218) American Chemical Society: Washington DC, 1988. (b) *Molecular Electronics: Science and Technology*, Aviram, A., Ed.; Confer. Proc. No. 262, American Institute of Physics: New York, 1992. (c) *Molecular Electronic Devices II*; Carter, F. L., Ed.; Marcel Dekker: New York, 1984. (d) Hammeroff, S. R. *Ultimate Computing. Biomolecular Consciousness and Nano Technology*; North Holland: Amsterdam, 1987. (e) Franks, A. *J. Phys. E: Sci Instum.* 1987, *20*, 1442. (f) Miller, J. S. *Adv. Mater.* 1990, *2*, 495, 601. (g) Aviram, A. *J. Am. Chem. Soc.* 1988, *110*, 5687. (h) Hush, N. S.; Wong, A. T.; Bacskay, G. B.; Reimers, J. R. *J. Am. Chem. Soc.* 1990, *112*, 4192. (i) Farazdel, A.; Dupuis, M.; Clementi, E.; Aviram, A. *J. Am. Chem. Soc.* 1990, *112*, 4206. (j) Waldeck, D. H.; Beratan, D. N. *Science* 1993, *261*, 576. (k) Ball, P.; Garwin, L. *Nature* 1992, *355*, 761. (k) Tour, J. M.; Wu, R.; Schumm. J. S. *J. Am. Chem. Soc.* 1990, *112*, 5662.

(2) (a) Reed, M. A., Yale University, personal communication, 1993. (b) *Nanostructure Physics and Fabrication*, Reed, M. A.; Kirk, W. P., Eds.; Academic Press: San Diego, 1989. (c) *Nanostructures and Mesoscopic Systems*, Kirk, W. P.; Reed, M. A., Eds.; Academic: San Diego, 1992.

(3) (a) Miller, J. S. *Adv. Mater.* 1990, *2*, 378. (b) Chjatterji, P. K.; Yang, P. Schichijo, H. *Proc. IEEE* 1983, *130*, 105. (c) Bate, R. T. In *VSLI Electronics*, Einspruch, N. G., Ed.; Academic: San Diego, 1982; Vol 5.

(4) Pearson, D. L.; Schumm, J. S.; Tour, J. M. *J. Am. Chem. Soc.*, under review.

(5) For a presentation of some foundational work in the area, see: (a) Kenny, P. W.; Miller, L. L. *J. Chem. Soc., Chem. Commun.* 1988, 85. (b) Kugimiya, S.-i.; Lazrak, T.; Blanchard-Desce, M.; Lehn, J.-M. *J. Chem. Soc., Chem. Commun.* 1991, 1179. (c) Crossley, M. J.; Burn, P. L. *J. Chem. Soc., Chem. Commun.* 1991, 1569. (d) Zecevic, S. ### *J. Electroanal. Chem.* 1985, *196*, 339. (e) Yoshimura, T.; Tatsuura, S.; Sotoyama, W.; Matsuura, A.; Hayano, T. *Appl. Phys. Lett.* 1992, *60*, 268. (f) Sessler, J. L.; Capuano, V. L.; Harriman, A. *J. Am. Chem. Soc.* 1993, *115*, 4618. (g) Tachibana, H.; Azumi, R.; Nakamura, T.; Matsumoto, M.; Kawabata, Y. *Chem. Lett.* 1992, 173. (h) O'Neil, M. P.; Niemczyk, M. P.; Svec, W. A.; Gosztola, D.; Gaines, G. L., III; Wasielewski, M. R. *Science* 1992, *257*, 63.

(6) *Handbook of Conducting Polymers*; Skotheim, T. A., Ed.; Dekker: New York, 1986.

(7) (a) Abbott, N. L.; Folkers, J. P.; Whitesides, G. M. *Science* 1992, *257*, 1380. (b) Charych, D. H.; Bednarski, M. D. *Mater. Res. Soc. Bull.* 1992, *17*(11), 61.

(8) For the iodination procedure, see: Moore, J. S.; Weinstein, E. J.; Wu, Z. *Tetrahedron Lett.* 1991, *32*, 2465. For the cross coupling procedure, see: (a) Kumada, M.; Suzuki, K.; Tamao, K.; Kodama, S.; Nakajima, I.; Minato, A.; *Tetrahedron* 1982, *38*, 3347. (b) Uhlenbroek, J. H.; Bijloo, J. D. *Rec. Trav. Chim.* 1960, *79*, 1181. (c) Sonogashira, K.; Tohda, Y.; Hagihara, N. *Tetradedron Lett.* 1975, 4467. (d) Stephens, R. D.; Castro, C. E. *J. Org. Chem.* 1963, *28*, 3313. (e) Suffert, J.; Ziessel, R. *Tetrahedron Lett.* 1991, *32*, 757.

(9) Doyle, M. P.; Bryker, W. J. *J. Org. Chem.* 1979, *44*, 1572.

Appendix F

Reprinted from Macromolecules, 1994, 27.
Copyright © 1994 by the American Chemical Society and reprinted by permission of the copyright owner.

Iterative Divergent/Convergent Approach to Conjugated Oligomers by a Doubling of Molecular Length at Each Iteration. A Rapid Route to Potential Molecular Wires

Darren L. Pearson, Jeffry S. Schumm, and James M. Tour*

*Department of Chemistry and Biochemistry, University of South Carolina, Columbia, South Carolina 29208*

*Received February 2, 1994*

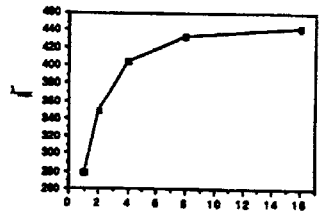

Figure 1. Optical absorbance maximum ($\lambda_{max}$) in $CH_2Cl_2$ versus the number of units in the oligomer ($n$) for 4, 7, 10, 13, and 16.

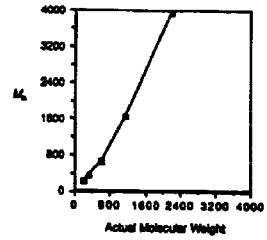

Figure 2. Values of $M_n$ determined by SEC in THF (relative to polystyrene standards) versus the actual molecular weights of the monomer through 16-mer, 4, 7, 10, 13, and 16, respectively.

The ultimate computational system would consist of logic devices that are ultradense, ultrafast, and molecular-sized.[1] Though bulk conjugated organic materials can indeed be semiconducting or even conducting,[2] electronic conduction based upon single or small packets of molecules has not been demonstrated and it is theoretically controversial.[1,3] Present nanopatterning techniques allow lithographic probe assemblies to be engineered down to the 100-Å gap regime.[4] In an attempt to span this 100-Å gap with molecules and to assess the feasibility of molecular wire conduction, we describe here a rapid synthetic approach to potential molecular wires based on an oligo(thiophene–ethynylene) derivative.[5,6] Additionally, these compounds possess properties that could make them useful for understanding bulk polymeric material properties.[7]

The synthesis of the key monomer 4, whose length will double at each stage, is outlined in eq 1.[8] The iterative

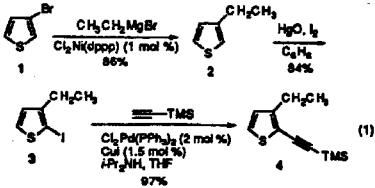

divergent/convergent synthetic approach is outlined in Scheme 1. The sequence involves partitioning 4 into two portions; iodinating the 5-position in one of the portions to form 5 and protodesilylating the alkynyl end of the second portion to form 6. Bringing the two portions back together in the presence of a Pd/Cu catalyst[5c–f] couples the aryl iodide to the terminal alkyne, thus generating the dimer 7. Iteration of this reaction sequence doubles the length of the dimer 7 to afford the tetramer 10, and so on to the octamer 13, and finally the 16-mer 16. The 16-mer, in its minimum-energy conformational form, has a molecular length of approximately 100 Å.[9]

The monomer through 16-mer, 4, 7, 10, 13, and 16, have been characterized spectroscopically. While the tetramer 10 and octamer 13 afforded molecular ions by direct exposure via electron impact mass spectrometry (MS), neither this method nor FAB or electrospray MS sufficed for obtaining a molecular ion of 16. However, matrix-assisted laser desorption MS did afford an M + 1 peak for 16 (sinapinic acid matrix, positive ion mode, M + 1. Calcd for $C_{131}H_{106}S_{16}Si + 1$: 2222.32. Found: 2219.98 ± 1.20).

The optical spectra are interesting in that a near saturation of the systems appears to have occurred by the octamer stage so that doubling the conjugation length to the 16-mer caused little change in the absorbance maximum (Figure 1). The results of the size-exclusion chromatography (SEC) are also quite intriguing (Figure 2). SEC is not a direct measure of molecular weight but a measure of the hydrodynamic volume. Thus, by SEC using randomly coiled polystyrene standards, the number-average molecular weights ($M_n$) of rigid-rod polymers are usually greatly inflated relative to the actual molecular weights (MW). Accordingly, the SEC-recorded $M_n$ values of the octamer (13; $M_n$ = 1610, actual MW = 1146) and 16-mer (16; $M_n$ = 3950, actual MW = 2218) were much greater than the actual MWs. Conversely, the monomer (4) through tetramer (10) had $M_n$ values that were very close to the actual MWs (slope ~1.0 in Figure 2) because they are in the low-MW region, prior to significant polystyrene coiling. Therefore, Figure 2 could serve as a useful calibration chart for determining the MW of rigid-rod polymers. In all cases, the SEC-determined values of $M_w/M_n$ = 1.02–1.05 were within the detectable range limits.

Acknowledgment. We are grateful for support from the Office of Naval Research and the Advanced Research Projects Agency. Dr. K. Schey at the Medical University of South Carolina kindly obtained the laser desorption MS of 16. We also thank Molecular Design Ltd. for the use of their synthetic data base and Farchan Laboratories for a gift of (trimethylsilyl)acetylene.

0024-9297/94/2227-2348$04.50/0 © 1994 American Chemical Society

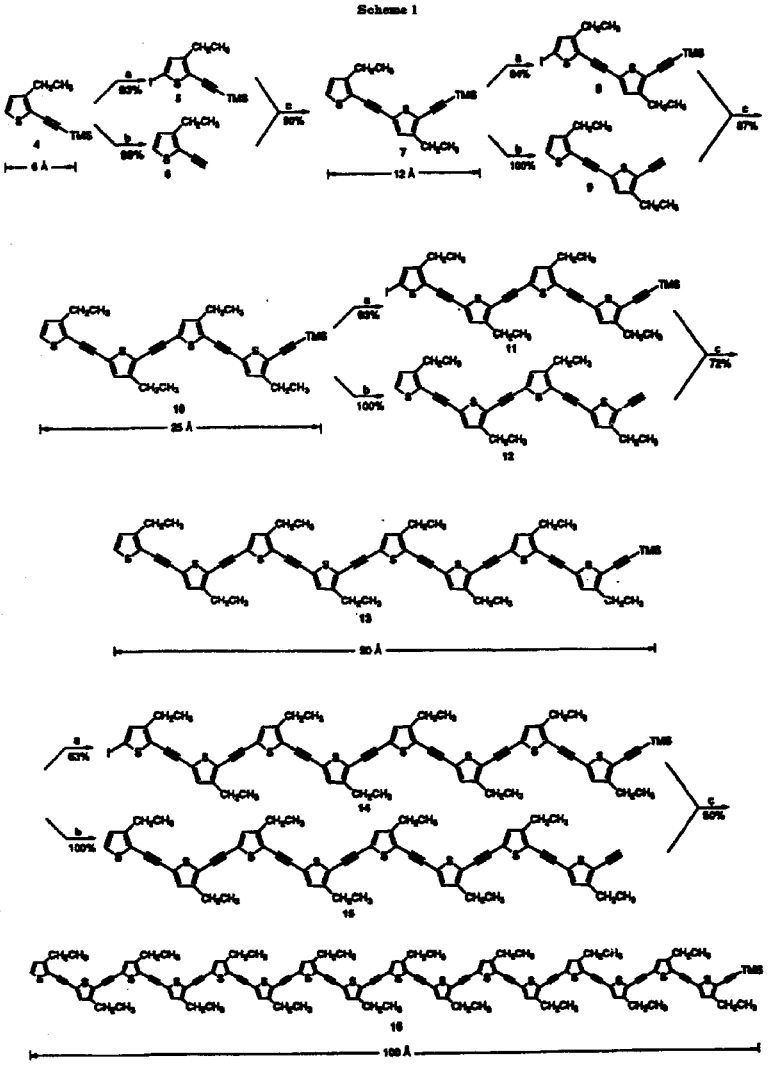

2350 Communications to the Editor

Supplementary Material Available: Detailed synthetic procedures and characterization data for conversion of 1 to 16 (7 pages). Ordering information is given on any current masthead page.

References and Notes

(1) (a) *Molecular Electronics: Science and Technology*; Aviram, A., Ed.; Conference Proceedings No. 262; American Institute of Physics: New York, 1992. (b) *Molecular Electronic Devices II*; Carter, F. L., Ed.; Marcel Dekker: New York, 1984. (c) Hameroff, S. R. *Ultimate Computing. Biomolecular Consciousness and Nano Technology*; North Holland: Amsterdam, The Netherlands, 1987. (d) Miller, J. S. *Adv. Mater.* 1990, *2*, 378. (e) Aviram, A. *J. Am. Chem. Soc.* 1988, *110*, 5687. (f) Hush, N. S.; Wong, A. T.; Bacskay, G. B.; Reimers, J. R. *J. Am. Chem. Soc.* 1990, *112*, 4192. (g) Farazdel, A.; Dupuis, M.; Clementi, E.; Aviram, A. *J. Am. Chem. Soc.* 1990, *112*, 4206. (h) Waldeck, D. H.; Beratan, D. N. *Science* 1993, *261*, 576. (i) Ball, P.; Garwin, L. *Nature* 1992, *355*, 761. (j) Tour, J. M.; Wu, R.; Schumm, J. S. *J. Am. Chem. Soc.* 1991, *113*, 7064.

(2) *Handbook of Conducting Polymers*; Skotheim, T. A., Ed.; Dekker: New York, 1986.

(3) (a) Miller, J. S. *Adv. Mater.* 1990, *2*, 495, 601. (b) Chjatterji, P. K.; Yang, P.; Schichijo, H. *Proc. IEEE* 1983, *130*, 105. (c) Bate, R. T. In *VSLI Electronics*; Einspruch, N. G., Ed.; Academic: San Diego, 1982; Vol. 5.

(4) (a) Reed, M. A., Yale University, personal communication, 1993. (b) *Nanostructure Physics and Fabrication*; Reed, M. A., Kirk, W. P., Eds.; Academic Press: San Diego, 1989. (c) *Nanostructures and Mesoscopic Systems*; Kirk, W. P., Reed, M. A., Eds.; Academic: San Diego, 1992.

(5) An iterative doubling approach was first described by Whiting and then later used by Moore to prepare oligo(1,3-phenyleneethynylenes). See: (a) Igner, E.; Paynter, O. I.; Simmonds, D. J.; Whiting, M. C. *J. Chem. Soc., Perkin Trans. 1* 1987, 2447. (b) Bidd, I.; Kelly, D. J.; Ottley, P. M.; Paynter, O. I.; Simmonds, D. J.; Whiting, M. C. *J. Chem. Soc., Perkin Trans. 1* 1983, 1369. (c) Zhang, J.; Moore, J. S.; Xu, Z.; Aguirre, R. A. *J. Am. Chem. Soc.* 1992, *114*, 2273. (d) Xu, Z.; Moore, J. S. *Angew. Chem., Int. Ed. Engl.* 1993, *32*, 1354. For related oligomers and polymers, see: (e) Grubbs, R. H.; Kratz, D. *Chem. Ber.* 1993, *126*, 149. (f) Scherf, U.; Müllen, K. *Synthesis* 1992, 23.

(6) For a presentation of some foundational work in the area of "molecular wires", see: (a) Kenny, P. W.; Miller, L. L. *J. Chem. Soc., Chem. Commun.* 1988, 85. (b) Kugimiya, S.-i.; Lazrak, T.; Blanchard-Desce, M.; Lehn, J.-M. *J. Chem. Soc., Chem. Commun.* 1991, 1179. (c) Crossley, M. J.; Burn, P. L. *J. Chem. Soc., Chem. Commun.* 1991, 1569. (d) Zecavic, S.; Simic-Glavaski, B.; Yeager, E. *J. Electroanal. Chem.* 1985, *196*, 339. (e) Yoshimura, T.; Tatsuura, S.; Sotoyama, W.; Matsuura, A.; Hayano, T. *Appl. Phys. Lett.* 1992, *60*, 268. (f) Sessler, J. L.; Capuano, V. L.; Harriman, A. *J. Am. Chem. Soc.* 1993, *115*, 4618. (g) Tachibana, H.; Azumi, R.; Nakamura, T.; Matsumoto, M.; Kawabata, Y. *Chem. Lett.* 1992, 173. (h) O'Neil, M. P.; Niemczyk, M. P.; Svec, W. A.; Gosztola, D.; Gaines, G. L., III; Wasielewski, M. R. *Science* 1992, *257*, 63. (i) Wudl, F.; Bitler, S. P. *J. Am. Chem. Soc.* 1986, *108*, 4685. (j) Lu, F.-L.; Wudl, F.; Nowak, M.; Heeger, A. J. *J. Am. Chem. Soc.* 1986, *108*, 8311.

(7) (a) Guay, J.; Diaz, A.; Wu, R.; Tour, J. M.; Dao, L. H. *Chem. Mater.* 1992, *4*, 254. (b) Tour, J. M.; Wu, R. *Macromolecules* 1992, *25*, 1901. (c) Guay, J.; Kasai, P.; Diaz, A.; Wu, R.; Tour, J. M.; Dao, L. H. *Chem. Mater.* 1992, *4*, 1097.

(8) (a) Tamao, K.; Kodama, S.; Nakajima, I.; Kumada, M.; Minato, A.; Suzuki, K. *Tetrahedron* 1982, *38*, 3347. (b) Uhlenbroek, J. H.; Bijloo, J. D. *Recl. Trav. Chim. Pays-Bas* 1960, *79*, 1181. (c) Sonogashira, K.; Tohda, Y.; Hagihara, N. *Tetrahedron Lett.* 1975, 4467. (d) Stephens, R. D.; Castro, C. E. *J. Org. Chem.* 1963, *28*, 3313. (e) Suffert, J.; Ziessel, R. *Tetrahedron Lett.* 1991, *32*, 757. (f) Xu, Z.; Moore, J. S. *Angew. Chem., Int. Ed. Engl.* 1993, *32*, 1354.

(9) The minimization was done using MMX with extended π-Hückel and multiconformational parameters (10° arylalkynyl bond rotational steps).

Appendix G

Macromol. Symp. 77, 389-394 (1994)  JANUARY, 1994

SYNTHESIS OF PLANAR POLY(p-PHENYLENE) DERIVATIVES FOR MAXIMIZATION OF EXTENDED π-CONJUGATION

James M. Tour* and Jaydeep J. S. Lamba
Department of Chemistry and Biochemistry
University of South Carolina
Columbia, South Carolina 29208

Abstract: Described is the synthesis of a ladder polymer with a poly(p-phenylene) (PPP) backbone. The main PPP backbone was synthesized via palladium-catalyzed coupling of an arylbis(boronic ester) with an aryl dibromide. Imine bridges, formed by exposure of the polymer to trifluoroacetic acid, are used to force the consecutive units into planarity. The bridging units are sp² hybridized thus allowing for greater π-electron flow between the consecutive phenyl units by lowering the band gap between the hydroquinoidal and the quinoidal forms of the phenylene backbone. When the bridges are n-dodecyl substituted, the fully planar structures (with $M_n$ < 5 000) are soluble in hot chlorobenzene from which flexible free standing films can be cast. The n-butyl substituted polymers and the higher molecular weight n-dodecyl substituted polymers are soluble in $CH_2Cl_2$/trifluoroacetic acid mixtures. The optical spectra of the planar systems are compared to that of the parent nonplanarized polymers, some analogous planar oligomers, and oligo(p-phenylenes).

INTRODUCTION

Poly(p-phenylene) (PPP),[1] a highly insoluble polymer that has been studied extensively for its possible electronic and photonic applications, has a 23° twist[1c,2] between the consecutive aryl units due to ortho hydrogen interactions (Fig 1). Attempts to enhance the solubility by substitution of the Figure 1     Figure 2 

rings forces the consecutive aryl units even further out of plane resulting in a plummet of the extended conjugation (easily observed by the optical spectra).[1i-k] Here we describe a synthetic route to ladder[3] PPP derivatives with bridges that (1) form in high yields upon protonic activation once the PPP backbone is intact, (2) can be substituted so that the newly formed polymer is soluble and processable, unlike many other aromatic ladder © 1994 Hüthig & Wepf Verlag, Basel    CCC 1022-1360/94/$ 04.00 polymers, and (3) contain a double-bonded unit to keep the consecutive aryl units planar while maximizing extended π-conjugation through the PPP backbone thereby increasing the band width (lowering the band gap) between the hydroquinoidal and quinoidal forms (Fig 2).1c

RESULTS AND DISCUSSION

In order to accomplish the required synthesis, we proposed to use the efficient palladium-catalyzed cross coupling reaction of arylmetals with aryl halides to form the initial phenylene portion of the backbone. Acknowledging that introducing functionalities onto the rigid-rod polymer backbones in high yields would be extremely difficult with current synthetic architectural methodologies, we sought to have all the bridging atoms and the solubilizing substituents in place within the monomers prior to the initial aryl-aryl cross coupling reaction. The approach involved formation of an imine bridge between the newly formed consecutive aryl units where the carbon atom in the imine bridge would bear the needed long-chain solubilizing substituent without obstructing the cross coupling reaction (Scheme 1, M = metal). Moreover, imine formation would be nearly Scheme 1

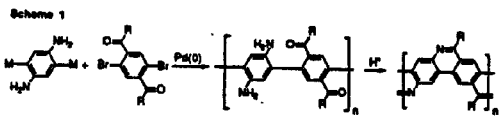

quantitative upon protonic activation and imines possess the π-bond needed to enhance the extended π-conjugation between the consecutive phenylene units. The additional beauty of this approach is that if solubility of the planar system did turn out to be a problem, one could cast films of the pre-cyclized material, introduce an acid catalyst, and promote the imine formation (cyclization) on the intact films. We also chose to keep the halides on the partner since oxidative addition with palladium(0) catalysts is facilitated by electron withdrawing groups on the ring and retarded by electron donating groups such as amines.

We then embarked on several model studies to make imine-bridged phenylene dimers and trimers. Several requirements became obvious. First, the cross coupling reactions were far more efficient with boric acids and esters than with trialkylstannanes as the metal-containing aryl partner. Though Grignard and zinc reagents have been utilized with great success in cross coupling reactions, our need to purify the intermediates for obtention of 99.9+% pure monomers for the step growth polymerization was paramount. The more electropositive metals like magnesium and zinc do not permit simple chromatographic purification due to rapid protonation of the arylmetal intermediates. Secondly, though the boronic acids can be purified and cross coupled in very high yields, the bis(boronic) acids (i.e. where M = B(OH)$_2$ in Scheme 1) were very difficult to produce in the required purities needed for the step growth polymerization. Hence we chose to use the bis(boronic) esters as a suitable alternative. We eventually converged on several nearly quantitative model reactions using tetrakis(triphenylphosphine)palladium(0) catalysis in alkaline 1,2-dimethoxyethane (DME) for the cross coupling followed by protonic removal of a tert-butoxycarbonyl (BOC) protected amine with concomitant imine bridge formation.

We then synthesized two key monomers needed for the desired planar ladder polymers (eqs 1 and 2).[4,5] Interestingly, while 3 was nearly insoluble

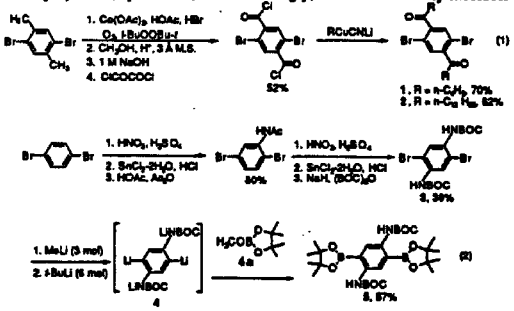

in diethyl ether, it could be tetralithiated in ether to form a soluble intermediate 4 in almost quantitative yield (checked by addition of chlorotrimethylsilane and isolation of the arylbis(silane) after aqueous work-up). Treatment of 4 with methyl pinacol borate 4a afforded the crystalline monomer 5.6

Reaction of 1 or 2 with 5 yielded the soluble polymers 6 and 7, respectively, from which size-exclusion chromatography (SEC) could be used to determine the hydrodynamic volumes relative to polystyrene (6: 45% yield after fractional precipitation, $M_n$ = 6 180 with $M_w/M_n$ = 2.32; 7: 73-78% yield after fractional precipitation, $M_n$ = 4 370-13 280 with $M_w/M_n$ = 1.78-2.60). Upon exposure of 6 or 7 to trifluoroacetic acid (TFA), quantitative loss of the BOC protecting group and cyclization afforded 8 and 9,

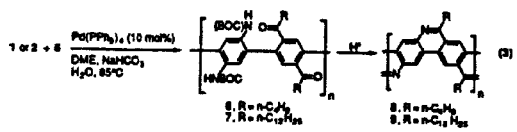

respectively (eq 3).[7] 9 (from samples with $M_n$< 5 000 for the uncyclized precursor 7) can be dissolved in hot chlorobenzene and cast into flexible free-standing films. The dodecyl groups are apparently exerting a plasticizing effect so that the planar rigid-rod polymer can be made to exhibit good film-forming properties. 8 and higher molecular weight samples of 9 can be solubilized with CH2Cl2/TFA mixtures.

Powder X-ray diffraction (XRD) of the unannealed 8 and 9 showed a broad pattern approximately 3.4 and 4.7 Å, respectively (weak and possibly characteristic of the π-stacking distance), and strong sharp peaks at 15.4 and 29.9 Å, respectively, characteristic of a smectic glass-like order. Differential scanning calorimetry (DSC) (50-350°C, 20°C/min, N2) of 9 ($M_n$ = 4 370, $M_w/M_n$ = 1.87) showed a single exotherm at 200°C on the first run while the DSC curve was featureless on the second run. Thermogravimetry (TG) (50-900°C, 20°C/min, N2) of 9 ($M_n$ = 4 370, $M_w/M_n$ = 1.87) showed no weight loss up to 240°C, 10% weight loss at 440°C, and 62% weight loss at 900°C. Most interesting is the optical absorption data showing enormous bathochromic shifts in the polymer upon cyclization (conversion of 6 to 8 and 7 to 9) (Table I). The absorbances of these planar polymers are far greater than those of oligo(p-phenylenes) or PPP.

Thus we succeeded in greatly increasing the extended π-conjugation of PPP derivatives while maintaining a soluble polymeric material. Further methods to enhance the extended π-conjugation in related aromatic structures are currently under investigation.

Table I

| Compound ($M_n$; $M_w/M_n$) | Absorbance (CH$_2$Cl$_2$) (nm)[a] |
|---|---|
| 6 (6 180; 2.32) | 250, 320 (sh) |
| 7 (4 370; 1.87) | 250, 314 (sh) |
| 7 (13 280; 2.60) | 250, 308(sh), 364 (sh) |
| [structure: n-C₄H₉-substituted fused ring] | 300 (ref 8) |
| [structure: N-containing fused ring with n-C₄H₉ groups] | 294 (ref 8) |
| 8 (6 180; 2.32)[c] | 374 (sh), 396, 425 (sh), 514, 555 (ed)[d] |
| 9 (4 370; 1.87)[c] | 392, 488, 525 (ed)[d] |
| 9 (13 280; 2.60)[c] | 376 (sh), 400, 428 (sh), 516, 560 (ed)[d] |
| p-heptiphenylene | 323 (ref 9) |
| PPP (calcd infinite $M_n$) | 344 (ref 9) |

[a] $\lambda_{max}$ is underlined, (sh) is shoulder, (ed) is tailing edge at approximately 10% of $\lambda_{max}$ intensity. [b] Also a strong carbonyl absorbance at 196 nm. [c] These molecular weights and polydispersities are from the uncyclized precursors. [d] Recorded in a mixture of CH$_2$Cl$_2$ and trifluoroacetic acid.

ACKNOWLEDGEMENTS

J.M.T. acknowledges support from the Office of the Naval Research, Young Investigator Award Program (1989-92), the Defense Advanced Research Projects Agency, the National Science Foundation (EHR-91-08772, DMR-9158315), and generous industrial contributors to the NSF Presidential Young Investigator Award (1991-96): Hercules Incorporated, IBM Corporation, Ethyl Corporation, and the Shell Development Company. We also thank Molecular Design Ltd. for the use of their synthetic data base.

REFERENCES AND NOTES (1) For some recent reviews on polyphenylene, see: (a) Kovacic, P.; Jones, M. B. *Chem. Rev.* 1987, *87*, 357. (b) Noren, G. K.; Stille, J. K. *Macromol. Rev.* 1971, 5, 385. (c) Elsenbaumer, R. L.; Shacklette, L. W. In *Handbook of Conducting Polymers*; Skotheim, T. A., Ed.; Dekker: New York, 1986. (d) Tourillion, G. in ref 1c. (e) Baughman, R. H.; Brédas, J. L.; Chance, R. R.; Elsenbaumer, R. L.; Shacklette, L. W. *Chem. Rev.* 1982, *82*, 209. For some recent advances in polyphenylene synthesis, see: (f) Ballard, D. G. H.; Courtis, A.; Shirley, I. M.; Taylor, S. C. *Macromolecules* 1988, *21*, 294. (g) Wallow, T. I.; Novak, B. M. *J. Am. Chem. Soc.* 1991, *113*, 7411. (h) Gin, D. L.; Conticello, V. P.; Grubbs, R. H. *J. Am. Chem. Soc.* 1992, *114*, 3167. (i) Heitz, W. *Polym. Prepr. (Am. Chem. Soc., Div. Polym. Chem.)* 1991, *32*(1), 327. (j) Percec, V.; Pugh, C.; Cramer, E.; Weiss, R. *Polym. Prepr. (Am. Chem. Soc., Div. Polym. Chem.)* 1991, *32*(1), 329. (k) Tour, J. M.; Stephens, E. B.; Davis, J. F. *Macromolecules* 1992, *25*, 499.

(2) (a) Brédas, J. L. in ref 1c. (b) Ferraris, J. P.; Andrus, R. G.; Hmcir, D. C. *J. Chem. Soc., Chem. Commun.* 1989, 1318. (c) Gorman, C. B.; Ginsburg, E. J.; Moore, J. S.; Grubbs, R. H. *Polym. Prepr. (Am. Chem. Soc., Div. Polym. Chem.)* 1991, *32*(3), 714.

(3) For some discussions of aromatic ladder polymers, see: (a) Schlüter, A.-D. *Adv. Mater.* 1991, *3*, 282. (b) Yu, L.; Chen, M. Dalton, L. R. *Chem. Mater.* 1990, *2*, 649. (c) Hong, S. Y.; Kertesz, M.; Lee, Y. S.; Kim, O.-K. *Chem. Mater.* 1992, *4*, 378. (d) Godt, A.; Schlüter, A.-D. *Adv. Mater.* 1991, *3*, 497. (e) Yu, L.; Dalton, L. R. *Macromolecules* 1990, *23*, 3439. (f) Scherf, U.; Müllen, K. *Macromolecules* 1992, *25*, 3546.

(4) (a) Miyaura, N.; Yanagi, T.; Suzuki, A. *Synth. Commun.* 1981, *11*, 513. (b) Siddiqui, M. A.; Snieckus, V. *Tetrahedron Lett.* 1988, *29*, 5463. (c) Gronowitz, S.; Lawitz, K. *Chem. Scripta* 1984, *24*, 5.

(5) (a) Hay, A. S.; Blanchard, H. S. *Canad. J. Chem.* 1965, *43*, 1306. (b) Doornbos, T.; Strating, J. *Org. Prep. Proced.* 1969, *1*, 287.

(6) The arylbis(boronic acid) analog of 5 could not be adequately purified for the step growth polymerization.

(7) The twist in 8 and 9 is <1° between the consecutive phenyl rings calculated by MMX with extended π-Hückel parameters.

(8) The planar trimers were prepared during our model studies.

(9) Ried, W.; Freitag, D. *Angew. Chem. Intern. Ed. Engl.* 1968, *7*, 835.

Appendix H

Polym. Prepr. (Am. Chem. Soc., Div. Polym. Chem.) 1994, 35(1), 202-203. March, 1994

Potential Molecular Wires by an Iterative Divergent/Convergent Approach. Doubling of Molecular Length at Each Iteration.

Darren L. Pearson, Jeffry S. Schumm, LeRoy Jones II, and James M. Tour*

Department of Chemistry and Biochemistry
University of South Carolina
Columbia, South Carolina 29208

The ultimate computational system would consist of logic devices that are ultra dense, ultra fast, and molecular-sized.[1] We recently described the synthesis of two orthogonally fused conducting oligomers that may possess device functions.[2] However, before we can address the device-like properties, there is a more fundamental question; namely, can a single organic molecule even conduct electricity?[3] Though bulk organic materials can indeed be semiconducting or even conducting,[4] electronic conduction based upon single or small packets of molecules has not been demonstrated and it is theoretically controversial.[1,5] Present nanopatterning techniques allow lithographic probe assemblies to be engineered down to the 100 Å gap regime.[6] In an attempt to span this 100 Å gap with molecules and to assess the feasibility of molecular wire conduction, we describe here a new rapid synthetic approach to potential molecular wires based on oligo(thiophene-ethynylene) and oligo(phenylene-ethynylene) derivatives.

Others have constructed well-defined homogeneous conjugated oligomers up to 75 Å long.[3] Our approach to such compounds is different in that it maintains several key features that make it well-suited for the requisite molecular frameworks for molecular electronics study. Specifically, our route involves (1) a novel rapid construction method that permits doubling molecular length at each coupling stage to rapidly afford a 100 Å and 128 Å oligomer, (2) an iterative approach so that the same high yielding reactions can be used throughout the sequence, (3) the synthesis of conjugated compounds that are known to be semiconducting in the bulk,[7] (4) products that are stable to light and air so that subsequent engineering manipulations will not be impeded, (5) products that could easily permit independent functionalization of the ends to serve as "molecular alligator clips" that might be required for surface contacts to metal probes (for example, an end group containing a thiol would bond to a gold surface)[8] (6) products that are rigid in their frameworks so as to minimize conformational flexibility yet containing substituents for maintaining solubility and processability, and finally, (7) products that serve as useful models for the understanding of bulk polymeric materials.[9]

The synthesis of the key monomer 4, whose length will double at each stage, is below.[10] The iterative divergent/convergent

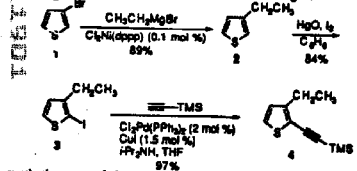

synthetic approach is outlined in Scheme I. The sequence involves partitioning 4 into two portions; iodinating the 5-position in one of the portions to form 5 and protodesilylating the alkynyl end of the second portion to form 6. Bringing the two portions back together in the presence of a Pd/Cu catalyst[10c-f] couples the aryl iodide to the terminal alkyne, thus generating the dimer 7. Iteration of this reaction sequence doubles the length of the dimer 7 to afford the tetramer 10, and so on to the octamer 13, and finally the 16-mer 16.

The monomer through 16-mer, 4, 7, 10, 13, and 16, have been fully characterized. In every case, they are of ≥97% purity. While the monomer through octamer afforded molecular ions by direct exposure via electron impact mass spectrometry (MS), neither this method nor FAB or electrospray MS sufficed for obtaining a molecular ion of 16. However, matrix assisted laser desorption MS did afford an M+1 peak for 16 [Calc'd M (isotopic maximum with two $^{13}$C) + 1= 2221.37. Found peak maximum = 2219.98 ±1.20].

The optical spectra are interesting in that a near saturation of the systems appears to have occurred by the octamer stage so that doubling the conjugation length to the 16-mer caused little change in the absorbance maximum. The results of the size exclusion chromatography (SEC) are also quite intriguing. SEC is not a direct measure of molecular weight but a measure of the hydrodynamic volume. Thus, by SEC using randomly coiled polystyrene standards, the number average molecular weights ($M_n$) of rigid rod polymers are usually greatly inflated relative the the actual molecular weights (MW). Accordingly, the SEC recorded $M_n$ values of the octamer (13) ($M_n$ = 1610, actual MW= 1146) and 16-mer (16) ($M_n$ = 3960, actual MW= 2220) were much greater than the actual MWs. Conversely, the monomer (4) through tetramer (10) had $M_n$ values that were very close to the actual because they are in the low MW region, prior to significant polystyrene coiling. In all cases, the SEC-determined values of $M_w/M_n$ = 1.02-1.05 were within the detectable range limits.

We have recently synthesized an analogous oligo(phenylene-ethynylene) (17) by a similar route.

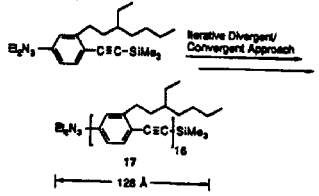

We have also synthesized a series of end groups (18-21) that will serve as molecular alligator clips. These end groups, upon

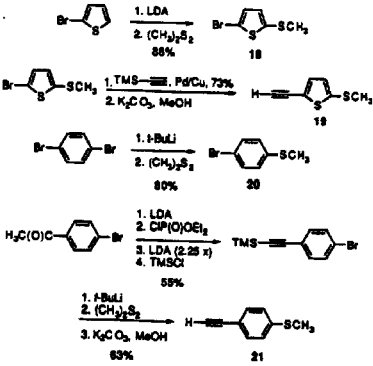

demethylation to the free thiols, will attach the ends of the molecules between the gold-coated probe surfaces as shown on Figure 1.

In summary, we have demonstrated the utility of this iterative divergent/convergent approach to the synthesis of very large molecular frameworks. We are presently synthesizing near-$sp^2$-orbital matched arrays involving oligo(thiophene-ethenylene)s and oligo(phenylene-ethenylene)s.

Acknowledgments. We are grateful for support from the Office of Naval Research and the Advanced Research Projects Agency. Dr. Kevin Schey at the Medical University of South Carolina kindly obtained the laser desorption MS of 16. We also thank Molecular Design Ltd. for the use of their synthetic data base.

References (1) (a) Bowden, M. J. In *Electronic and Photonic Applications of Polymers*; Bowden, M. J.; Turner, S. R., Eds.; (Advances in Chemistry, 218) American Chemical Society: Washington DC, 1988. (b) *Molecular Electronics: Science and Technology*, Aviram, A., Ed.; Confer. Proc. No. 262, American Institute of Physics: New York, 1992. (c) *Molecular Electronic Devices II*; Carter, F. L., Ed.; Marcel Dekker: New York, 1984. (d) Hameroff, S. R. *Ultimate Computing. Biomolecular Consciousness and Nano Technology*; North Holland: Amsterdam, 1987. (e) Franks, A. *J. Phys. E: Sci Instrum.* 1987, 20, 1442. (f) Miller, J. S. *Adv. Mater.* 1990, 2, 495, 601. (g) Aviram, A. *J. Am. Chem. Soc.* 1988, 110, 5687. (h) Hush, N. S.; Wong, A. T.; Bacskay, G. B.; Reimers, J. R. *J. Am. Chem. Soc.* 1990, 112, 4192. (i) Farazdel, A.; Dupuis, M.; Clementi, E.; Aviram, A. *J. Am. Chem. Soc.* 1990, 112, 4206. (j) Waldeck, D. H.; Beratan, D. N. *Science* 1993, 261, 576. (k) Ball, P., Garwin, L. *Nature* 1992, 355, 761.
(2) (a) Tour, J. M.; Wu, R.; Schumm, J. S. *J. Am. Chem. Soc.* 1991, 113, 7065. (b) Tour, J. M.; Wu, R.; Schumm, J. S. *J. Am. Chem. Soc.* 1990, 112, 5662. (c) Guay, J.; Diaz, A.; Wu, R.; Tour, J. M. *J. Am. Chem. Soc.* 1993, 115, 1869.
(3) *Handbook of Conducting Polymers*; Skotheim, T. A., Ed.; Dekker: New York, 1986.
(4) For a presentation of some foundational work in the area, see: (a) Kenny, P. W.; Miller, L. L. *J. Chem. Soc., Chem. Commun.* 1988, 85. (b) Kugimiya, S.-i.; Lazrak, T.; Blanchard-Desce, M.; Lehn, J.-M. *J. Chem. Soc., Chem. Commun.* 1991, 1179. (c) Crossley, M. J.; Burn, P. L. *J. Chem. Soc., Chem. Commun.* 1991, 1569. (d) Zecevic, S.; Simic-Glavaski, B.; Yeager, E. *J. Electroanal. Chem.* 1985, 196, 339. (e) Yoshimura, T.; Tatsuura, S.; Sotoyama, W.; Matsuura, A.; Hayano, T. *Appl. Phys. Lett.* 1992, 60, 268. (f) Sessler, J. L.; Capuano, V. L.; Harriman, A. *J. Am. Chem. Soc.* 1993, 115, 4618. (g) Tachibana, H.; Azumi, R.; Nakamura, T.; Matsumoto, M.; Kawabata, Y. *Chem. Lett.* 1992, 173. (h) O'Neil, M. P.; Niemczyk, M. P.; Svec, W. A.; Gosztola, D.; Gaines, G. L., III; Wasielewski, M. R. *Science* 1992, 257, 63.
(5) (a) Miller, J. S. *Adv. Mater.* 1990, 2, 378. (b) Chjaterji, P. K.; Yang, P. Schichijo, H. *Proc. IEEE* 1983, 130, 105, (c) Bate, R. T. In *VSLI Electronics*, Einspruch, N. G., Ed.; Academic: San Diego, 1982; Vol 5.
(6) (a) Reed, M. A., Yale University, personal communication, 1993. (b) *Nanostructure Physics and Fabrication*, Reed, M. A.; Kirk, W. P., Eds.; Academic Press: San Diego, 1989. (c) *Nanostructures and Mesoscopic Systems*, Kirk, W. P.; Reed, M. A., Eds.; Academic: San Diego, 1992.
(7) Rutherford, D. R.; Stille, J. K.; Elliott, C. M. *Polym. Prepr. (Am. Chem. Soc., Div. Polym. Chem.)* 1990, 31(2), 643.
(8) (a) Abbott, N. L.; Folkers, J. P.; Whitesides, G. M. *Science* 1992, 257, 1380. (b) Charych, D. H.; Bednarski, M. D. *Mater. Res. Soc. Bull.* 1992, 17(11), 61.
(9) (a) Guay, J.; Diaz, A.; Wu, R.; Tour, J. M.; Dao, L. H. *Chem. Mater.* 1992, 4, 254. (b) Tour, J. M.; Wu, R. *Macromolecules* 1992, 25, 1901. (c) Guay, J.; Kasai, P.; Diaz, A.; Wu, R.; Tour, J. M.; Dao, L. H. *Chem. Mater.* 1992, 4, 1097.
(10) (a) Kumada, M.; Suzuki, K.; Tamao, K.; Kodama, S.; Nakajima, I.; Minato, A.; *Tetrahedron* 1982, 38, 3347. (b) Uhlenbroek, J. H.; Bijloo, J. D. *Rec. Trav. Chim.* 1960, 79, 1181. (c) Sonogashira, K.; Tohda, Y.; Hagihara, N. *Tetrahedron Lett.* 1975, 4467. (d) Stephens, R. D.; Castro, C. E. *J. Org. Chem.* 1963, 28, 3313. (e) Suffert, J.; Ziessel, R. *Tetrahedron Lett.* 1991, 32, 757. (f) Xu, Z.; Moore, J. S. *Angew. Chem., Int. Ed. Engl.* 1993, 32, 1354.

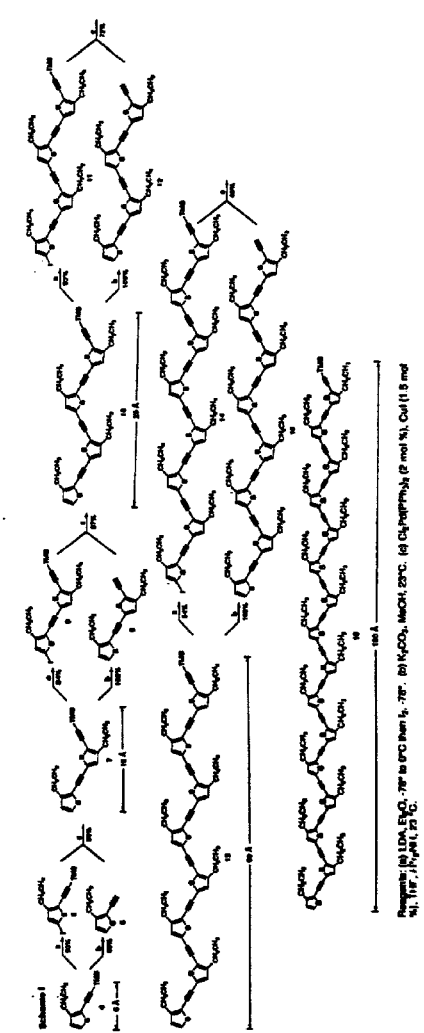

Appendix I

Polym. Prepr. (Am. Chem. Soc., Div. Polym. Chem.) 1993, 34, 368. August 1993

Synthesis of Molecular Wires by a Novel Divergent/Convergent Approach

James M. Tour* and Jeffry S. Schumm
Department of Chemistry and Biochemistry
University of South Carolina
Columbia, South Carolina 29208

Since the time of the first room-filling computers, there has been a tremendous drive to compress the size of computing instruments. In order to bring this desire to its extreme, it was conceived that one may be able to construct a single molecule that could function as a self-contained electronic device.[1] We have identified an approach which would allow the rapid synthesis of conjugated oligomers ("molecular wires") through the use of a novel divergent/convergent synthetic approach. Here we outline a methodology that should permit the rapid synthesis of molecular wires with dimensions needed for adhesion between a patterned electronic assembly. Hence, the feasibility of conduction on single or small molecular arrays may soon be experimentally addressed.

A schematic representation of the conducting system that we hope to construct is shown below. The nonofabricated portion will consist of two metallic probes on opposite sides of a selected binding surface. The target molecules may be spontaneously deposited, by self-assembly, from solution onto the binding surface and will bridge the gap between the metallic contacts by selectively attaching to the two metal probes. Ultimately, the "molecular alligator clips" will be, for example, thiols which will bind to gold probes, while the "molecular staples" could be hydroxyl groups that would bind to an oxide surface below.

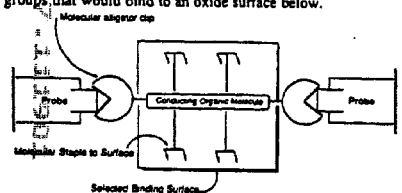

The conjugated oligomers that we are constructing are well-defined homogeneous materials that are fully characterized. We hope to ultimately construct oligomers ~100 Å long; on the order of the resolution of current patterning techniques. Additionally, we hope to construct oligomers that are air and light stable to facilitate the assembly and fabrication.

An outline of the synthetic sequence is shown in Scheme 1. The synthesis of the oligomers begins with the formation of a monomer unit with different functional groups on the ends. The ends must be complimentary so that they will undergo a coupling reaction to give a dimeric species. The dimer would then be divided into two portions, the ends converted to the aforementioned complimentary end units, then coupled to afford the tetrameric species. This process would then continue until the desired length of "molecular wire" is reached by doubling the length of the oligomer at each coupling stage.

The synthesis of the first oligomer (Scheme 2) began

Scheme 1

X—A—Y
↓
X—A-A—Y
↓
X—A-A-A-A—Y
↓
X—A-A-A-A-A-A-A-A—Y
↓
X—A-A-A-A-A-A-A-A-A-A-A-A-A-A-A-A—Y

Scheme 2

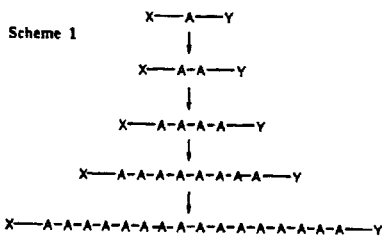

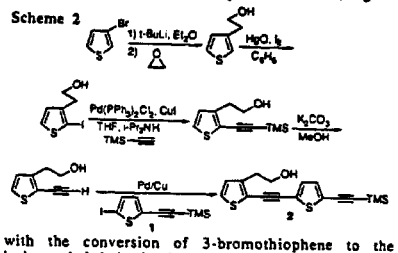

with the conversion of 3-bromothiophene to the hydroxyethyl derivative by the use of t-butyllithium and ethylene oxide. The subsequent alcohol was cleanly iodinated by the procedure of Uhlenbroek[2] in 81% yield. The iodide was then coupled with trimethylsilylacetylene in the presence of Pd(0) and Cu(I) in 81% yield.[3] The new alkyne was then deprotected with K$_2$CO$_3$ in methanol and coupled with alkyne 1 in the presence of a Pd(0)/Cu(I) catalyst to afford 2 in 51% yield. 1 was prepared as shown in eq 1.

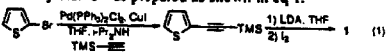

It was necessary to take one half of 2 and protect the alcohol in order to cleanly iodinate the terminal thiophene unit. A second portion of 2 had the terminal trimethylsilyl unit removed with fluoride and the two halves are then coupled under Pd(0)/Cu(I) conditions[3] to afford the tetramer (Scheme 3). We experienced some problems with decomposition of the free acetylene at the dimer stage and again upon deprotection of the tetramer. This problem occurred regardless of the method of deprotection (K$_2$CO$_3$/MeOH or TBAF/THF) on the dimer and tetramer. Oxidative coupling afforded a head-to-head dimer ~50 Å long. Based on these results, we began investigating a phenylene-ethynylene system which should be more stable to air but would still allow for the divergent/convergent synthetic approach.

The synthesis of the phenylene-ethynylene monomer is shown in Scheme 4. Reduction of 3'-aminoacetophenone Scheme 3

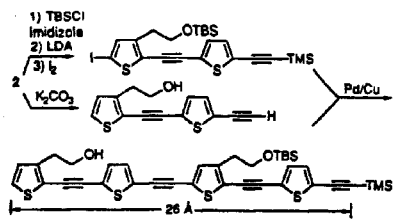

afforded a nearly quantitative yield of the 3-ethylaniline which was protected with acetic anhydride in 86% yield (over 2 steps). The acylation was accomplished in 50% yield after purification by flash chromatography.[4] The acetamide was then deprotected with hot 3 N HCl in quantitative yield.[5] The next step in the synthetic sequence was the functional interconversion of the amine to a group that could function both as a protecting group and be converted to a halogen for cross-coupling. Moore has shown that amines can be converted to triazenes through the diazonium ion.[6] This was accomplished with NaNO$_2$ followed by quenching with HNEt$_2$ to afford the triazene in 95% yield. The ketone was then converted to the silylalkyne 3 via the phosphate enolate.[7]

Scheme 4

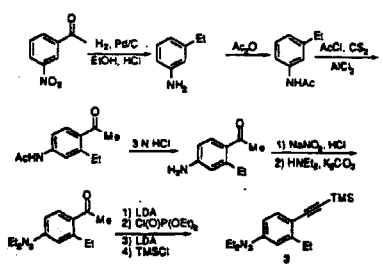

With the synthesis of the monomer unit 3 completed, the divergent/convergent route could be conducted (Scheme 5). Monomer 3 was divided into two parts and the first part was iodinated to afford 4 in 74% yield. The other portion of 3 was deprotected to give the 5 in 98% yield.
Coupling of 4 and 5 afforded the dimer 6 in 70% yield. The rest of the sequence proceeded in a similar fashion to afford the tetramer 7. From tetramer 7 (30 Å long) we have carried out the dimerization in an attempt to make the octameric species which is 60 Å long. However, the insolubility of the system prevented adequate characterization and it became evident that a more soluble system would be needed if we were to ultimately synthesize the desired 16-mer. Therefore, we are currently investigating a similar synthesis with other side chains that would enhance the Scheme 5

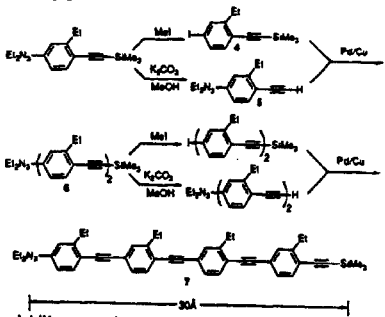

solubility properties at the larger oligomeric stages.

In conclusion, we have developed a synthetic sequence that allows the rapid formation of some well-characterized oligomers of know constitution and length for use in nanofabrication technology. This novel divergent/convergent procedure should be amenable to other such systems.

Acknowledgments. We are grateful for support from the Office of Naval Research, the Defense Advanced Research Projects Agency, the National Science Foundation (EHR-91-08772, DMR-9158315), and generous industrial contributors to the NSF Presidential Young Investigator Award (1991-96): Hercules, IBM, Ethyl, Shell, and Eli Lilly Corporations. We also thank Molecular Design Ltd. for the use of their synthetic data base.

1) a. Bowden, M. J. in *Electronics and Photonic Applications of Polymers*; Bowden, M. J.; Turner, S. R., Eds.; (Advances in Chemistry, 218) American Chemical Society: Washington DC, 1988. b. *Molecular Electronic Devices*; Carter, F. L., Ed.; Marcel Dekker: New York, 1982. c. *Molecular Electronic Devices II*; Carter, F. L., Ed.; Marcel Dekker: New York, 1984. d. For a recent presentation of the potential and obstacles for molecular electronic device fabrication, see: Miller, J. S. *Adv. Mater.* 1990, 2, 378, 495, 601.
2) Uhlenbroek, J. H.; Bijloo, J. D. *Rec. Trav. Chim.* 1960, 79, 1181.
3) Suffert, J.; Ziessel, R. *Tetrahedron Lett.* 1991, 32, 757.
4) Oki, M. *Bull. Chem. Soc. Jpn.* 1957, 30, 508.
5) Khorana, H. G.; Turner, A. F.; Vizsolyi, J. P. *J. Am. Chem. Soc.* 1961, 83, 686.
6) a) Moore, J. S.; Zhang, J.; Aquirre, R. A. *J. Am. Chem. Soc.* 1992, 114, 2273. b) Moore, J. S.; Weinstein, E. J.; Wu, Z. *Tetrahedron Lett.* 1991, 32, 2465.
7) Negishi, E.; King, A. O.; Tour, J. M. *Org. Synth.* 1985, 64, 44.

Appendix J

Polym. Prepr. (Am. Chem. Soc., Div. Polym. Chem.) 1993, 34(2), 370. August, 1993

Planar Poly(p-phenylene) Derivatives. Ladder Formation for Maximization of Extended π-Conjugation James M. Tour* and Jaydeep J. S. Lamba
Department of Chemistry and Biochemistry
University of South Carolina
Columbia, South Carolina 29208

Poly(p-phenylene) (PPP),[1] a highly insoluble polymer that has been studied extensively for its possible electronic and photonic applications, has a 23° twist[1c,2] between the consecutive aryl units due to ortho hydrogen interactions (Fig 1). Attempts to enhance the solubility by

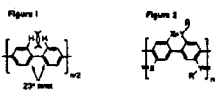

substitution of the rings forces the consecutive aryl units even further out of plane resulting in a plummet of the extended conjugation (easily observed by the optical spectra).[1i-k] Here we describe a synthetic route to ladder[3] PPP derivatives with bridges that (1) form in high yields upon protonic activation once the PPP backbone is intact, (2) can be substituted so that the newly formed polymer is soluble, unlike many other aromatic ladder polymers, (3) contain a double-bonded unit to keep the consecutive aryl units planar while maximizing extended π-conjugation through the PPP backbone thereby increasing the band width (lowering the band gap) between the hydroquiniodal and quinoidal forms (Fig 2),[1c] and (4) can be film cast in the uncyclized form followed by protonic activation to obtain films of the planarized system.

Our retrosynthetic approach involved two key steps (Scheme I, M = metal). First, imine cleavage to the

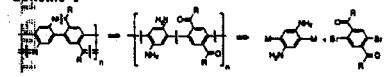

ketoamine functionalized PPP, and second, bond cleavage to the two arene systems shown. Since Pd(0)-catalyzed oxidative addition reactions are facilitated with electron deficient ring systems,[4] we chose to keep the halides on the ketoaromatic portion.

After several nearly quantitative model reactions, we synthesized the two key monomers needed for the desired AB-type step growth polymerization (eqs 1 and 2).[5] It is remarkable that while 3 was nearly insoluble in ether, it could be tetralithiated in ether to form a soluble intermediate 4 in almost quantitative yield (checked by addition of TMSCl and isolation of the arylbis(silane) after aqueous work-up). Treatment of 4 with methyl pinacol borate afforded the monomer 5 which could be purified by passage through a flash chromatography column containing a mixture of activated charcoal and Celite as the stationary phase (silica gel or neutral alumina caused rapid

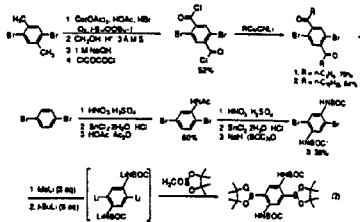

decomposition of the intermediate) and $CH_2Cl_2$ as the eluant followed by recrystallized to form pure 5.[6]

Reaction of 1 or 2 with 5, in the presence of a Pd(0) catalyst, yielded the soluble polymers 6 and 7, respectively, from which size exclusion chromatography (SEC) could be used to determine the hydrodynamic volumes relative to polystyrene (6: 63% yield after fractional precipitation, $M_n$ = 9,850 with $M_w/M_n$ = 1.85; 7: 97% yield after fractional precipitation, $M_n$ = 28,400 with $M_w/M_n$ = 3.70). Upon exposure of 6 or 7 to trifluoroacetic acid (TFA), quantitative loss of the BOC protecting group and cyclization afforded 8 (90% yield) and 9 (97% yield), respectively (eq 3).[7,8] All stretches for the ketone, carbamate, and amine in 6 and 7 were absent in the FTIR spectrum of 8 and 9.

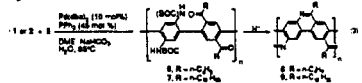

Samples of 8 and 9 can be solubilized with $CH_2Cl_2$/TFA (3:2) mixtures. Additionally, 7 can form THF solution-cast films then be cleanly cyclized by suspension of the film in anhydrous HCl/EtOAc followed by proton removal with Et3N/NaOH to afford 9 as a flexible free-standing film. Again, this film was devoid of ketone, carbamate, and amine absorptions in the FTIR spectrum. Therefore, the dodecyl groups are apparently exerting a plasticizing effect so that even this planar rigid rod polymer can possess good film forming properties.

Powder X-ray diffraction (XRD) of annealed 8 showed a broad pattern at 14 and 41 Å while 9 showed a similar pattern at 27 and 45 Å. Differential scanning calorimetry (DSC) (50-350°C, 20°C/min, N2) thermograms of 8 and 9 were featureless on both the first and second heating cycles. Thermogravimetric analysis (TGA) (50-900°C, 20°C/min, N2) of 9 showed an onset of major weight loss at 400°C, 10% weight loss at 434°C, and 50% weight loss at 550°C. The TGA thermogram of 8 was similar.

Most exciting is the optical absorption data showing enormous bathochromic shifts in the polymers upon cyclization (conversion of 6 to 8 and 7 to 9): an observation consistent with the proposed ladder formation (Table I). Also interesting are the large hypsochromic shift in the spectrum of protonated 9 (solution) relative to 9 in the neutral form (solid), suggesting that cationic nitrogen atoms retard the extended conjugation. The absorptions of these planar polymers are far more bathochromically-shifted than those of the planar trimers,[9] oligo(p-phenylenes), and PPP,[10] while the $\lambda_{max}$ values are in the range of other near-planar PPP derivatives that have been synthesized.[12]

Table I. Optical Absorption Data

| Compound | λ in solution (nm)[a] | λ of solid (nm)[a] |
|---|---|---|
| 6 | CH₂Cl₂: 250, 306 (sh) | 248, 308[b] |
| 7 | CH₂Cl₂: 250, 388 | 250, 398[b] |
| 8 | CH₂Cl₂/TFA: 374, 396, 426 (sh), 514, 520 (ed)[c] | ...... |
| 9 | CH₂Cl₂/TFA: 376, 400, 428, 478, 516, 530 (ed)[c] | 463-490[d] |
| 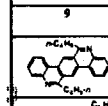 | CH₂Cl₂: 300 (ref 9) | ...... |
| 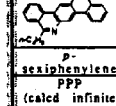 | CH₂Cl₂: 294 (ref 9) | ...... |
| p-sexiphenylene | CHCl₃: 318 (ref 10) | ...... |
| PPP (calcd infinite Mₙ) | 344 (ref 10) | ...... |
| 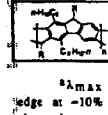 | CH₂Cl₂: 348-443 (ref 12) | ...... |

[a] $\lambda_{max}$ is underlined. (sh) is shoulder, (ed) is tailing edge at ~10% of $\lambda_{max}$ intensity. [b] Also a strong carbonyl absorption at 196 nm. [c] Spectrum recorded on the acid solublized, therefore, multiprotonated system. [d] These $\lambda_{max}$ values were recorded on a series of four different polymer samples of 9 in order to insure their reproducibility.[11]

Acknowledgments. We are grateful for support from the Office of Naval Research, the Defense Advanced Research Projects Agency, the National Science Foundation (EHR-91-08772, DMR-9158315), and generous industrial contributors to the NSF Presidential Young Investigator Award (1991-96): Hercules, IBM, Ethyl, Shell, and Eli Lilly Corporations. We also thank Molecular Design Ltd. for the use of their synthetic data base.

References and Notes

(1) For some recent reviews on polyphenylene, see: (a) Kovacic, P.; Jones, M. B. *Chem. Rev.* 1987, *87*, 357. (b) Noren, G. K.; Stille, J. K. *Macromol. Rev.* 1971, *5*, 385. (c) Eisenbaumer, R. L.; Shacklette, L. W. In *Handbook of Conducting Polymers*; Skotheim, T. A., Ed.; Dekker: New York, 1986. (d) Tourillion, G. in ref 1c. (e) Baughman, R. H.; Brédas, J. L.; Chance, R. R.; Eisenbaumer, R. L.; Shacklette, L. W. *Chem. Rev.* 1982, *82*, 209. For some p-phenylene decamer to be 22.3° using MMX with extended π-Hückel parameters. For a discussion of twist angle versus degree of extended conjugation, see: (a) Brédas, J. L. in ref 1c. (b) Ferraris, J. P.; Andrus, R. G.; Hrncir, D. C. *J. Chem. Soc., Chem. Commun.* 1989, 1318. (c) Gorman, C. B.; Ginsburg, E. J.; Moore, J. S.; Grubbs, R. H. *Polym. Prepr. (Am. Chem. Soc., Div. Polym. Chem.)* 1991, *32*(3), 714. (d) Orchard, B. J.; Freidenreich, B.; Tripathy, S. K. *Polymer* 1986, *27*, 1533.

(3) For some discussions of aromatic ladder polymers, see: (a) Overberger, C. G.; Moore, J. A. *Adv. Polym. Sci.* 1970, *7*, 113. (b) Schlüter, A.-D. *Adv. Mater.* 1991, *3*, 282. (c) Yu, L.; Chen, M.; Dalton, L. R. *Chem. Mater.* 1990, *2*, 649. (d) Hong, S. Y.; Kertesz, M.; Lee, Y. S.; Kim, O.-K. *Chem. Mater.* 1992, *4*, 378. (e) Godt, A.; Schlüter, A.-D. *Adv. Mater.* 1991, *3*, 497. (f) Yu, L.; Dalton, L. R. *Macromolecules* 1990, *23*, 3439.

(4) (a) Miyaura, N.; Yanagi, T.; Suzuki, A. *Synth. Commun.* 1981, *11*, 513. (b) Siddiqui, M. A.; Snieckus, V. *Tetrahedron Lett.* 1988, *29*, 5463. (c) Gronowitz, S.; Lawitz, K. *Chem. Scripta* 1984, *24*, 5.

(5) (a) The *tert*-butylperoxide modified Co-based oxidation was far superior to several permanganate oxidations attempted. See: Hay, A. S.; Blanchard, H. S. *Canad. J. Chem.* 1965, *43*, 1306. The dicarboxylic acid was then converted to the diester to facilitate purification. (b) Doornbos, T.; Strating, J. *Org. Prep. Proced.* 1969, *1*, 287.

(6) The arylbis(boronic acid) analog of 5 could not be adequately purified for the step growth polymerization.

(7) The twist in 8 and 9 is <1° between the consecutive phenyl rings calculated by MMX with extended π-Hückel parameters.

(8) Highest molecular weight samples of 6 and 7 were obtained when the Pd-catalyzed coupling was done for ~24 h using an equimolar mixture of 1:5 or 2:5, respectively, followed by the addition of a 5-10 mol % excess of 5 with continued heating for 1-2 d. 6: Anal. calc'd for (C₃₂H₄₂N₂O₆)ₙ: C, 69.79; H, 7.69; N, 5.07. Found: C, 70.55; H, 7.25; Br, <0.5; N, 5.13. 7: Anal. calc'd for (C₄₈H₇₄N₂O₆)ₙ: C, 74.38; H, 9.62; N, 3.61. Found: C, 74.99; H, 9.40; Br, <0.5; N, 3.55. 8: Anal. calc'd for (C₂₂H₂₂N₂)ₙ: C, 84.04; H, 7.05; N, 8.91. Found: C, 79.13; H, 6.77; Br, <0.5; N, 8.56. 9: Anal. calc'd for (C₃₈H₅₄N₂)ₙ: C, 84.70; H, 10.10; N, 5.20. Found: C, 81.45; H, 9.64; Br, <0.5; N, 5.22.

(9) The planar trimers were prepared during our model studies for the polymerizations described here using Pd-catalyzed couplings.

(10) Ried, W.; Freitag, D. *Angew. Chem. Intern. Ed. Engl.* 1968, *7*, 835.

(11) Drs. R. Gaudiana and P. Mehta of Polaroid Corporation kindly provided the solid-state UV-vis data.

(12) The near-planar benzenoid ladder polymers were prepared by Pd-catalyzed couplings. See: Scherf, U.; Müllen, K. *Makromol. Chem., Rapid Commun.* 1991, *12*, 489. Scherf, U.; Müllen, K. *Synthesis* 1992, 23. Scherf, U.; Müllen, K. *Macromolecules* 1992, *25*, 3546.

Appendix K

Reprinted from the Journal of the American Chemical Society, 1995, 117.
Copyright © 1995 by the American Chemical Society and reprinted by permission of the copyright owner.

9529

Self-Assembled Monolayers and Multilayers of Conjugated Thiols, α,ω-Dithiols, and Thioacetyl-Containing Adsorbates. Understanding Attachments between Potential Molecular Wires and Gold Surfaces James M. Tour,*,†,‡ LeRoy Jones II,‡ Darren L. Pearson,‡ Jaydeep J. S. Lamba,‡ Timothy P. Burgin,‡ George M. Whitesides,*,§ David L. Allara,*,⊥ Atul N. Parikh,⊥ and Sundar V. Atre⊥

*Contribution from the Department of Chemistry and Biochemistry, University of South Carolina, Columbia, South Carolina 29208, Department of Chemistry, Harvard University, Cambridge, Massachusetts 02138, and Department of Chemistry, The Pennsylvania State University, University Park, Pennsylvania 16802*

*Received February 2, 1995*

Abstract: This paper describes studies of the formation of self-assembled monolayers (SAMs) and multilayers on gold surfaces of rigid-rod conjugated oligomers that have thiol, α,ω-dithiol, thioacetyl, or α,ω-dithioacetyl end groups. The SAMs were analyzed using ellipsometry, X-ray photoelectron spectroscopy (XPS), and infrared external reflectance spectroscopy. The thiol moieties usually dominate adsorption on the gold sites; interactions with the conjugated π-systems are weaker. Rigid rod α,ω-dithiols form assemblies in which one thiol group binds to the surface while the second thiol moiety projects upward at the exposed surface of the SAM. In situ deprotection of the thiol moieties by deacylation of thioacetyl groups using NH₄OH permits formation of SAMs without having to isolate the oxidatively unstable free thiols. Moreover, direct adsorption, without exogenous base, of the thioacetyl-terminated oligomers can be accomplished to generate gold surface-bound thiolates. However, in the non-base-promoted adsorptions, higher concentrations of the thioacetyl groups, relative to that of thiol groups, are required to achieve monolayer coverage in a given interval. A thiol-terminated phenylene—ethynylene system was shown to have a tilt angle of the long molecular axis of <20° from the normal to the substrate surface. These aromatic α,ω-dithiol-derived monolayers provide the basis for studies leading to the design of molecular wires capable of bridging proximate gold surfaces.

Introduction

Organic compounds have the potential to serve as molecular components of electronic devices.[1] As a prelude to the design of such devices, it is valuable to understand electrical conduction through single or small arrays of conjugated organic molecules that might ultimately serve as molecular wires.[2] Here we describe studies of self-assembled monolayers[3] (SAMs) derived from a series of sulfur-terminated conjugated oligomers. In several of the oligomeric system studies, the conjugated oligomers are α,ω-dithiol substituted; such functionalities are necessary for binding between proximate gold probes in future electronic conduction experiments. Methods are also described for (1) the in situ NH₄OH-promoted deprotection of acetyl-protected thiols and (2) the non-base-promoted adsorption of thioacetyl-terminated oligomers on gold, to ultimately form surface-bound thiolates. This study establishes the geometry and density of packing of these rigid-rod aromatic oligomers on gold surfaces. The systems studied here (1) are surface-bound via an aromatic thiol unit, thus there is no potentially insulating alkyl fragment between the aromatic moieties and the gold, (2) do not possess long-chain alkyl termini to direct packing, and (3) are well-suited to evaluate the effect of the thiophene sulfur adsorption propensities versus the terminal thiol adsorption.[4]

Results and Discussion

Monothiols. The ellipsometric and X-ray photoelectron spectroscopic (XPS) data for the various compounds studied are presented in Table 1 along with the calculated monolayer

---

† Surface studies conducted while on sabbatical leave at Harvard University.
‡ University of South Carolina.
§ Harvard University.
⊥ The Pennsylvania State University.
* Abstract published in *Advance ACS Abstracts*, September 1, 1995.
(1) (a) *Molecular Electronics: Science and Technology;* Aviram, A., Ed.; Confer. Proc. No. 262; American Institute of Physics: New York, 1992. (b) *Molecular Electronic Devices II;* Carter, F. L., Ed.; Marcel Dekker: New York, 1987. (c) Miller, J. S. *Adv. Mater.* 1990, 2, 378, 495, 601. (d) Waldeck, D. H.; Beratan, D. N. *Science* 1993, 261, 576. (e) Tour, J. M.; Wu, R.; Schumm, J. S. *J. Am. Chem. Soc.* 1991, 113, 7064.
(2) (a) *Nanostructure Physics and Fabrication;* Reed, M. A., Kirk, W. P., Eds.; Academic Press: New York, 1989. (b) *Nanostructures and Mesoscopic Systems;* Kirk, W. P., Reed, M. A., Eds.; Academic: New York, 1992.
(3) For an overview on SAMs, see: Ulman, A. *An Introduction to Ultrathin Organic Films;* Academic: Boston, 1991.

(4) No clear predictive pattern of molecular structures has previously been established and only a few studies in which structures have been well-characterized are available. Studies involving SAMs of alkyl chain derivatized aromatic thiols on gold show that the long alkyl chains can organize and force the aromatic rings to tilt away from the surface. For example, see: Chang, S.-C.; Chao, I.; Tao, Y.-T. *J. Am. Chem. Soc.* 1994, 116, 6792. Evans, S. D.; Urankar, E.; Ulman, A.; Ferris, N. *J. Am. Chem. Soc.* 1991, 113, 4121. Studies of purely aromatic thiolate SAMs on gold indicate that the average tilt of the aromatic rings could range from vertical (Sabatani, E.; Cohen-Boulakia, J.; Bruening, M.; Rubenstein, I. *Langmuir* 1993, 9, 2974), to partially tilted (Kwan, W. S.; Atanasoska, L.; Miller, L. L. *Langmuir* 1991, 7, 1419), to parallel to the surface (Hutchison, J. E.; Postlethwaite, T. A.; Murray, R. W. *Langmuir* 1993, 9, 3277).

0002-7863/95/1517-9529$09.00/0  © 1995 American Chemical Society

Table 1. Data of Layered Structures Prepared from Rigid Rod Thiols, α,ω-Dithiols, and Thioacetyl-Containing Substrates[a]

| Entry | Compound | Concentration (mM) | Additive[b] | Calc'd SAM Depth (Å)[c] | Found Depth by Ellipsometry (Å)[d] | XPS Data (eV)[e] Au(4f7/2) S(2p3/2) O(1s) | Au(4f5/2) S(2p1/2) | C(1s) Si(2p) |
|---|---|---|---|---|---|---|---|---|
| 1 | HS—⬡—SH | 1.0 | ---- | 9.5 | 14.6 (1 d), 14.5 (3 d) | 84 (566) 163 (134) 531 (42) | 88 (425) 164 (67) | 284 (125) --- |
| 2a | AcS—⬡—SAc | 1.0 | ---- | 12.1 | 6.5 (1 d) | | | |
| 2b | " | 41 | ---- | 12.1 | 10.1 (1 d) | | | |
| 2c | " | 1.0 | NH₄OH | 9.5 | 7.4 (1 d) | | | |
| 3 | ⬡—⬡—SH | 1.0 | ---- | 12.4 | 4.9 (1 h), 10.2 (1 d) | 84 (678) 162 (32) 531 (13) | 88 (509) 163 (16) | 284 (91) --- |
| 4a | ⬡—⬡—SAc | 1.0 | ---- | 12.4 | 6.6 (1 h), 6.9 (1 d) | | | |
| 4b | " | 38 | ---- | 12.4 | 8.9 (1 d) | 84 (791) 162 (20) 531 (22) | 88 (610) 163 (10) | 284 (64) --- |
| 4c | " | 1.0 | NH₄OH | 12.4 | 10.6 (1 d) | 84 (705) 162 (27) 531 (33) | 88 (531) 163 (13) | 284 (101) --- |
| 5 | HS—⬡—⬡—SH | 1.0 | ---- | 13.6 | 15.1 (1 d), 17.3 (3 d) | 84 (489) 163 (88) 531 (42) | 88 (367) 164 (44) | 284 (141) --- |
| 6a | AcS—⬡—⬡—SAc | 0.5 | ---- | 16.3 | 7.8 (1 d) | | | |
| 6b | " | 31 | ---- | 16.3 | 20.5 (1 d) | 84 (622) 163 (52) 532 (24) | 88 (457) 164 (26) | 284 (114) --- |
| 6c | " | 0.5 | NH₄OH | 13.6 | 15.0 (1 d) | 84 (723) 163 (50) 531 (26) | 88 (570) 164 (25) | 284 (105) --- |
| 7 | TMS—≡—⬡—SH | 1.0 | ---- | 13.2 | 5.5 (1 h), 11.1 (1 d) | 84 (691) 162 (28) 531 (19) | 88 (519) 163 (14) | 284 (70) 100 (72) |
| 8a | TMS—≡—⬡—SAc 1 | 1.0 | ---- | 13.2 | 2.2 (1 h), 6.0 (1 d) | | | |
| 8b | " | 36 | ---- | 13.2 | 5.1 (1 d), 14.2 (3 d) | 84 (803) 162 (27) 531 (17) | 88 (602) 163 (14) | 284 (66) 100 (45) |
| 8c | " | 1.0 | NH₄OH | 13.2 | 12.2 (1 d) | 84 (644) 162 (32) 530 (15) | 88 (484) 163 (16) | 284 (69) 101 (36) |
| 9 | ⬡—≡—⬡—≡—⬡—SH | 0.3 | ---- | 21.3 | 13.3 (1 h), 19.0 (1 d) | 84 (516) 162 (29) 531 (14) | 88 (387) 163 (15) | 284 (135) --- |
| 10a | ⬡—≡—⬡—≡—⬡—SAc 2 | 0.3 | ---- | 21.3 | 6.1 (1 h), 8.3 (2 d) | | | |
| 10b | " | 0.3 | NH₄OH | 21.3 | 18.8 (1 d) | 84 (547) 162 (17) 531 (46) | 88 (410) 163 (9) | 284 (134) --- |
| 11 | HS—⬡—≡—⬡—≡—⬡—SH | 0.3[f] | ---- | 22.6 | 38.4 (1 d), 44.0 (2 d) | 84 (181) 163 (69) | 88 (136) 165 (34) | 284 (163) --- |
| 12a | AcS—⬡—≡—⬡—≡—⬡—SAc | 0.1 | ---- | 25.2 | 14.5 (2 d) | | | |
| 12b | " | 0.1 | NH₄OH | 22.6 | 43.9 (1 d), 53.1 (4 d) | | | |
| 13 | HS—⬡—[≡—⬡]₂—SH | 0.1[f] | ---- | 29.1 | 51.6 (1 d), 74.0 (2 d) | 84 (92) 163 (65) | 88 (69) 164 (31) | 284 (215) --- |
| 14a | AcS—⬡—[≡—⬡]₂—SAc | 0.1 | ---- | 31.9 | 11.7 (1 d), 11.6 (4 d) | | | |
| 14b | " | 0.1 | NH₄OH | 29.1 | 36.7 (1 d), 56.0 (4 d) | | | |
| 15 | ⬡(S)—SH | 0.5 | NEt₃[f] | 11.6 | 10.0 (1 d) | 84 (700) 163 (84) 532 (19) | 88 (525) 164 (42) | 284 (85) --- |

Formation of Self-Assembled M... and Multilayers

Table 1 (Continued)

| Entry | Compound | Concentration (mM) | Additive | Calc'd SAM Depth (Å) | Found Depth by Ellipsometry (Å) | XPS Data (eV) Au(4f7/2) S(2p3/2) O(1s) | Au(4f5/2) S(2p1/2) | C(1s) Si(2p) |
|---|---|---|---|---|---|---|---|---|
| 16 | (structure) | 39 | --- | 11.6 | 6.4 (1 d), 13.2 (3 d) | 84 (725) 163 (54) 531 (19) | 88 (545) 164 (25) | 264 (82) --- |
| 17a | (structure) | 0.1 | --- | 25.2 | 7.7 (1 d) | | | |
| 17b | " | 0.1 | NH₄OH | 25.2 | 21.3 (1 d) | 84 (505) 163 (69) 531 (73) | 88 (389) 164 (35) | 284 (125) —ʰ |
| 18 | (structure) | 0.4 | NH₄OH | 63.9 | 20.5 (1 d), 22.4 (3 d) | | | |
| 19 | (structure) | 0.1 | NH₄OH | 108.3 | 19.6 (1 d), 28.3 (3 d) | | | |
| 20a | (structure) | 0.1 | --- | 68.9 | 23.0 (1 d) | | | |
| 20b | " | 0.1 | NH₄OH | 66.4 | 32.6 (1 d), 50.8 (4 d) | | | |

*a* All adsorption experiments were run without stirring in THF, unless otherwise noted, and they were run on the bench top under an atmosphere of argon. The Au (500 Å) was freshly deposited by electron-beam evaporation on a Ti-primed (20 Å) silicon (100) wafer. *b* In the cases where NH₄OH was added to the reactions, 3–5 μL of NH₄OH (30% aqueous) was added per mg of substrate. Gentle agitation of the vessel for 2 min permitted dissolution of NH₄OH in the THF. *c* The distances were calculated, from an sp-hybridized Au atom to the furthest most proton, by molecular mechanics, for the minimum energy extended forms.*d* The Au–S–C bond angles were assumed to be linear.*e* The Au–S distance was calculated to be 2.36 Å.*f* *d* The ellipsometric data were obtained using a Rudolph Industries 200E ellipsometer and contain approximately ±5% error. The He–Ne laser (632.8 nm) light was incident at 70° on the sample. Data were taken on 3–4 spots in different regions of a given sample, then averaged. An index of refraction ($n_f$) of 1.55 was assumed for all the film thickness calculations. The values in parentheses correspond to the amount of time that the gold sample was in the solution. *e* The numbers in parentheses are the relative intensities. The XPS data were obtained using a Surface Science SSX-100 XPS using a monochromatic Al Kα source.*7* The samples were run in random order with the following common parameters: pass energy = 100 eV, spot size = 600 μm, take-off angle*d* = 35° from the surface plane. The Au(4f₇/₂) peak was used as a calibration by standardizing to 83.98 eV, the ASTM standard. A 20 eV window was used for all samples and intensity normalization was done between batches by overlapping at least one sample and using the Au(4f₇/₂) intensities as a calibration point.*7* Oxidation of the self-assembled layers was noted by the formation of oxidized S(2p) peaks at 167–168 eV and increases in O(1s) content over 5–10 days of storage in air. Therefore, the S(2p) and O(1s) intensities listed here are not useful relative calibration parameters. The background silicon from the wafer gave a broad weak signal at 99 eV that was usually distinguishable from the Si(2p) of the organic. *f* Adsorption was carried out in CH₂Cl₂. There were solids, presumably oligodisulfides, present throughout the experiment and a small stir bar was placed in the vessel such that it did not hit the gold sample. *g* 6 μL of NEt₃ was added per mg of substrate to liberate the free thiol since the majority of the starting material exists as a dimeric, though not the disulfide, species.*1* *h* In this case, the Si(2p) of the organic was not easily distinguishable from the background signal.

SAM thicknesses.[5] Comparison of the XPS intensities from organic-covered gold substrates versus the organic layer thickness measured by ellipsometry confirms the necessary correlation between the data from the XPS and ellipsometry (Figure 1).[7] In the case of the monothiols, the inference from the data is that several of the oligomers form single monolayers whose thicknesses correspond to the extended, end-to-end distance of (5) The 1,4-phenyldithiol, 1,4-phenyldithioacetyl, 4-biphenylthiol, 4-biphenyldithioacetyl, 4,4'-biphenyldithiol, 4,4'-biphenyldithioacetyl, bithiophenethiol, and bithiophenethioacetyl were prepared by lithium–halogen exchange on the corresponding aryl bromides followed by quenching with sulfur then acetyl chloride or water to generate the thioacetyl compounds or thiols, respectively. For sulfur quench without acylation, see: Jones, E.; Moodie, I. M. *Org. Synth.* 1970, *50*, 104. For original references to some of these compounds, see: Adams, R.; Ferretti, A. *J. Am. Chem. Soc.* 1959, *81*, 4939. Kharasch, N.; Swidler, R. *J. Org. Chem.* 1954, *19*, 1704. Fields, E. K.; Meyerson, S. *J. Org. Chem.* 1969, *34*, 2475. Klemm, L. H.; Karchesy, J. J. *J. Heterocycl. Chem.* 1978, *15*, 281, 561. 1 was prepared from 1-bromo-4-((trimethylsilyl)ethynyl)benzene (Stephens, E. B.; Tour, J. M. *Macromolecules* 1993, *26*, 2420) following the above thioacetyl-formation protocol. For the preparations of the extended oligomers, see: Schumm, J. S.; Pearson, D. L.; Tour, J. M. *Angew. Chem., Int. Ed. Engl.* 1994, *33*, 1360. Pearson, D. L.; Schumm, J. S.; Tour, J. M. *Macromolecules* 1994, *27*, 2348. The arylthioacetyl end groups were affixed to the oligomers via an aryl halide-terminal alkyne cross-coupling, see: Sonogashira, K.; Tohda, Y.; Hagihara, N. *Tetrahedron Lett.* 1975, 4467.
(6) Modified MM2 force-field. Version 3.7, from CAChe Scientific Inc.
(7) Bain, C. D.; Whitesides, G. M. *J. Phys. Chem.* 1989, *93*, 1670.
(8) Ponticello, G. S.; Habecker, C. N.; Varga, S. L.; Pitzenberger, S. M. *J. Org. Chem.* 1989, *54*, 3223.

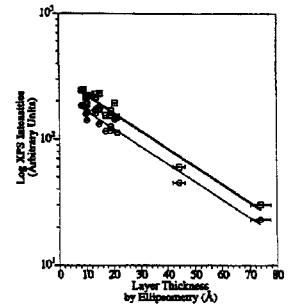

Figure 1. Log of the XPS intensities from organic-covered Au substrates versus the organic layer thickness measured by ellipsometry [Au(4f₇/₂) (squares) and Au(4f₅/₂) (circles)]. One scan was used to minimize damage effects over a 15-eV window. [7] All other parameters were as described in Table 1.

the molecules, suggesting that the organic compounds are nearly normal to the surface (Table 1, entries 3, 7, 9, and 15). The presence of the aryl groups, with their potential adsorbing π and/or thiophene sulfur centers, seems not to influence the mode of adsorption in several of the systems investigated.[4] Formation of SAMs from these rigid-rod compounds is slower than with n-alkanethiols, the former requiring 1 day to reach a near complete monolayer.

α,ω-Dithiols. Aromatic thiols oxidize readily, and previous work with flexible α,ω-dithiols has suggested that they can form multilayers via disulfide linkages or they can form looped structures where both ends of the molecule bind to the surface.[9] With these rigid α,ω-dithiols, there was no indication for looped structures wherein both thiol ends were adsorbed to the surface. However, multilayer formation was observed which indicates that one thiol end adsorbed to the surface while the other end projected away from the surface and became available for oxidative S–S coupling (Table 1, entries 1, 5, 11, and 13).[9,10] Note that these adsorption studies were conducted on the bench top, and though flushing with $N_2$ was done to reduce oxygen content in the reaction vessels, the systems were not oxygen free. Thus these studies demonstrate the types of adsorptions that could be expected under normal fabrication conditions for electronics.

Acetyl-Protected Monothiols. We have found that acetyl-protected thiols provided an excellent method to alleviate the problems of isolating and using the oxidatively unstable thiols. In the cases where monothiolate-containing systems (ArS) were needed, we could have used disulfides (Ar—SS—Ar) as precursors;[3] this strategy, however, is impractical for the α,ω-dithiols, since successive oxidative oligomerization would generate insoluble poly(disulfides). $^1$H NMR and $^{13}$C NMR analysis in THF-$d_8$ showed that 1 (Table 1, entry 8a) could be deacylated completely within 10 min using aqueous $NH_4OH$. Other bases such as (n-$C_3H_7$)$_2$NH or DMAP were far less effective.[11] $NH_4$-OH-promoted removal of the alkynyl-TMS group in 1 was not observed within 72 h. Therefore, in situ deprotection of the monoacetyl-containing systems could be carried out using $NH_4$-OH to form SAMs (Table 1, entries 4c, 8c, 10b, 17b, 18, and 19). Oligomers up to the 20–25 Å size range (Table 1, entries 10b and 17b) form SAMs efficiently; however, the longer nonlinear oligo(thiophene–ethynylene)s did not proceed to a densely packed SAM (Table 1, entries 18 and 19). In these latter two cases, we cannot exclude the possibility of competitive adsorption between the thiol and thiophene moieties.

The monothioacetyl moiety could even be used, without deprotection by exogenous base, to generate the SAM directly, though higher concentrations of thioacetyl-containing adsorbates, relative to thiols, were required to achieve monolayer coverage (Table 1, entries 4a, 4b, 8a, 8b, 10a, 16, and 17a). We have not determined the mechanism of the adsorption, and though direct adsorption of the thioester to form the gold thiolate is a possibility,[12] hydrolysis of the thioesters, via trace amounts of water or enol forms of the thioesters, is also a plausible reaction course. In the cases of the direct adsorption or base-promoted adsorptions of the thioacetyl-terminated systems, the XPS results confirmed that the SAMs were similar in their composition to the SAMs generated from the free thiols.

Acetyl-Protected α,ω-Dithiols. $NH_4OH$-promoted deprotection of α,ω-dithioacetyl compounds is a convenient method

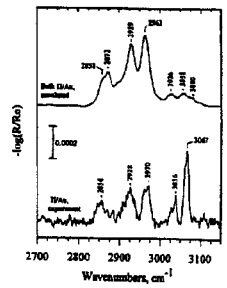

Figure 2. Simulated (top) and experimental (bottom) high wavenumber portion of the FTIR spectrum of 2 after SAM formation on Au. Spectra were collected using an in-house modified Fourier transform spectrometer (FTS-60, Bio-Rad, Cambridge, MA). Incoming p-polarized infrared radiation was focused on the sample with an ~f/20 beam impinging at an 85° angle of incidence and the reflected beam was detected using a narrow band MCT detector cooled with liquid nitrogen.[14] The spectra were collected at 2 $cm^{-1}$ resolution with a mirror velocity corresponding to a data collection rate of 20 kHz. The interferograms were Fourier transformed with triangular apodization and zero-filling. The spectral intensities are reported as reflectivities in absorption units, $-\log(R/R_0)$ where $R_0$ is the reflectivity of a reference sample prepared by freshly cleaning an evaporated Au substrate using a UV-ozone cleaner (model uvc-100, Boekle Industries, Philadelphia, PA). Optical function spectra of 2 were determined from the normal incidence transmission spectrum of a KBr pellet using a previously published method.[15]

to generate the oxidatively unstable dithiols, in situ (Table 1, entries 2c, 6c, 12b, 14b, and 20b). However, deposition with multilayer formation is still problematic when the reactions are conducted in the presence of small amounts of oxygen. Direct adsorption of the α,ω-dithioacetyl compounds appears to be an excellent method for deposition without multilayer formation, though higher concentrations are required (Table 1, entries 2a, 2b, 6a, 6b, 12a, and 14a).[9,10,13] This direct adsorption method might be particularly well-suited for the deposition of a SAM between proximate gold probes; however, we did not have sufficient quantities of the larger α,ω-dithioacetyl compounds to investigate the efficiency of this process with the longer difunctional oligomers.

Infrared Studies. Infrared external reflectance spectroscopy studies were conducted on SAMs prepared from 2 (deposited using $NH_4OH$ as in Table 1, entry 10b). The results are in agreement with the ellipsometric and XPS data obtained. Figures 2 and 3 show the high- and low-frequency parts, respectively, of the reflection spectrum of the SAM on a gold substrate. Limited experiments also were done with 2 on silver substrates and it was observed that monolayers self-assembled with infrared spectra quite similar to those in Figures 2 and 3. The latter sets of results are part of a more extensive study and will be reported separately.[16] The mode assignments generally were made in analogy with available published assignments for similar structures in pure, bulk phases.[17]

---

(9) Bain, C. D.; Troughton, E. B.; Tao, Y.-T.; Evall, J.; Whitesides, G. M.; Nuzzo, R. G. *J. Am. Chem. Soc.* 1989, *111*, 321.
(10) (a) Bell, C. M.; Arendt, M. F.; Gomez, L.; Schmehl, R. H.; Mallouk, T. E. *J. Am. Chem. Soc.* 1994, *116*, 8374. (b) Kim, T.; Crooks, R. M.; Tsen, M.; Sun, L. *J. Am. Chem. Soc.* 1995, *117*, 3963.
(11) We avoided the use of bases containing metal cations such as NaOH since metal cations are troublesome impurities in fabrication of silicon-based electronic devices.
(12) It was recently reported that a dialkyl sulfide can adsorb directly to gold to form alkanethiolates. See: Zhong, C.-J.; Porter, M. D. *J. Am. Chem. Soc.* 1994, *116*, 11616.

(13) One could use a bis-disulfide such as $H_3CSS$-Ar-$SSCH_3$; however, there would be competition for the gold sites between the desired arylsulfide portions and the methyl sulfide portions. See: Bain, C. D.; Whitesides, G. M. *J. Am. Chem. Soc.* 1989, *111*, 7164.
(14) Laibinis, P. E.; Whitesides, G. M.; Allara, D. L.; Tao, Y.-T.; Parikh, A. N.; Nuzzo, R. G. *J. Am. Chem. Soc.* 1991, *113*, 7152.
(15) Parikh, A. N.; Allara, D. L. *J. Chem. Phys.* 1992, *96*, 927.
(16) Allara, D. L.; Parikh, A. N.; Tour, J. M.; Burgin, T. P. Unpublished results.

US 2002/0175326 A1            Nov. 28, 2002

101

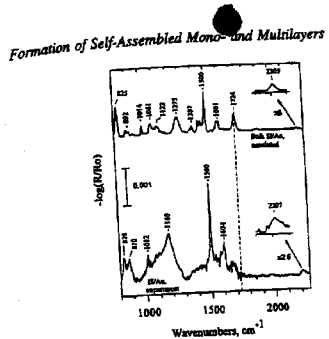

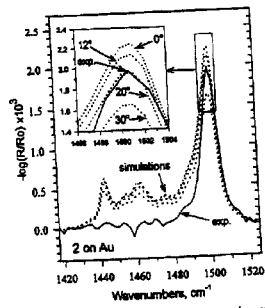

Figure 3. Simulated (top) and experimental (bottom) low wavenumber portion of the FTIR spectrum of 2 after SAM formation on Au. The apparatus and conditions were as described for Figure 2.

Figure 4. Comparison of the 1500-cm$^{-1}$ region experimental spectrum of 2 after SAM formation on Au and corresponding spectra simulated for different tilt angles of the long molecular axis from the surface normal. The inset shows a magnified view of the 1500-cm$^{-1}$ peak.

The simplest way to interpret these spectra is by comparison with reference spectra of a pure phase of the adsorbate molecules. The differences between the two spectra can be used to identify any perturbations of the molecular structure in the film relative to the reference state. Since both the XPS and ellipsometry data indicate that the SAM is packed at a high density, the spectrum of the bulk solid phase of 2 was used as the reference. The latter was obtained from the transmission spectra of a polycrystalline dispersion of the adsorbate compound in a pressed KBr matrix. In order to enable a quantitative comparison, the KBr pellet spectra were transformed into optical function spectra which in turn were used to simulate the reflection spectra of isotropic (randomly oriented) thin films of 2. The film thickness was determined by ellipsometry. The simulated spectra are shown in Figures 2 and 3. The methods for the previous procedures are based on a classical electromagnetic theory approach to the description of the vibrational excitations and details can be found elsewhere.[15]

In general, there is close correspondence between the frequencies and line widths of the simulated and experimental spectra indicating that there is little perturbation of the chemical structure upon formation of the SAM. Figure 2 shows the C–H stretching modes. The peaks in the region of ~2800 to 3000 cm$^{-1}$ are associated with the ethyl group while the high-frequency bands are associated with the aromatic protons. These latter peaks appear in approximately the same spectral region but the positions and intensities are somewhat different from the reference spectra obtained from a KBr pellet of the pure thioacetate compound (Figure 2). The changes are attributed to orientational effects in the monolayer but quantitation of these effects was not possible because of the uncertainty of correct assignments of the transition moments of the individual modes. The exact origin of the strong peak at 3067 cm$^{-1}$ and a slightly weaker peak at ~3036 cm$^{-1}$ in the monolayer spectrum (Figure 2) could not be unambiguously resolved at the present state of the work. The assignment and the estimation of the transition moment direction of the associated mode(s) are complicated by the fact that the three phenyl rings are not exactly equivalent. The replacement of a proton in the central ring by an ethyl group and the presence of -S–Au bond on the terminal ring preclude us from making accurate assignment of the peak to a specific ---
(17) For mode assignments in aromatic compounds, see: Varsanyi, G. *Assignments for Vibrational Spectra of Seven Hundred Benzene Derivatives*; Wiley: New York, 1974; Vol. 1. See p 14 therein for a detailed description of the $a_1$ mode, also termed mode 19a. The C–C vibrations in this mode involve an equal compression of the 1–2 and 6–1 ring bonds with an equal tension of the 2–4 and 4–5 bonds, where the 1 and 4 positions are located vibration. A detailed quantitative vibrational spectroscopic analysis of this peak will require examination of spectra of many analogous compounds of the same general class.[16]

There are a number of features in the low-frequency spectrum of 2, but several are of particular interest (Figure 3). First, the peak at 1724 cm$^{-1}$ in the simulated spectrum is assigned to the C=O stretching mode of the thioacetyl group in the starting compound 2. The absence of this peak in the spectrum of the SAM is consistent with the loss of the acetyl group prior to adsorption and demonstrates that the thioacetyl group is a useful precursor for formation of thiolate monolayers. Second, the very sharp, intense peak at ~1500 cm$^{-1}$ is assigned to an in-plane, C–C stretching mode of the aromatic rings.[17] Although there are three different rings in 2, they are of sufficiently similar structure that the vibrational frequencies of this mode should be nearly identical, as evidenced by the sharpness of the peak. Since the molecular symmetry of 2 can be approximated as $C_{2v}$, the vibration can be assigned as $a_1$. Further, from the normal mode description,[17] the transition dipole moment can be assumed to be along the long molecular axis. Based on a previously published method,[15] a series of simulations of the 1500-cm$^{-1}$ $a_1$ peak were carried out for different surface orientations of the molecule using the optical constants generated from the KBr spectra. Figure 4 shows a best fit between experiment and simulation for a 20° average tilt of the long molecular axis from the normal to the gold surface. However, if one better defines the 1500-cm$^{-1}$ $a_1$ peak intensities by correcting for the contribution of the ~1485–1490-cm$^{-1}$ shoulder, observed to be stronger in the simulated spectra, it is clear that the tilt angle of 20° can be regarded as an upper limit since the simulated intensities will all drop. A third feature of interest in Figure 3 is the weak peak observed at ~2205 cm$^{-1}$. This feature is assigned to the C≡C stretching mode with an associated direction of the transition dipole moment parallel to the bond and thus parallel to the long molecular axis. Application of the above simulation analysis to this weak mode leads to an estimate of <20° for the average molecular tilt angle, in general agreement with the $a_1$ mode analysis above.

The broad peak at ~1169 cm$^{-1}$ which appears in the experimental spectrum but not the simulated one (Figure 3) is likely due to the presence of some sulfone groups in the SAM. This same oxidation product was observed in the XPS analysis (Table 1). Oxidized sulfur species generally give rise to extremely strong IR vibrations in this spectral region, and it is estimated from the relative intensity of the 1169-cm$^{-1}$ peak in Figure 3 that only a minor fraction of the SAM is present as sulfone.

Finally, when we attempted to use other modes in the region of 1000–1300 cm$^{-1}$ to deduce the chain orientation, they were obscured by the broad sulfur oxidation feature. The two weak peaks between 1400 and 1500 cm$^{-1}$ in the bulk simulated spectrum (Figure 3, top) can be attributed to vibrational mode 19b of the aromatic rings[17] (b$_2$ symmetry) with the directions of the transition dipole moments aligned perpendicular to the long axis of the molecule and in the plane of the phenyl rings. Their diminution in the monolayer spectrum (Figure 3, bottom) below the noise level indicates a near-vertical orientation of the molecule, but quantitation is difficult because of the interference with the large 1500-cm$^{-1}$ peak. Likewise, the peaks at 828 and 870 cm$^{-1}$ are so near the detector cutoff that quite large artifacts can appear and make this region extremely unreliable.

Summary

Rigid-rod conjugated molecules with a thiol terminus can form SAMs with a high density of packing. The oligomers need not have alkyl groups to promote the packing. The adsorption rates are slower than for alkanethiols. The use of acetyl-protected thiols is a convenient method for the in situ, based-promoted, liberation of the thiol. Moreover, the acetyl-protected thiols can adsorb directly on the gold, without the use of exogenous base. The linear dithiols tend to form SAMs in which only one thiol is attached to the surface. Oxygen-promoted multilayer formation is particularly problematic with these aromatic dithiols. These difficulties can be overcome by the direct adsorption of the α,ω-dithioacetyl compounds. This might have use in the binding of these oligomers between proximate gold probes for molecular electronics studies.

Acknowledgment. The work at all three laboratories was supported by the Advanced Research Projects Agency (ARPA). Support from the National Science Foundation (DMR-900-1270; SOA) to D.L.A. is also acknowledged. The XPS was obtained through the ARPA University Research Initiative and maintained in the Harvard Materials Research Laboratory. We thank Carl Weisbecker for assistance with the XPS.

JA9503560

Appendix L

Polym. Prepr. (Am. Chem. Soc., Div. Polym. Chem.) 1995, 36(2), 233.

Synthesis of New Potential Molecular Wires and Molecular Alligator Clips.

LeRoy Jones II and James M. Tour*
Department of Chemistry and Biochemistry
University of South Carolina
Columbia, South Carolina 29208

Recently, the construction of molecular electronic-based computational instruments has attracted much attention because the ultimate computational system would consist of logic devices that are ultra dense, ultra fast, and molecular-sized. The issue of electronic conduction based upon single or small packets of molecules has just recently been addressed by our research group.[1] The feasibility of molecular electronics, however, remains untested and is theoretically controversial.[2] Organic compounds have the potential to serve as molecular components of electronic devices.[3] As a prelude to the design of such devices, it is necessary to understand electrical conduction through single or small arrays of conjugated organic molecules that might ultimately serve as "molecular wires".[4]

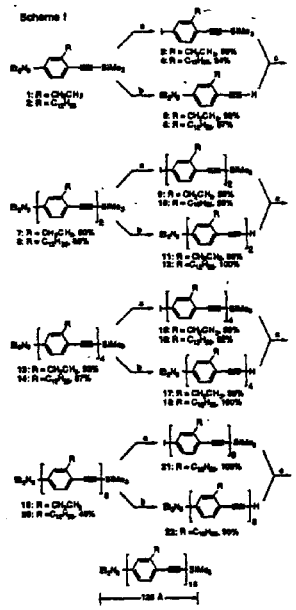

Present state-of-the-art nanopatterning techniques allow lithographic probe assemblies to be engineered down to the 100 Å gap regime. In an attempt to assess the possibility of "molecular wire" conduction by spanning the 100 Å probe gaps with small packets of molecules, we previously synthesized a number of phenylene-alkynylene oligomers that remain in a near-linear conformation due to 1,4-phenylene-substitution patterns and alkyne linearity.[5a] Our approach to such a molecular framework involves the rapid iterative[6] divergent/convergent approach using, successively, the same three sets of reaction conditions (Scheme I). This linear arrangement should minimize undesired conformational movement during adhesion and testing between nanofabricated probes. The monomer, dimer, and tetramer, 1, 7 and 13, respectively, have been fully characterized. Tetramer 13, as shown by computer generated molecular modeling techniques, is calculated to be 30 Å long from the aryl end to the acetylene end, and its corresponding octamer 19, is calculated to be 60 Å long. Unfortunately, the insolubility of the octamer prevented us from proceeding beyond this point. We were, however, able to obtain a UV-visible spectrum and a direct exposure mass spectrum (MS) in order to provide partial evidence for the presence of the octamer 19.

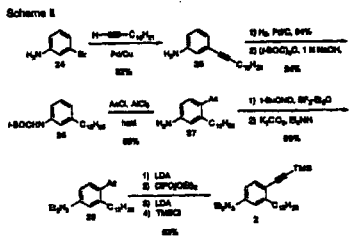

In an effort to insure the solubility of the longer linear rigid rod oligomers, we have prepared monomer 2 (Scheme II). As depicted, the ethyl group has been replaced with a dodecyl group. This modification should allow for easy purification and ensure oligomer solubility as it grows.[5b] We were delighted to discover that both the octamer 20 as well as the 16-mer 23 (Scheme I) were quite soluble and they could both be adequately spectroscopically characterized.

As outlined in Scheme III, we have developed the synthetic protocol for the synthesis (eq. 1) and attachment (eq. 2) of thiol and protected thiol end groups to the ends of our potential molecular wires. The thioacetates, upon hydrolysis, form thiols which upon exposure to gold surfaces form gold-thiolates.[7] Due to the oxidative instability of the thiols, we found that the optimal method for the deprotection and adhesion of these molecular systems may be via an *in situ* base-promoted acetate liberation.[8] Various methods are currently under

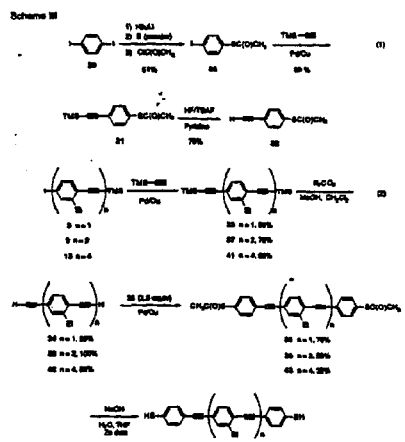

investigation. We hope to use self-assembly methods to affix single or small packets of molecules between nanolithographically-derived probes or two STM tips.

As shown earlier, we have demonstrated the synthesis of "molecular wires" by an iterative divergent/convergent approach. We now plan to apply this same strategy using oligomers attached to a polymer support. This should significantly streamline the synthesis and isolation. Related solid phase approaches permit the preparation of oligopeptides and oligonucleotides in a commercially viable form,[9] and moreover, solid phase synthesis has recently been demonstrated to be useful for the construction of rigid rod oligomers.[10] Our proposed polymer-supported synthetic route is outlined in Scheme IV. The yields listed are for steps that have been conducted to date. Notice how the iterative divergent/convergent approach will be amenable to a polymer supported route.

Acknowledgments. We are thankful for support from the Office of Naval Research and the Advanced Research Projects Agency.

References and Notes (1) Purcell, S. T.; Garcia, N.; Binh, V. T.; Jones, L., II; Tour, J. M. J. Am. Chem. Soc. 1994, 116, 11985.

(2) Nanostructures and Mesoscopic Systems, Kirk, W. P.; Reed, M. A., Eds.; Academic: San Diego, 1992.

(3) (a) Molecular Electronics: Science and Technology, Aviram, A., Eds; Confer. Proc. No. 262, American Institute of Physics; New York, 1992. (b) Molecular Electronic Devices II, Carter, F. L., Ed.; Marcel Dekker: New York, 1984. (c) Miller, J. S. Adv. Mater. 1990, 2, 378, 495, 601. (d) Waldeck, D. H.; Beratan, D. N. Science 1993, 261, 576.

(4) (a) Kenny, P. W.; Miller, L. L. J. Chem. Soc., Chem. Commun. 1988, 85. (b) Kugimiya, S.-L; Lazrak, T.; Blanchard-Desce, M.; Lehn, J.-M. J. Chem. Soc., Chem. Commun. 1991, 1179. (c) Crossley, M. J.; Burn, P. L. J. Chem. Soc., Chem. Commun. 1991, 1569. (d) Zecevic, S.; Simic-Glavaski, B.; Yeager, E. J. Electroanal. Chem. 1985, 196, 339. (e) Yoshimura, T.; Tatsuura, S.; Sotoyama, W.; Matsuura, A.; Hayono, T. Appl. Phys. Lett. 1992, 60, 268. (f) Sessler, J. L.; Capuano, V. L.; Harriman, A. J. Am. Chem. Soc. 1993, 115, 4618. (g) Tachibana, H.; Azumi, R.; Nakamura, T.; Matsumoto, M.; Kawabata, Y. Chem. Lett. 1992, 173. (h) O'Neil, M. P.; Niemczyk, M. P.; Svec, W. A.; Gosztola, D.; Gaines, G. L., III; Wasielewski, M. R.; Beratan, D. N. Science 1992, 257, 63.

(5) (a) Schumm, J. S.; Jones, L., II; Pearson, D. L.; Hara, R.; Tour, J. M. Polym. Prep. (Am. Chem. Soc., Div. Polym. Chem.) 1994, 35(2), 687. (b) Schumm, J. S; Pearson, D. L.; Tour, J. M. Angew. Chem. Int. Ed. Engl. 1994, 33, 1360.

(6) (a) Igner, E.; Paynter, O. I.; Simmonds, D. I.; Whiting, M. C. J. Chem. Soc., Perkin Trans. 1 1987, 2447. (b) Xu, Z.; Moore, J. S. Angew. Chem. Int. Ed. Engl. 1993, 32, 1354. (c) Wegner, G. In Thermoplastic Elastomers, A Comprehensive Review, Legge, N. R.; Holden, G.; Schroeder, H. E., Eds.; Hasner: New York, 1987, 405.

(7) (a) Abbott, N. L.; Folkers, J. P.; Whitesides, G. M. Science 1992, 257, 1380. (b) Charych, D. H.; Bednarski, M. D. Mater. Res. Soc. Bull. 1992, 17(11), 61.

(8) Jones, L., II; Pearson, D. P.; Lamba, J. S.; Tour, J. M.; Whitesides, G. M.; Muller, C. J.; Reed, M. A. Polym. Prep. (Am. Chem. Soc., Div. Polym. Chem.) 1995, 36(1), 564.

(9) Techniques in Protein Chemistry 11, Villafranca, J. J., Ed.; Academic Press, 1991.

(10) (a) Young, J. K.; Nelson, J. C.; Moore, J. S. J. Am. Chem. Soc. 1994, 116, 10841.

Appendix M

Polym. Prepr. (Am. Chem. Soc., Div. Polym. Chem.) 1995, 36(1), 564.

Conjugated Oligomers, Their Assembly on Gold, and Their Uses in Molecular Electronics Studies LeRoy Jones II, Darren L. Pearson, Jaydeep J. S. Lamba, and James M. Tour*,†
Department of Chemistry and Biochemistry
University of South Carolina
Columbia, South Carolina 29208

George M. Whitesides*
Department of Chemistry
Harvard University
Cambridge, Massachusetts 02138

Chris J. Muller and Mark A. Reed*
Yale University
Electrical Engineering Department
P.O. Box 2157, Yale Station
New Haven, Connecticut 06520

Organic compounds have the potential to serve as molecular components of electronic devices.[1] As a prelude to the design of such devices, it is valuable to understand electrical conduction through single or small arrays of conjugated organic molecules that might ultimately serve as molecular wires.[2] Here we describe studies of self-assembled monolayers (SAMs) derived from a series of sulfur-terminated conjugated oligomers (Table 1).[3] The purpose of this study was to establish the geometry and density of packing of these materials, in order to use them in evaluation of molecular conduction.[4,5] Additionally, we present here preliminary conduction study data across some of these single molecules, or small arrays of molecules, using a tip-to-tip STM configuration (mechanical break-junction).

Figure 1 compares the thickness of the SAMs estimated by ellipsometry versus the actual molecular lengths calculated by molecular mechanics.[6] Figure 2 indicates the extent of correlation between the data from the X-ray photoelectron spectroscopy (XPS) and ellipsometry. The inference from the data is that these thiols form monolayers (at 0.1-1.0 mM in THF) whose thickness corresponds to the extended, end-to-end distance of the (di)thiol. In some cases, the thickness suggested that the organic compounds are nearly normal to the surface.

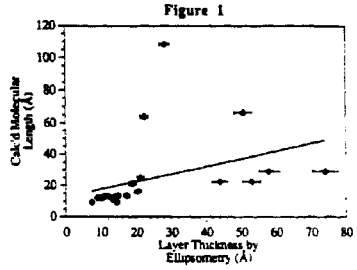

Figure 1

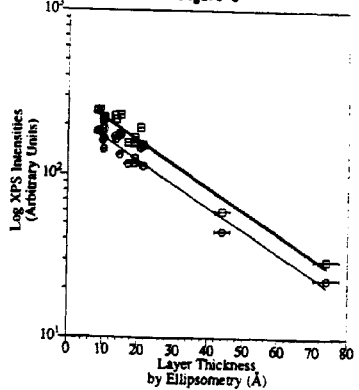

Figure 2. Log of the XPS intensities from organic-covered Au substrates versus the organic layer thickness measured by ellipsometry [Au(4f7/2) (squares) and Au(4f5/2) (circles)]. One scan was used to minimize damage effects over a 15 eV window.

Neither the presence of the aryl groups (with their potential absorbing π and thiophene sulfur centers) nor of the second thiol group, seems to influence the mode of adsorption in several of the systems investigated.

Aromatic thiols oxidize readily, and previous work with flexible α,ω-dithiols has suggested that they tend to form multilayers, presumably via disulfide linkages.[7] Acetyl-protected thiols provided an excellent method to alleviate the problems in isolating and using the oxidatively unstable thiols. In the cases where monothiol-containing systems (ArS) were needed, we could have used disulfides (Ar-SS-Ar) as precursors;[4] this strategy, however, is impractical for the α,ω-dithiols, since successive oxidative oligomerization would generate insoluble poly(disulfides). $^1$H NMR and $^{13}$C NMR analysis in THF-$d_8$ showed that an aryl thioacetate could be deacylated completely within 10 min using aqueous NH$_4$OH.[8] Other bases such as DMAP or dipropylamine were far less effective. NH$_4$OH-promoted removal of alkynyl-TMS groups was not observed within 72 h. Therefore, in situ deprotection of the acetyl moieties could be carried out using NH$_4$OH (aq) to form SAMs. The thioacetyl moiety could even be used, without deprotection using exogenous base, to generate the SAM directly, though higher concentrations (30-40 mM in THF) of thioacetates relative to thiols were required to achieve monolayer coverage. We have not determined the mechanism of the adsorption though hydrolysis of the thioesters via trace amounts of water or enol forms of the thioesters are plausible reactions. This method of direct adsorption of α,ω-dithioacetyl compounds results only in monolayer formation; there was no multilayer formation as was observed in the free dithiols.

Formation of SAMs from these rigid-rod compounds is slower than with n-alkanethiols. As the oligomers become larger, monolayer formation becomes slower, though the linear oligo(phenylene ethynylene)s appear to adsorb more efficiently than the nonlinear oligo(thiophene ethynylene)s. In the case of the longer oligo(thiophene ethynylene)s, the SAMs are significantly shorter than expected (Figure 1), based on the lengths of the starting material, and we can not exclude the possibility of competitive adsorption by thiol and thiophene groups.

For the conductivity studies across a single molecule (or possibly a small array of molecules), we used a gold mechanical break-junction tip-to-tip STM device (Figure 3)[9] to record conductivities across what may be a single molecule. The I(V) characteristics across 1,4-benzene dithiol are shown in Figure 4. Though further studies are underway, this preliminary data suggests that single molecules may provide a viable conduction pathway with current capabilities in a usable electronic regime. These results pave the way for further research into the feasibility of molecular electronics.

Acknowledgments. We thank Carl Weisbecker for assistance with the XPS. This work was supported by the Advanced Research Projects Agency (ARPA).

References and Notes

* Surface studies conducted while on sabbatical leave at Harvard University.

(1) (a) *Molecular Electronics: Science and Technology*, Aviram, A., Ed.; Confer. Proc. No. 262, American Institute of Physics: New York, 1992. (b) *Molecular Electronic Devices II*; Carter, F. L., Ed.; Marcel Dekker: New York, 1984. (c) Miller, J. S. *Adv Mater* 1990, *2*, 378, 495, 601. (d) Waldeck, D. H.; Beratan, D. N. *Science* 1993, *261*, 576.

(2) (a) *Nanostructure Physics and Fabrication*, Reed, M. A.; Kirk, W. P., Eds.; Academic Press: San Diego, 1989. (b) *Nanostructures and Mesoscopic Systems*, Kirk, W. P.; Reed, M. A., Eds.; Academic: San Diego, 1992.

(3) For the preparations of the extended oligomers, see: Schumm, J. S.; Pearson, D. L.; Tour, J. M. *Angew Chem. Int. Ed. Engl.* 1994, *33*, 1360. Pearson, D. L.; Schumm, J. S., Tour, J. M. *Macromolecules* 1994, *27*, 2348.

(4) Chang, S.-C., Chao, I.; Tao, Y.-T. *J. Am. Chem. Soc.* 1994, *116*, 6792.

(5) For an overview on SAMs, see: Ulman, A. *An Introduction to Ultrathin Organic Films*, Academic: Boston, 1991.

(6) Modified MM2 force-field, version 3.7, from CAChe Scientific Inc.

(7) Bain, C. D.; Whitesides, G. M. *J. Phys Chem.* 1989, *93*, 1670.

(8) Ponticello, G. S.; Habecker, C. N.; Varga, S. L.; Pitzenberger, S. M. *J. Org. Chem.* 1989, *54*, 3223.

(9) Krans, J. M.; Muller, C. J.; Yanson, I. K.; Govaert, T. C. M.; Hesper, R.; van Ruitenbeek, J. M. *Phys. Rev. B* 1993, *48*, 14721

Figure 3. Mechanical break junction.

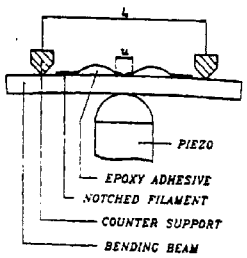

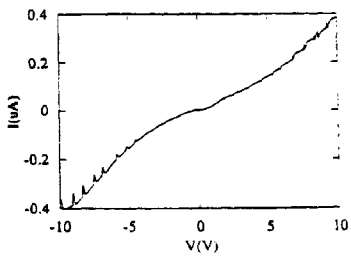

I(V) curve from the mechanical break junction after evaporation of a THF solution of 1,4-benzenedithiol. Probes held at 7.6 Å.

Appendix N

Polym. Prepr. (Am. Chem. Soc., Div. Polym. Chem.) 1995, 36(2), 344.

Potential Molecular Wires by an Iterative Doubling Approach. Doubling of Molecular Length at Each Iteration Darren L. Pearson and James M. Tour*

Department of Chemistry and Biochemistry
University of South Carolina
Columbia, South Carolina 29208

The ultimate computational system would consist of logic devices that are ultra dense, ultra fast, and molecular sized.[1] Though bulk organic materials can indeed be semiconducting or even conducting,[2] electronic conduction based upon single or small packets or molecules has not been demonstrated and it is theoretically controversial.[1] Present nanopatterning techniques allow lithographic probe assemblies to be engineered down to the 100 Å gap regime.[3] In an attempt to span this 100 Å gap with molecules and to assess the feasibility of molecular wire conduction, we describe here a new rapid synthetic approach to potential molecular wires based on oligo(thiophene-ethynylene) derivatives.[4,5]

The synthesis of the key monomer 4, whose length will double at each stage is below.[6] The iterative divergent/convergent synthetic approach is outlined in

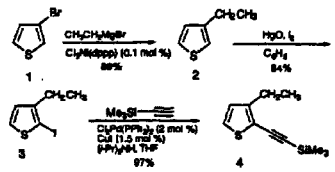

Scheme 1. The sequence involves partitioning 4 into two portions; iodinating the 5-position in one of the portions to form 5 and protodesilylating the alkynyl end of the second portion to form 6. Bringing the two portions back together in the presence of a Pd/Cu catalyst [6c] couples the aryl iodide to the terminal alkyne, thus generating the dimer 7. Iteration of this reaction sequence doubles the length of the dimer 7 to afford the tetramer 10, and so on to the octamer 13, and finally the 16-mer 16.

The optical spectra are interesting in that a near saturation of the systems appears to have occurred by the octamer stage so that doubling the conjugate length to the 16-mer caused little change in the absorbance maximum. The results of the size exclusion chromatography (SEC) are also quite intriguing. SEC is not a direct measure of molecular weight but a measure of the hydrodynamic volume. Thus by SEC using randomly coiled polystyrene standards, the number average molecular weights (Mn) of rigid rod polymers are usually greatly inflated relative to the actual molecular weights (MW). Accordingly, the SEC recorded Mn values of the octamer (13) ($M_n$=1610, actual MW=1146) and 16-mer(16) ($M_n$=3960, actual MW=2220) were much greater than the actual MWs. Conversely, the monomer (4) through tetramer (10) had $M_n$ values that were very close to the actual values because they are in the low MW region, prior to significant polystyrene coiling.

More recently developments in the area of "molecular wire" research has included the synthesis of a difunctionalized octamer with phenyl thioester end groups 19, an orthogonally fused 50 Å thiophene-ethynylene oligomer 20, and two monofunctionalized 16-mers with phenyl thioester end groups 21 and 22.[7,8] These phenyl thioesters can be cleaved to thiols which have a strong affinity for gold. These thiols would then serve as "alligator clips" to hold the oligomers between gold electrodes for future studies.

Acknowledgments. We are grateful for support from the Office of Naval Research and the Advanced Research Projects Agency. Dr. Kevin Schey at the Medical University of South Carolina kindly obtained the laser desorption MS of 16. We also thank Molecular Design Ltd. for the use of their synthetic data base.

References and Notes

(1) (a) Bowden, M.J. In *Electronic and Photonic Applications of Polymers*; Bowden, M. J.; Turner, S.R., Eds.; (Advances in Chemistry, 218) American Chemical Society: Washington DC, 1988.(b) Faraziel, A.; Dupuis, M.; Clementi, E.; Aviram, A., *J . Am. Chem. Soc.* 1991, *113*, 7064. (c) Tour, J. M.; Wu, R.; Schumm, J. S. *J. Am. Chem. Soc.*1991, *113*, 7064.
(2) *Handbook of Conducting Polymers*; Skotheim, T.A., Ed.; Dekker: New York, 1986.
(3) *Nanostructure Physics and Fabrication*; Reed, M. A., Kirk, W. P., Eds.; Academic Press: San Diego, 1989.
(4) (a) Igner, E.; Paynter, O.I.; Simmonds, D. J.; Whiting, M.C. *J. Chem. Soc., Perkin Trans. 1* 1987, 2447. (b) Zhang, J., Moore, J. S.; Xu, Z.; Aguirre, R. A. *J. Am. Chem. Soc.* 1992, *114*, 2273. (c) Wegner, G. In *Thermoplastic Elastomers, A Comprehensive Review*, Legge, N.R.; Holden, G.; Schroeder, H.E.; Hanser: New York, 1987, 405.
(5) For a presentation of some foundational work in the area of "molecular wire", see: (a) Kenny, P. W.; Miller, L. L. *J. Chem. Soc., Chem. Commun.* 1988, 85. (b) Kugimiya, S.-i.; Lazrak, T.; Blanchard-Desce, M.; Lehn, J.-M. *J. Chem. Soc., Chem. Commun.* 1991, 1179.
(6) (a)Tamao, K.; Kodama, S.; Nakajima, I.; Kumada, M.; Minato, A.; Suzuki, K. *Tetrahedron* 1982, *38*, 3347. (b) Uhlenbroek, J. H.; Bijloo, J. D. *Recl. Trav. Chim. Pays-Bas* 1960, *79*, 1181. (c) Suffert, J.; Ziessel, R. *Tetrahedron Lett.* 1991, *32*, 757.
(7) The minimization was done using MMX with extended pi-Huckel and multiconformational parameters.
(8) Jones, L., II; Pearson, D.P.; Lamba, J.S.; Tour, J. M.; Whitesides, G.M.; Muller, C.J.; Reed, M.A. *Polymer Prep. (Am. Chem. Soc., Div. Polym. Chem.)* 1995, *36(1)*, 564.

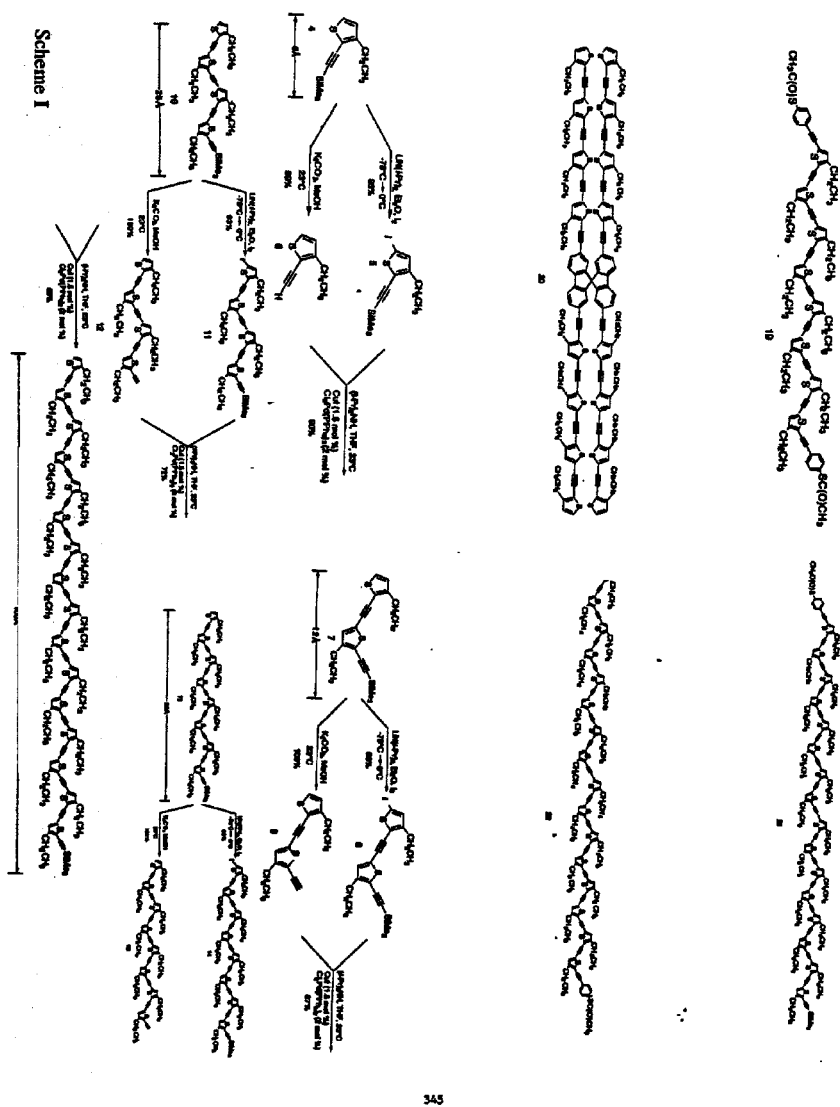
Scheme I

Appendix O

Are Single Molecular Wires Conducting?

L. A. Bumm, J. J. Arnold, M. T. Cygan, T. D. Dunbar, T. P. Burgin, L. Jones II, D. L. Allara,*
J. M. Tour,* P. S. Weiss*

Molecular wire candidates inserted into "nonconducting" n-dodecanethiol self-assembled monolayers on Au{111} have been probed by scanning tunneling microscopy (STM) and microwave frequency alternating current STM (ACSTM) at high tunnel junction impedance (100 G$\Omega$) to assess their electrical properties. The inserted conjugated molecules, 4,4'-di(phenylene-ethynylene)benzenethiolate derivatives, form single molecular wires (MWs) which extend from the Au{111} substrate to ca. 7Å above and have very high conductivity compared to the alkanethiolate.

---

L. A. Bumm, J. J. Arnold, M. T. Cygan, T. D. Dunbar, P. S. Weiss, Department of Chemistry, The Pennsylvania State University, University Park, PA 16802, USA.

D. L. Allara, Departments of Chemistry and Materials Science, The Pennsylvania State University, University Park, PA 16802, USA.

T. P. Burgin, L. Jones II, J. M. Tour, Department of Chemistry and Biochemistry, University of South Carolina, Columbia, SC 29208, USA.

---

*To whom correspondence should be addressed.

To appear in
Revised for
*Science*

Are Single Molecular Wires Conducting?

L. A. Bumm, J. J. Arnold, M. T. Cygan, T. D. Dunbar, T. P. Burgin, L. Jones II, D. L. Allara,* J. M. Tour,* P. S. Weiss*

Molecular wire candidates inserted into "nonconducting" n-dodecanethiol self-assembled monolayers on Au{111} have been probed by scanning tunneling microscopy (STM) and microwave frequency alternating current STM (ACSTM) at high tunnel junction impedance (100 G$\Omega$) to assess their electrical properties. The inserted conjugated molecules, 4,4'-di(phenylene-ethynylene)benzenethiolate derivatives, form single molecular wires (MWs) which extend from the Au{111} substrate to ca. 7Å above and have very high conductivity compared to the alkanethiolate.

---

L. A. Bumm, J. J. Arnold, M. T. Cygan, T. D. Dunbar, P. S. Weiss, Department of Chemistry, The Pennsylvania State University, University Park, PA 16802, USA.

D. L. Allara, Departments of Chemistry and Materials Science, The Pennsylvania State University, University Park, PA 16802, USA.

T. P. Burgin, L. Jones II, J. M. Tour, Department of Chemistry and Biochemistry, University of South Carolina, Columbia, SC 29208, USA.

---

*To whom correspondence should be addressed.

To appear in
Revised for
*Science*

Molecular wires (MWs) are among the key components in the emerging field of molecular electronics. In their simplest form, MWs can be viewed as conjugated molecules which form the one-dimensional electronic conductors to interconnect such proposed molecular devices as single electron transistors (SET), electron turnstiles, molecular switches, and chemical sensors *(1)*. Although many MW candidates have been prepared *(2)*, the conductivity of *single* MWs has not been demonstrated. This is due in part to the difficulty of individually connecting a *single* MW to probes which in turn are connected to macroscopic measuring instruments in the laboratory. In this report we describe how molecular self-assembly has been used both to anchor a MW candidate to an electrode (the Au{111} substrate) and to dilute and isolate the MW candidates within a self-assembled monolayer (SAM) of *n*-dodecanethiol (DT). The second connection to the MW candidate is achieved via the probe tip of a scanning tunneling microscope (STM) or a tunable microwave frequency alternating current STM (ACSTM). The individual molecules can be observed in conventional STM images as well as by their microwave frequency electronic properties. The STM can then individually address the inserted MW candidates and probe their electronic properties.

Bulk conductivity measurements of MW candidates include both conduction paths along the molecule and (percolation) between the chains. Wu & Bein have grown isolated polyaniline molecules *(3)* and graphitic carbon *(4)* in zeolite matrices to eliminate inter-chain percolation and have demonstrated the molecules' conductivity using a microwave cavity perturbation technique at 2.63 GHz. Jones *et al.* *(5)* have made preliminary measurements using mechanical break junctions (MBJs) containing 1,4-benzenedithiol. Unfortunately, these tunnel junctions are ill-defined in that it is difficult to know if the conducting channel is a single molecule, or even the molecule of interest. The STM and ACSTM are ideal for this study because they allow us to image the surface and locate isolated molecules. These molecules are then individually addressed.

The MW candidate used was an ethyl substituted 4,4'-di(phenylene-ethynylene)-benzothioacetate (1) has been shown to self-assemble on Au when converted to the thiolate (1' in Fig. 1) *(6)*. The calculated length of 1', 21.3 Å *(7)*, is 7.3 Å longer than the thickness of the DT monolayer on Au{111} *(8)* so that when coadsorbed it is expected to protrude beyond the

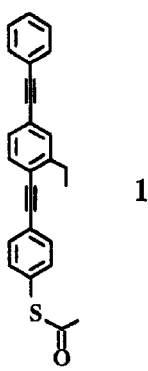

1 methyl–terminated surface (Fig. 1). Even if tilted at the 30° angle of the DT molecules, the 1' molecules would still protrude 4.0Å above the DT film. Molecular modeling indicates that the 1' molecules do not fit well into the DT lattice because of spatial constraints and poor van der Waals overlap with the surrounding DT molecules.

The SAM was prepared on Au{111}, which had been vapor deposited onto freshly–cleaved, heated muscovite mica. The Au substrate was exposed to a 1 mM solution of DT in ethanol for 18 hr. to form a well–ordered monolayer *(9)*. After thoroughly rinsing the sample *(10)*, it was exposed to a 0.3 mM solution of 1 in tetrahydrofuran under dry Ar for 30 min. A small amount of aqueous ammonia was added to hydrolyze the thioacetyl protecting group, generating the thiol *in situ* to adsorb as the thiolate (1') on the surface *(6)* as shown schematically below. Note that we do not expect voids at the structural domain boundaries (as shown in the schematic), but rather conformationally relaxed DT molecules filling these spaces *(11)*. After rinsing and drying *(10)*, the samples were stored at room temperature until imaged; exposure to air was limited. These SAMs were characterized by ellipsometry and by reflectance infrared spectroscopy *(12)*.

Previously, we have shown STM images of phase segregated ω–substituted alkanethiolate monolayers on Au{111} *(9)*. Furthermore we can differentiate between *n*–alkanethiolates of different chain lengths with molecular resolution in mixed composition SAMs *(13)*. In this report, we use the DT monolayer as a matrix to support and to dilute the candidate MWs. Tour *et al.* have Revised for
*Science* shown that 1' chemisorbs to Au{111} forming close-packed SAMs with the long molecular axis aligned nearly normal to the surface (6). Cygan *et al.* have demonstrated that the 1' adsorbs into an existing DT SAM at film defects, *e.g.* domain boundaries (12), where the DT molecules can be conformationally relaxed. In contrast to neat 1' SAMs where the molecules can be oriented normal to the Au{111}, the molecular orientation might vary due to being imbedded in the DT film and further due to conformational relaxation of the surrounding DT molecules at structural domain boundaries.

The STM and microwave frequency ACSTM used in these experiments have been described elsewhere (14). We measure the high frequency conductivity of the tunnel junction by adding microwave frequency components to the conventional DC bias. In order to simplify detection of the high frequency tunnel current we simultaneously apply two frequencies separated by 5 kHz. The component of the tunnel current at the difference frequency is then extracted with a phase-sensitive detector. That this nonlinear scheme truly measures a high frequency property of the tunnel junction can be understood as an application of Miller's rule (15). Namely, the $n^{th}$-order susceptibility for difference frequency generation is proportional to the product of the first-order susceptibilities at the frequency of each input and output (16).

STM images of the DT and 1' SAM are shown in Figs. 2A and 2B. We assign the (bright) topographic features protruding through the DT film as due to 1' since these features are not observed in the DT films prior to exposure to the solution of 1. We infer that these features are due to single 1' molecules from the following observations: 1) images of these features where the DT molecular lattice is resolved show that the single-1' molecular features are imaged with exactly the same shape, size, and orientation, indicative of features which are much sharper than the STM tip (Fig. 2B); 2) larger features (which we assign to clusters of 1') are only observed at Au{111} step edges where the DT SAM is expected to be conformationally relaxed and the 1' molecules would be more easily accommodated (Fig. 2A); 3) the 1' molecules are observed to be widely separated on the terraces (Fig. 2A) and tend to occur at DT structural domain boundaries (Figs. 2A and 2B) — only a small fraction of the DT structural domain boundaries on the Au{111} terraces are occupied by 1' features indicating that their insertion into the film is an isolated and improbable event; and 4)

Revised for
*Science* direct insertion of clusters is unlikely because 1 is not known to be associated (dimers, etc.) in solution phase. The DT film forms domains of $(\sqrt{3} \times \sqrt{3})$ R30° and related superstructures *(17)*. Structural domain boundaries result from different alkyl chain tilt vectors and sulfur–head-group–lattice registry. The dark features are due to the underlying Au substrate which frequently develops single atomic layer deep pits during exposure to alkanethiol solution *(18)*. The 1′ molecules have been observed for as long as 4 hrs and did not move or wander though the DT film. At the same time the boundaries between the structural domains fluctuate as molecules at these interfaces change their conformations.

STM topographic images are a convolution of the tip and surface geometry. When features on the surface are much sharper than the tip, such as the 1′ single molecular protrusion *ca.* 7 Å higher than the DT film, each molecule is rendered as an image of the tip. This is shown schematically in Fig. 1 and can be seen in the images of 1′ molecules (Fig. 2B) where each appears nearly identical in shape, size, and orientation. If more than a single 1′ molecule were adjacent at the structural domain boundaries, each would contribute to the tunneling current. Thus the "tip image" from such a feature would be repeated and overlapped in a characteristic way. This is rarely found at the structural domain boundaries on terraces, but is commonly found for the 1′ molecules at substrate step edges. It is instructive to note that most molecular resolution images are achieved on atomically flat surfaces so that sharpness of the tip is determined only by the endmost atomic-scale asperity. Here, with the same tip, we do resolve the molecular lattice on the flat DT regions.

The apparent tunneling barrier height (ATBH) can be measured using the STM by modulating the separation between the tip and sample (z) and recording the derivative of the tunneling current (I) with respect to this separation (dI/dz) *(20)*. The ATBH is at least 2 times higher over the 1′ than over the DT. This higher relative ATBH, concurrent with greater tip–substrate separation (as shown schematically in Fig. 1), indicates that the junction contains regions of higher conductivity when the tip is over a 1′ molecule than when over a DT molecule. Hence we infer that single 1′ molecules have a higher conductivity than the DT. We will not attempt to quantify the ATBH further because many factors come into play such as mechanical distortions of the tip and film. These complications make more than qualitative comparisons difficult at best *(19,20)*.

Revised for
*Science*

Figure 3 shows both the constant current STM topography (shown as surface topography) and the simultaneously acquired microwave difference frequency (MDF) ACSTM image (shown as surface color). Four types of features can be seen: 1) topographic maxima which coincide with MDF maxima; 2) a single topographic maximum that does not coincide with the MDF maxima; 3) MDF maxima that coincide with protrusions at DT film defects; and 4) a Au{111} substrate atomic step is also visible.

The mechanism by which insulating molecules, such as DT monolayers, are imaged with the STM remains poorly understood *(19)*. In contrast, the MW does have states which are accessible by STM. This is evident in the DC STM, apparent tunneling barrier height, and ACSTM microwave difference frequency images.

The interpretation of STM topographic height differences is complicated because they are a function of the local density of states as well as the local barrier height *(21)*. However, four observations lead us to infer that the 1' molecules are substantially more conducting than DT: 1) unlike $n$-alkanethiols of similar length, viz. 20 carbon $n$-alkanethiols *(eicosanethiol)*, the 1' molecules can be imaged nonperturbatively *(22)*; 2) the apparent tunneling barrier height is higher over the 1' molecules despite their greater topographic height; 3) we observe distinct contrast in the MDF images between the DT and the 1' molecules which is not observed for neat DT films or for SAMs of $n$-alkanethiols of mixed chain length; and 4) the differences in the topographic height in DC STM images between the DT and 1' molecules increase with decreasing junction impedance. Currently, we are spectroscopically mapping 1' and other related molecules inserted into alkanethiol SAMs to further delineate single molecular wire performance.

Revised for
*Science*

REFERENCES AND NOTES

1. A. Aviram, Ed., *Molecular Electronics: Science and Technology*, Confer. Proc. No. 262, American Institute of Physics: New York, 1992; M. A. Reed and W. P. Kirk, Eds., *Nanostructure Physics and Fabrication* (Academic Press, Inc., New York, NY, 1989); M. A. Reed and W. P. Kirk, Eds., *Nanostructures and Mesoscopic Systems* (Academic Press, Inc., New York, NY, 1992); F. L. Carter, Ed., *Molecular Electronic Devices II* (Marcel Dekker, Inc., New York, NY, 1987); J. S. Miller, *Adv. Mater.* 2, 378, 495, 601 (1990).

2. J. M. Tour, *Trends in Polym. Sci.* 2, 332 (1994).

3. C.-G. Wu and T. Bein, *Science* 264, 1757 (1994).

4. C.-G. Wu and T. Bein, *Science* 266, 1013 (1994).

5. L. Jones II et al., *Polym. Prepr.* 36, 564 (1995).

6. J. M. Tour et al., *J. Am. Chem. Soc.* 117, 9529 (1995).

7. J. S. Schumm, D. L. Pearson, J. M. Tour, *Angew. Chem. Int. Ed. Engl.* 33, 1360 (1994).

8. L. H. Dubois and R. G. Nuzzo, *Annu. Rev. Phys. Chem.* 43, 437 (1992), and references therein.

9. S. J. Stranick, A. N. Parikh, Y.-T. Tao, D. L. Allara, P. S. Weiss, *J. Phys. Chem.* 98, 7636 (1994).

10. The substrates treated with DT in ethanol were rinsed sequentially in hexane, acetone, and ethanol and then blown dry in purified $N_2$. The substrates further treated with 1 in tetrahydrofuran were rinsed sequentially in tetrahydrofuran, acetone, and ethanol and then blown dry in purified $N_2$. See ref. 12 for the complete procedure.

11. S. J. Stranick, A. N. Parikh, D. L. Allara, P. S. Weiss, *J. Phys. Chem.* 98, 11136 (1994).

12. M. T. Cygan et al., in preparation.

13. L. A. Bumm et al., in preparation.

14. S. J. Stranick and P. S. Weiss, *Rev. Sci. Instrum.* 64, 1232 (1993); S. J. Stranick and P. S. Weiss, *ibid.* 65, 918 (1994); L. A. Bumm and P. S. Weiss, *ibid.* 66, 4140 (1995).

15. R. C. Miller, *Appl. Phys. Lett.* 5, 17 (1964).

Revised for *Science*

16. The exact mechanism of the microwave difference frequency contrast is not yet established. Possible mechanisms include heating (square law), difference frequency generation ($\omega_{out}$: $\omega_1$; $\omega_2$); modulated conductivity ($\omega_{out}$: 0; $\omega_1$; $\omega_2$). Each of these mechanisms are linearly dependent on the power at *each* input frequency. Thus, we can measure the response of the tunnel junction at GHz frequencies by detecting a signal at 5 kHz.

17. G. E. Poirier and M. J. Tarlov, *Langmuir* 10, 2853 (1994); G. E. Poirier, M. J. Tarlov, H. E. Rushmeier, *ibid.* 10, 3383 (1994).

18. J. A. M. Sondag-Huethorst, C. Schönenberger, L. G. J. Fokkink, *J. Phys. Chem.* 98, 6827 (1994).

19. V. Mujica, M. Kemp, M. A. Ratner, *J. Chem. Phys.* 101, 6856 (1994).

20. See, for example, C. J. Chen, *Introduction to Scanning Tunneling Microscopy* (Oxford University Press, New York, NY 1993).

21. N. D. Lang, *Phys. Rev. Lett.* 58, 45 (1987); N. D. Lang, *Phys. Rev. B* 37, 10395 (1988).

22. C. Schönenberger, J. Jorritsma, J. A. M. Sondag-Huethorst, L. G. J. Fokkink, *J. Phys. Chem.* 99, 3259 (1995).

23. We thank Wolfgang Ernst for the loan of a microwave source. The support of ARPA, the NSF Chemistry, GRT, Materials Research, and PYI Programs, the ONR, AT&T Bell Laboratories, the Biotechnology Research and Development Corporation, Eastman Kodak, Hewlett-Packard, IBM, and the Alfred P. Sloan Foundation are gratefully acknowledged.

FIGURE CAPTIONS

Fig. 1. A schematic representation of a DT and 1' SAM on Au{111}. The height that 1' extends above the DT film, if normal to the surface, is 7.3 Å. The trajectory of the STM tip traces out a surface of constant current. The relatively flat DT layer can be imaged by an atomic–scale asperity on the end of the STM tip with resolution of the molecular lattice. The protruding 1' molecule "images" the end of the STM tip, resulting in a characteristic feature due largely to the shape of the end of the STM tip for each 1' molecule, as seen in subsequent figures. Note also that the STM tip is closer to the exposed ends of the 1' molecules than to the exposed ends of the DT molecules. This is because the apparent tunneling barrier height is higher over the 1' than over the DT.

Fig. 2. Constant current STM topographs of an Au{111} surface covered by DT and 1' (tip bias +1.0 V, tunneling current 10 pA). A) A 2400Å by 2400Å image which has been displayed (by high–pass filtering) to show the distribution of 1' molecules on several terraces simultaneously. Note that the 1' molecules on the Au terraces are widely separated and of uniform size as opposed to the larger features at the Au step edges which we assign as clusters of 1' molecules. B) An unprocessed 400Å by 400Å image showing DT molecular lattice resolution. Note the two 1' molecules adsorbed at DT structural domain boundaries in the lower right quadrant of the image. The apparent shape of 1' is a characteristic of this tip, rather than of the molecule itself. These two 1' molecules were observed to be stationary in the DT film for over 4 hrs.

Fig. 3. A composite ACSTM image showing a 800Å by 800Å area of a Au{111} surface covered by DT and 1'. The surface is derived from the constant current topograph and the color from the MDF signal (DC tip bias +1.0 V, DC tunneling current 10 pA, Revised for
*Science*

What is claimed is:

1. An integrated circuit structure, comprising:
   a plurality of transistors;
   a plurality of thin-film conductor interconnects, interconnected to form electronic circuits in a predetermined electrical configuration;
   a plurality of pairs of contact pads, connected to said thin-film conductor interconnects, each adjacent pair of contact pads including a first pad of a first conductive material and a second pad of a second conductive material, and being electrically connected only by a conductive oligomer of a precisely predetermined number of units.

* * * * *